(12) United States Patent
Hasegawa et al.

(10) Patent No.: US 6,885,528 B2
(45) Date of Patent: Apr. 26, 2005

(54) MAGNETIC SENSING ELEMENT HAVING CHROMIUM LAYER BETWEEN ANTIFERROMAGNETIC LAYERS

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 142 days.

(21) Appl. No.: 10/422,585

(22) Filed: Apr. 23, 2003

(65) Prior Publication Data

US 2003/0197988 A1 Oct. 23, 2003

(30) Foreign Application Priority Data

Apr. 23, 2002 (JP) .......................... 2002-120832

(51) Int. Cl.[7] ................................. B11B 5/39
(52) U.S. Cl. .................................. 360/324.12
(58) Field of Search ........................ 360/324.1–324.2

(56) References Cited

U.S. PATENT DOCUMENTS

| | | |
|---|---|---|
| 2001/0013999 A1 | 8/2001 | Koi et al. |
| 2001/0047930 A1 | 12/2001 | Saito et al. |
| 2004/0105192 A1 * | 6/2004 | Chien et al. ............. 360/324.1 |

FOREIGN PATENT DOCUMENTS

| | | |
|---|---|---|
| JP | 2001-297916 | 10/2001 |
| JP | 2001-297917 | 10/2001 |

* cited by examiner

*Primary Examiner*—A. J. Heinz
(74) *Attorney, Agent, or Firm*—Brinks Hofer Gilson & Lione

(57) ABSTRACT

A magnetic sensing element comprising a composite film having a center portion and two side portions, a second antiferromagnetic layer, a chromium nonmagnetic layer, and third antiferromagnetic layers is provided. The composite film comprises a first antiferromagnetic layer; a pinned magnetic layer on the first antiferromagnetic layer; a nonmagnetic material layer on the pinned magnetic layer; and a free magnetic layer on the nonmagnetic material layer. The second antiferromagnetic layer is disposed on the free magnetic layer. The chromium nonmagnetic layer is disposed on the second antiferromagnetic layer at the center portion. The third antiferromagnetic layers are disposed on the second antiferromagnetic layer at the two side portions. The magnetization direction in the two side portions of the free magnetic layer is pinned in the track width direction and the magnetization direction in the center portion is rotatable in response to external magnetic fields.

32 Claims, 33 Drawing Sheets

MAGNETIC SENSING ELEMENT HAVING CHROMIUM LAYER BETWEEN ANTIFERROMAGNETIC LAYERS

BACKGROUND OF THE INVENTION

1. Field of the Invention

The present invention relates generally to magnetic sensing elements for use in hard disk devices and magnetic sensors. In particular, it relates to a magnetic sensing element having excellent read characteristics that can adequately control the magnetization of free magnetic layers even with narrower tracks and to a method for fabricating the same.

2. Description of the Related Art

FIG. 36 is a partial cross-sectional view of a conventional magnetic sensing element viewed from the face that opposes a recording medium. Hereinafter, this face is referred to as the "opposing face".

Referring to FIG. 36, a composite film 108 is formed on a substrate 101. The composite film 108 is constituted from an antiferromagnetic layer 102, a pinned magnetic layer 103, a nonmagnetic material layer 104, and a free magnetic layer 105. A hard bias layer 106 is disposed at each side of the composite film 108. An electrode layer 107 is formed on each hard bias layer 106.

The magnetization of the pinned magnetic layer 103 is pinned in the Y direction in the drawing by an exchange coupling magnetic field generated between the pinned magnetic layer 103 and the antiferromagnetic layer 102. The magnetization of the free magnetic layer 105 is oriented in the X direction in the drawing by a longitudinal bias magnetic field.

As shown in FIG. 36, the track width Tw is determined by the width of the free magnetic layer 105 in the track width direction (the X direction). The track width Tw is becoming ever smaller as recording densities become higher.

However, the magnetic sensing element having the structure shown in FIG. 36 cannot properly control the magnetization direction of the free magnetic layer 105 when the track width is small.

First, according to the structure shown in FIG. 36, the width of the free magnetic layer 105 must be decreased to read narrower tracks. As the track becomes narrower, regions in the free magnetic layer 105 affected by strong longitudinal bias magnetic fields from the hard bias layers 106 occupy large portions of the free magnetic layer 105. The regions affected by the strong longitudinal bias magnetic fields then form dead regions that do not readily respond to external magnetic fields. Since the dead regions relatively expand, the sensitivity of the magnetic sensing element is degraded as the tracks become narrower.

Secondly, the hard bias layer 106 may easily become magnetically discontinuous from the free magnetic layer 5. This problem is particularly acute when a bias underlayer composed of Cr is provided between the hard bias layer 106 and the free magnetic layer 105.

Such magnetic discontinuity intensifies the adverse effects of demagnetizing fields at the two ends of the free magnetic layer 105 in the track width direction, often resulting in a magnetization disturbance in the free magnetic layer 105, i.e., a buckling phenomenon. The buckling phenomenon occurs more frequently over large areas in the free magnetic layer 105 as the track becomes narrower. This results in instability in the read waveform.

Thirdly, as the gap becomes narrower, part of the longitudinal bias magnetic fields from the hard bias layers 106 escapes to shield layers (not shown) disposed above and below the magnetic sensing element shown in FIG. 36. This disturbs the magnetization state of the shield layers and weakens the longitudinal bias magnetic field supplied to the free magnetic layer 105. Thus, the magnetization of the free magnetic layer 105 cannot be properly controlled.

Recently, in order to overcome these problems, exchange bias methods are beginning to be employed to control the magnetization of the free magnetic layer 105. One exchange bias method provides an antiferromagnetic layer disposed on a free magnetic layer.

A magnetic sensing element of an exchange bias type is manufactured, for example, through the steps shown in FIGS. 37 and 38. FIGS. 37 and 38 are partial cross-sectional views of the magnetic sensing element viewed from the opposing face.

In the step shown in FIG. 37, an antimagnetic layer 2 composed of a PtMn alloy is formed on a substrate 1. Then a pinned magnetic layer 3 composed of a magnetic material, a nonmagnetic material layer 4, and a free magnetic layer 5 composed of a magnetic material are deposited on the antimagnetic layer 2. A Ta film 9 for preventing oxidation of the free magnetic layer 5 when exposed to air is formed on the free magnetic layer 5.

As shown in FIG. 37, a lift-off resist layer 10 is then formed on the Ta film 9. Part of the Ta film 9 not covered with the resist layer 10 is completely removed by ion milling. At this time, part of the free magnetic layer 5 under the Ta film 9 is also removed. The removed portion is indicated by broken lines in the drawing.

Next, in the step shown in FIG. 38, a ferromagnetic layer 11, a second antiferromagnetic layer 12 composed of an IrMn alloy, and an electrode layer 13 are sequentially formed on each of the exposed portions of the free magnetic layer 5 at the two sides of the resist layer 10. The liftoff resist layer 10 is removed at the end to complete the exchange bias magnetic sensing element.

In the magnetic sensing element shown in FIG. 38, the track width Tw is determined by the gap between the ferromagnetic layers 11 in the track width direction (the X direction in the drawing). The magnetization directions of the ferromagnetic layers 11 are firmly pinned in the X direction in the drawing by exchange coupling magnetic fields generated between the ferromagnetic layers 11 and the second antiferromagnetic layers 12. As a result, two side portions A of the free magnetic layer 5 located under the ferromagnetic layers 11 are strongly magnetized in the X direction by ferromagnetic coupling with the ferromagnetic layers 11. On the other hand, the central portion B of the free magnetic layer 5 in the track width Tw region is only weakly magnetized to be in a single magnetic domain state such that the magnetization of the central portion B can rotate in response to external magnetic fields.

The exchange bias magnetic sensing element manufactured through the steps shown in FIGS. 37 and 38, however, has the following problems.

First, during the ion milling in the step shown in FIG. 37, not only the Ta film 9 but also part of the free magnetic layer 5 is removed. Moreover, inert gas, such as Ar, used during the ion milling readily enters the free magnetic layer 5. This damage in the free magnetic layer 5 destroys the crystal structure in surface portions 5a of the free magnetic layer 5 and causes lattice defects (a so-called mixing effect). As a result, the magnetic characteristics of the surface portions 5a of the free magnetic layer 5 are often degraded.

Ideally, only the Ta film 9 is removed during ion milling in the step shown in FIG. 37 without removing the free magnetic layer 5. However, in practice, it is difficult to control the milling operation in such a manner because of the thickness of the Ta film 9. The Ta film 9 is formed to have a thickness of approximately 30 to 50 Å. Such a large thickness is required to properly prevent the oxidation of the free magnetic layer 5.

When the Ta film 9 is exposed to air or field-annealed to generate exchange coupling magnetic fields between the pinned magnetic layer 3 and the ferromagnetic layer 11 and between the antimagnetic layer 2 and the second antiferromagnetic layer 12, the oxidized portion expands, and the entire thickness of the Ta film 9 becomes larger than that immediately after deposition. For example, a Ta film 9 having a thickness of approximately 30 Å immediately after deposition may expand to approximately 45 Å in thickness by the oxidation.

In order to effectively mill the Ta film 9 expanded by the oxidation, high-energy is required. Since high-energy ion milling has a high milling rate, it is almost impossible to stop milling at the moment the Ta film 9 is completely removed. In other words, when the energy is high, the margin of position for stopping the milling must be set large. Accordingly, part of the free magnetic layer 5 under the Ta film 9 is removed, and significant damage is inflicted on the free magnetic layer 5 by high-energy ion milling, resulting in degradation of the magnetic characteristics.

Secondly, it is difficult to stop ion milling partway of the free magnetic layer 5 shown in FIG. 37 because the free magnetic layer 5 is formed to have a thickness of 30 to 40 Å and is milled using high energy. In the worst case, the two side portions A of the free magnetic layer 5 may be completely removed by ion milling. As described above, because the thickness of the free magnetic layer 5 is small, it is difficult to stop ion milling partway of the free magnetic layer 5.

Thirdly, the surface of the free magnetic layer 5 exposed to the ion milling exhibits degraded magnetic characteristics due to the damage inflicted by the milling. Thus, the magnetic coupling (ferromagnetic exchange interaction) between the free magnetic layer 5 and the ferromagnetic layers 11 is insufficient. As a result, the thickness of the ferromagnetic layers 11 must be increased.

However, when the thickness of the ferromagnetic layers 11 is increased, the exchange coupling magnetic fields with the second antiferromagnetic layers 12 become weak. As a result, the magnetization of the two side portions A of the free magnetic layer 5 cannot be firmly pinned. This causes a problem of side reading. The resulting magnetic sensing element cannot properly meet the demand for narrower tracks.

Moreover, when the thickness of the ferromagnetic layers 11 is excessively large, static magnetic fields from ends of the ferromagnetic layers 11 may readily reach the central portion B of the free magnetic layer 5, thereby degrading the sensitivity of the central portion B, which has a rotatable magnetization in response to external magnetic fields.

As described above, it has been impossible to manufacture a magnetic sensing element that can meet the demand for narrower tracks through the above-described steps of milling the two side portions of the Ta film 9 to expose the free magnetic layer 5 and depositing the ferromagnetic layers 11 and the second antiferromagnetic layers 12 on the exposed portions of the free magnetic layer 5. This is because the magnetization of the free magnetic layer 5 cannot be properly controlled in this structure.

SUMMARY OF THE INVENTION

Accordingly, it is an object of the present invention to provide an exchange-bias magnetic sensing element that can properly control the magnetization of a free magnetic layer and that can meet the trend for narrower tracks.

A first aspect of the present invention provides a magnetic sensing element comprising a composite film having a center portion and two side portions, a second antiferromagnetic layer, a chromium nonmagnetic layer, and third antiferromagnetic layers. The composite film comprises a first antiferromagnetic layer; a pinned magnetic layer on the first antiferromagnetic layer; a nonmagnetic material layer on the pinned magnetic layer; and a free magnetic layer on the nonmagnetic material layer. The second antiferromagnetic layer is disposed on the free magnetic layer. The chromium nonmagnetic layer is disposed on the second antiferromagnetic layer at the center portion. The third antiferromagnetic layers are disposed on the second antiferromagnetic layer at the two side portions.

According to this structure, the magnetization directions of the two side portions of the free magnetic layer can be properly pinned in the track width direction by exchange coupling magnetic fields with the antiferromagnetic layers. The center portion of the free magnetic layer is moderately put in a single-magnetic-domain state so that the center portion can respond to external magnetic fields.

The chromium nonmagnetic layer on the second antiferromagnetic layer at the center portion protects the second antiferromagnetic layer from oxidation by exposure to air. The chromium nonmagnetic layer may extend between the second antiferromagnetic layer and each of the third antiferromagnetic layers.

Since the free magnetic layer is covered by the second antiferromagnetic layer, the free magnetic layer does not suffer from damage inflicted by ion milling.

The chromium nonmagnetic layer is a dense layer, and the oxidation rarely progresses in the thickness direction when exposed to air. The thickness of the chromium nonmagnetic layer need not be large to protect the underlying layers from oxidation. Thus, low-energy ion milling can be employed, and a magnetic sensing element that can effectively be used with narrow tracks can be manufactured. Moreover, with the chromium nonmagnetic layer, the exchange coupling magnetic field (Hex) between the second antiferromagnetic layer and the free magnetic layer can become larger.

When the chromium nonmagnetic layer is provided between the second antiferromagnetic layer and each of the third antiferromagnetic layers, the thickness of the chromium nonmagnetic layer is preferably larger in the center portion than in the two side portions.

Preferably, the average thickness of the chromium nonmagnetic layer in the two side portions is 3 Å or less. The average thickness of the chromium nonmagnetic layer in the two side portions may be in the range of 0.2 to 1.0 Å. Moreover, the third antiferromagnetic layers may be in contact with the second antiferromagnetic layer without the chromium nonmagnetic layer therebetween.

With a chromium nonmagnetic layer having a thickness of 3 Å or less, an antiferromagnetic interaction easily occurs between the second antiferromagnetic layer and the third antiferromagnetic layer at the two side portions. Thus the second antiferromagnetic layer and the third antiferromagnetic layer function as one antiferromagnetic layer that properly firmly pin the magnetization directions of the two side portions of the free magnetic layer.

Preferably, the thickness of the chromium nonmagnetic layer is in the range of 2 to 10 Å, and more preferably in the range of 2 to 5 Å in the center portion.

Preferably, the second antiferromagnetic layer is nonantiferromagnetic in the center portion and antiferromagnetic in the two side portions.

When the center portion of the second antiferromagnetic layer is nonantiferromagnetic, it rarely transforms into an ordered structure by field annealing. Thus, no exchange coupling magnetic field is generated between the second antiferromagnetic layer and the free magnetic layer at the center portion, and the magnetization direction of the center portion of the free magnetic layer is not firmly pinned in a certain direction. Since the second antiferromagnetic layer and the third antiferromagnetic layers function as one layer, the second antiferromagnetic layer at the two side portions easily transforms into ordered structures by field annealing. Exchange coupling magnetic fields are thus generated between the second antiferromagnetic layer and the free magnetic layer in the two side portions so as to firmly pin the magnetization directions at the two side portions of the free magnetic layer in the track width direction.

Preferably, the thickness of the second antiferromagnetic layer is in the range of 5 to 50 Å, more preferably in the range of 10 to 50 Å, and most preferably in the range of 30 to 40 Å. At such a thickness, the exchange coupling magnetic field between the second antiferromagnetic layer and the free magnetic layer at the center portion is small, if any.

A second aspect of the present invention provides a magnetic sensing element comprising a composite film having a center portion and two side portions, second antiferromagnetic layers, chromium nonmagnetic layers, and third antiferromagnetic layers. The composite film comprises a first antiferromagnetic layer; a pinned magnetic layer on the first antiferromagnetic layer; a nonmagnetic material layer on the pinned magnetic layer; and a free magnetic layer on the nonmagnetic material layer. The second antiferromagnetic layers are disposed on the free magnetic layer at the two side portions. The chromium nonmagnetic layers are disposed on the second antiferromagnetic layers. The third antiferromagnetic layers disposed on the chromium nonmagnetic layers.

The magnetic sensing element according to the second aspect of the present invention differs from that according to the first aspect of the present invention in that the chromium nonmagnetic layer is always provided between the second antiferromagnetic layer and the third antiferromagnetic layer. No second antiferromagnetic layer needs to be provided at the center portion. Such differences are derived from the difference in fabrication processes.

According to the second aspect of the present invention, the second antiferromagnetic layer and the third antiferromagnetic layer are stacked on the free magnetic layer at each of the two side portions. The second and third antiferromagnetic layers function as one antiferromagnetic layer. The magnetization directions of the free magnetic layer at the two side portions are firmly pinned in the track width direction by the exchange coupling magnetic fields between the free magnetic layer and the second antiferromagnetic layer at the two side portions. The center portion of the free magnetic layer is only moderately put in a single-magnetic-domain state so that the magnetization direction thereof can rotate in response to external magnetic fields.

Since the two side portions of the free magnetic layer are covered with the second antiferromagnetic layer, they are not affected by milling.

Alternatively, the second antiferromagnetic layers may extend to the center portion so as to be connected to each other. In this manner, the entire upper face of the free magnetic layer can be protected by the second antiferromagnetic layers during ion milling.

Moreover, the chromium nonmagnetic layers may also extend to the center portion to be connected to each other.

Preferably, the second antiferromagnetic layers are nonantiferromagnetic in the center portion and antiferromagnetic in the two side portions. According to this structure, no exchange coupling magnetic field is generated between the second antiferromagnetic layer and the free magnetic layer at the center portion, and the magnetization direction of the center portion of the free magnetic layer remains rotatable. Since the second antiferromagnetic layer and the third antiferromagnetic layers function as one layer, the second antiferromagnetic layer at the two side portions easily transforms into ordered structures by field annealing. Exchange coupling magnetic fields are thus generated between the second antiferromagnetic layer and the free magnetic layer in the two side portions so as to firmly pin the magnetization directions at the two side portions of the free magnetic layer in the track width direction.

Alternatively, the third antiferromagnetic layers may extend to the center portion so as to be connected to each other; the thickness of the third antiferromagnetic layers may be smaller in the center portion than in the side portions; and the third antiferromagnetic layers may be nonantiferromagnetic in the center portion.

Preferably, the thickness of the second antiferromagnetic layers is 50 Å or less in the center portion. At such a thickness, the exchange coupling magnetic field between the antiferromagnetic layers and the free magnetic layer at the center portion is small, if any. Preferably, no antiferromagnetic layer is formed on the free magnetic layer in the center portion.

More preferably, the thickness of the antiferromagnetic layers formed on the center portion of the free magnetic layer is 40 Å or less.

Preferably, the thickness of the chromium nonmagnetic layers is in the range of 0.2 to 3 Å in the two side portions. More preferably, the thickness of the chromium nonmagnetic layers is in the range of 0.2 to 1.0 Å in the two side portions.

At a such thickness, an antiferromagnetic interaction occurs between the second antiferromagnetic layers and the third antiferromagnetic layers, and the second and third antiferromagnetic layers function as one antiferromagnetic layer that properly pins the magnetization directions of the two side portions of the free magnetic layer in the track width direction.

The magnetic sensing element of the present invention preferably further comprises a noble metal layer disposed between each nonmagnetic layer and the corresponding second antiferromagnetic layer.

When the chromium nonmagnetic layer is deposited directly on the second antiferromagnetic layer, transformation into ordered structures occurs even though the thickness of the second antiferromagnetic layer is small. As a result, the exchange coupling magnetic field between the second antiferromagnetic layer and the free magnetic layer 28 readily increases, and the amount of change in magnetization direction in response to external magnetic fields readily decreases. By providing the noble metal layer between the chromium nonmagnetic layer and the second antiferromagnetic layer, the tendency of the second antiferromagnetic layer to transform into ordered structures can be adequately controlled. Thus, a decrease in the rate of change in resistance can be avoided.

The noble metal layer preferably contains at least one element selected from the group consisting of Ru, Re, Pd, Os, Ir, Pt, Au, and Rh.

Preferably, the free magnetic layer comprises three magnetic sublayers. In particular, the three magnetic sublayers preferably comprise CoFe, NiFe, and CoFe, respectively.

The magnetic sensing element of the present invention may further include electrode layers on the third antiferromagnetic layers so that an electric current flows in a direction parallel to the surface of each layer of the composite film. This type of magnetic sensing element is called "current-in-the-plane (CIP) magnetic sensing element".

Alternatively, the magnetic sensing element of the present invention may include an upper electrode layer disposed over the center portion of the composite and the third antiferromagnetic layers; and a lower electrode layers disposed at the bottom of the composite film, wherein an electric current flows in a direction perpendicular to the surface of each layer of the composite film. This type of magnetic sensing element is called "current-perpendicular-to-the-plane (CPP) magnetic sensing element".

Preferably, the nonmagnetic material layer is made of a nonmagnetic conductive material. In such a case, the resulting magnetic sensing element is a spin-valve giant magnetoresistive (GMR) element of either a CIP type or a CPP type.

Alternatively, the nonmagnetic material layer may be made of an insulating material. In such a case, the resulting magnetic sensing element is a spin-valve tunneling magnetoresistive element (CPP-TMR).

In the present invention, the second antiferromagnetic layer is preferably made of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

These alloys immediately after deposition have a disordered face-centered cubic (fcc) structure and transform into an ordered face-centered tetragonal (fct) structure of a CuAuI type by annealing. As a result, a large exchange coupling magnetic field can be generate at the interface with the ferromagnetic layer.

The chromium nonmagnetic layer of the present invention promotes the transformation of these alloys into ordered structures.

When a laminate including the free magnetic layer, the second antiferromagnetic layer composed of one of these alloys, and the third antiferromagnetic layer is annealed, the PtMn alloy, the X—Mn alloy, or the Pt—Mn—X' alloy transforms into an ordered structure. However, the region around the interface between the antiferromagnetic layer and the free magnetic layer rarely undergoes the transformation into ordered structures. When the chromium nonmagnetic layer is provided on the second antiferromagnetic layer, the transformation into ordered structure around interface is promoted, thereby increasing the magnitude of the exchange coupling magnetic field at the interface.

In the present invention, the crystal structure of the second antiferromagnetic layer is, for example, of a CuAuI type. Chromium atoms diffusing from the nonmagnetic layer partly replace the lattice points of the crystal lattice constituted from atoms of Pt and Mn, the crystal lattice constituted from atoms of X and Mn, or the crystal lattice constituted from atoms of Pt, Mn, and X'.

The present invention also provides a method for fabricating the magnetic sensing element. The method comprises (a) depositing a first antiferromagnetic layer, a pinned magnetic layer, a nonmagnetic material layer, a free magnetic layer, a second antiferromagnetic layer, and a chromium nonmagnetic layer on a substrate so as to form a composite on the substrate; (b) field-annealing the composite to generate an exchange coupling magnetic field between the first antiferromagnetic layer and the pinned magnetic layer so as to pin the magnetization direction of the pinned magnetic layer in the height direction; (c) forming a resist layer on the center of the chromium nonmagnetic layer, and partially milling the two side portions of the chromium nonmagnetic layer not covered by the resist; (d) forming a third antiferromagnetic layer on each of the two side portions of the chromium nonmagnetic layer and removing the resist layer; and (e) field-annealing the composite and the third antiferromagnetic layers to generate exchange coupling magnetic fields between the second antiferromagnetic layer and the free magnetic layer at the two side portions so as to pin the magnetization directions of the two side portions of the free magnetic layer in a direction orthogonal to the magnetization direction of the pinned magnetic layer.

In step (a) above, the layers from the first antiferromagnetic layer to the chromium nonmagnetic layer are sequentially deposited on the substrate. In step (c) above, the two side portions of the chromium nonmagnetic layer are only partially milled. By leaving part of the chromium nonmagnetic layer on each of the two side portions of the chromium nonmagnetic layer, the second antiferromagnetic layer can be protected from damage inflicted by ion milling. Moreover, because the thickness of the chromium nonmagnetic layer is small at the two side portions, the third antiferromagnetic layer and the second antiferromagnetic layer can function as one antiferromagnetic layer. As a result, the magnetization direction in the two side portions of the free magnetic layer can be properly pinned in the track width direction by the exchange coupling magnetic field between the free magnetic layer and the second antiferromagnetic layer at the two side portions. The center portion of the free magnetic layer is not as firmly magnetized as in the side portions, and the magnetization direction thereof can rotate in response to external magnetic fields.

According to this method, the free magnetic layer is not affected by ion milling. Thus, the magnetization directions of the two side portions of the free magnetic layer can be firmly pinned while the magnetization direction of the center portion is rotatable in response to external magnetic fields. Thus, the magnetization direction of the free magnetic layer can be properly controlled.

Because the chromium nonmagnetic layer is provided, the exchange coupling magnetic field (Hex) between the second antiferromagnetic layer and the free magnetic layer is larger than when a nonmagnetic layer of other material is provided. Thus, the magnetization directions of the two side portions of the free magnetic layer can be firmly pined by the two side portions of the second antiferromagnetic layer, and side reading can be reduced.

According to this method, a magnetic sensing element with few errors due to side reading having high sensitivity and superior read characteristics even with narrower tracks can be fabricated.

Preferably, in step (c) above, the thickness of the two side portions of the chromium nonmagnetic layer is in the range of 0.2 to 3 Å (average thickness), and more preferably 0.2 to 1.0 Å.

At such a thickness, an antiferromagnetic interaction can be produced between the third antiferromagnetic layers and the second antiferromagnetic layer made in step (d). As a result, the third and second antiferromagnetic layers can function as one antiferromagnetic layer, and the magnetization directions of the two side portions of the free magnetic layer can be properly pinned in the track width direction. Moreover, the second antiferromagnetic layer is not significantly damaged by ion milling.

In step (c) above, the two side portions of the chromium nonmagnetic layer not covered by the resist layer may be completely removed to expose the two side portions of the second antiferromagnetic layer, and the third antiferromagnetic layers may be formed on the exposed portions of the second antiferromagnetic layer in step (d).

In step (a) above, the thickness of the second antiferromagnetic layer is preferably in the range of 5 to 50 Å, more preferably 10 to 50 Å, and most preferably 30 to 40 Å.

In the present invention, the thickness of the second antiferromagnetic layer must not be large. If the second antiferromagnetic layer is thick, it easily transforms into an ordered structure by field annealing, and a large exchange coupling magnetic field is generated between the free magnetic layer and the second antiferromagnetic layer at the center portions.

Accordingly, the thickness of the second antiferromagnetic layer is adjusted as above to prevent generation of a large exchange coupling magnetic field between the center portions of the free magnetic layer and the second antiferromagnetic layer.

In step (a) above, the thickness of the chromium nonmagnetic layer is preferably in the range of 2 to 10 Å, and more preferably 2 to 5 Å. At such a thickness, the thickness of the chromium nonmagnetic layer can be easily adjusted by employing low-energy ion milling in step (c). As a result, the second antiferromagnetic layer does not suffer from damage inflicted by the ion milling.

The present invention also provides another method for fabricating the magnetic sensing element. The method comprises (f) depositing a first antiferromagnetic layer, a pinned magnetic layer, a nonmagnetic material layer, a free magnetic layer, a second antiferromagnetic layer, and a chromium nonmagnetic layer on a substrate so as to form a composite on the substrate; (g) field-annealing the composite to generate an exchange coupling magnetic field between the first antiferromagnetic layer and the pinned magnetic layer so as to pin the magnetization direction of the pinned magnetic layer in the height direction; (h) partly milling the surface of the chromium nonmagnetic layer; (i) forming a third antiferromagnetic layer on the chromium nonmagnetic layer; (j) forming a mask layer on the two side portions of the third antiferromagnetic layer and milling the center portion of the third antiferromagnetic layer not covered by the mask layer; and (k) field-annealing the composite and the third antiferromagnetic layer to generate exchange coupling magnetic fields between the second antiferromagnetic layer and the free magnetic layer at the two side portions so as to pin the magnetization directions of the two side portions of the free magnetic layer in a direction orthogonal to the magnetization direction of the pinned magnetic layer.

In step (f) above, the layers from the first antiferromagnetic and the chromium nonmagnetic layer are sequentially deposited on the substrate. In step (h), the chromium nonmagnetic layer is only partly milled. Thus, the underlying second antiferromagnetic can be protected from damage inflicted by ion milling. Moreover, since the thickness of the chromium nonmagnetic layer is small, the third antiferromagnetic layer and the second antiferromagnetic layer can function as one antiferromagnetic layer by an antiferromagnetic interaction therebetween.

In step (j) above, the thickness of the center portion of the third antiferromagnetic layer is reduced by milling. In this manner, the magnetization directions of the two side portions of the free magnetic layer can be properly pinned in the track width direction by exchange coupling magnetic fields with the second antiferromagnetic layer. The magnetization direction in the center portion of the free magnetic layer is rotatable in response to external magnetic fields.

According to the above method, the free magnetic layer is not affected by ion milling. Thus, a sufficient longitudinal bias magnetic field can be provided at two side portions of the free magnetic layer, and the magnetization of the free magnetic layer can be properly controlled.

According to this method, a magnetic sensing element having high sensitivity and superior read characteristics even with narrower tracks can be fabricated.

Preferably, in step (f) above, the thickness of the chromium nonmagnetic layer is in the range of 5 to 50 Å, more preferably 10 to 50 Å, and most preferably 30 to 40 Å. At such a thickness, the center portion of the second antiferromagnetic layer rarely transforms into an ordered structure by field annealing, and no exchange coupling magnetic field is generated between the center portion of the second antiferromagnetic layer and the center portion of the free magnetic layer. Thus, the center portion of the free magnetic layer can be moderately put to a single-magnetic-domain state so that the magnetization direction thereof can rotate in response to external magnetic fields.

In step (f) above, the thickness of the chromium nonmagnetic layer is preferably 2 to 10 Å, and more preferably 2 to 5 Å. In this manner, the thickness of the chromium nonmagnetic layer can be easily adjusted by employing low-energy ion milling in step (h). As a result, the second antiferromagnetic layer does not suffer from damage inflicted by the ion milling.

In step (h), the chromium nonmagnetic layer is preferably milled to a thickness of 0.2 to 3.0 Å, and more preferably 0.2 to 1.0 Å (average thickness). At such a thickness, an antiferromagnetic interaction can be generated between the two side portions of the third antiferromagnetic layer and the second antiferromagnetic layer, and the second and third antiferromagnetic layers can function as one antiferromagnetic layer. As a result, the magnetization directions at the two side portions of the free magnetic layer can be pinned in the track width direction.

In step (j) above, part of the third antiferromagnetic not covered by the mask layer may be completely removed so as to expose the chromium nonmagnetic layer.

In step (j) above, part of the third antiferromagnetic layer not covered by the mask layer may be completely removed so as to expose the chromium nonmagnetic layer, and the exposed portion of the chromium nonmagnetic layer may also be completely removed to expose the second antiferromagnetic layer.

Moreover, step (k) of field annealing may be performed between the steps (i) and (j).

Preferably, in steps (a) and (f), a noble metal layer is provided between the second antiferromagnetic layer and the chromium nonmagnetic layer.

When the chromium nonmagnetic layer is disposed on the second antiferromagnetic layer, the second antiferromagnetic layer readily transforms to an ordered structure even when the second antiferromagnetic layer has a small thickness. This generates a large exchange coupling magnetic field between the center portions of the free magnetic layer and the antiferromagnetic layer and reduces the amount of change in magnetization direction in response to external magnetic fields. By providing the noble metal layer between the chromium nonmagnetic layer and the second antiferromagnetic layer, the transformation of the second antiferromagnetic layer into an ordered structure can be properly controlled, and a decrease in the rate of change in magnetic resistance can be prevented.

The noble metal layer preferably contain at least one element selected from the group consisting of Ru, Re, Pd, Os, Ir, Pt, Au, and Rh.

Preferably, in steps (a) and (f) above, the free magnetic layer is constituted from three magnetic sublayers. The three magnetic sublayers are preferably made of CoFe, NiFe, and CoFe, respectively.

DESCRIPTION OF THE PREFERRED EMBODIMENTS

First Embodiment

Figure 1:
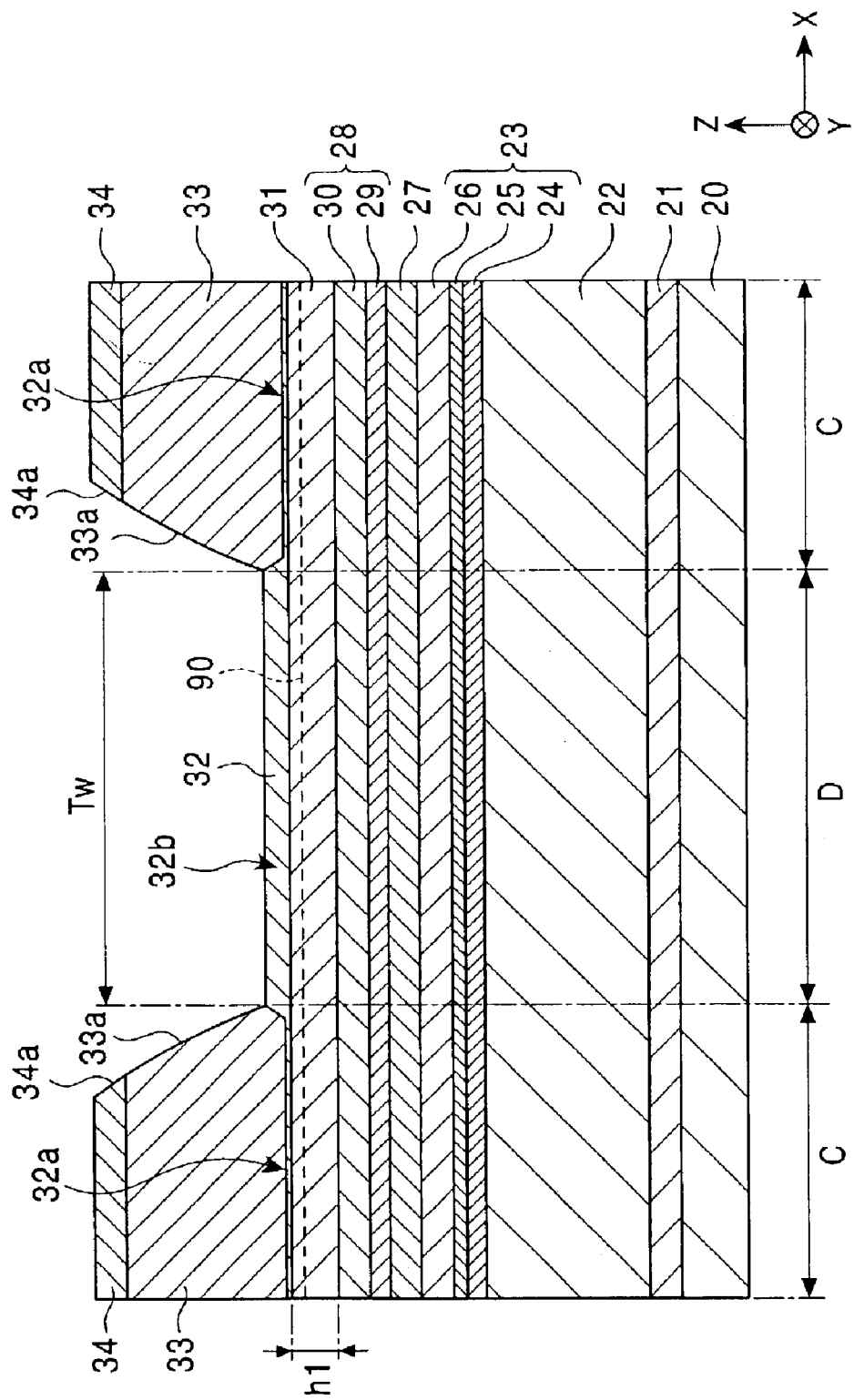
FIG. 1 is a partial cross-sectional view of a magnetic sensing element according to a first embodiment of the present invention viewed from the face opposing a recording medium.

FIG. 1 is a partial cross-sectional view of a magnetic sensing element (spin-valve thin film element) according to a first embodiment of the present invention viewed from the face of the magnetic sensing element opposing a recording medium. Hereinafter, this face is referred to as the "opposing face".

Referring to FIG. 1, a seed layer 21 composed of a NiFe alloy, a NiFeCr alloy, elemental Cr, or the like is formed on a substrate 20. For example, the seed layer 21 is composed of $(Ni_{0.8}Fe_{0.2})_{60\ at\ \%}Cr_{40\ at\ \%}$ and has a thickness of 60 Å.

A first antiferromagnetic layer 22 is formed on the seed layer 21. The first antiferromagnetic layer 22 is composed of a PtMn alloy, an X—Mn alloy, or a Pt—Mn—X' alloy wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

When the first antiferromagnetic layer 22 composed of any one of these alloys is annealed, an exchange coupling film that generates a large exchange coupling magnetic field consisting of the first antiferromagnetic layer 22 and a pinned magnetic layer 23 described below can be obtained. In particular, when the first antiferromagnetic layer 22 is composed of a PtMn alloy, the resulting exchange coupled film exhibits an exchange coupling magnetic field of at least 48 kA/m, for example, more than 64 kA/m, and has a blocking temperature of 380° C. The blocking temperature is the temperature at which the generated exchange coupling magnetic field vanishes.

These alloys immediately after deposition have a disordered face-centered cubic (fcc) structure and transform into an ordered face-centered tetragonal (fct) structure of a CuAuI type by annealing.

The thickness of the first antiferromagnetic layer 22 around the center in the track width direction is 80 to 300 Å.

A pinned magnetic layer 23 is formed on the first antiferromagnetic layer 22. The pinned magnetic layer 23 has a synthetic ferrimagnetic structure comprising three layers, namely, a magnetic sublayer 24, a nonmagnetic interlayer 25, and a magnetic sublayer 26.

The magnetic sublayers 24 and 26 are composed of a magnetic material, for example, a NiFe alloy, elemental Co, a CoNiFe alloy, a CoFe alloy, or a CoNi alloy. The magnetic sublayers 24 and 26 are preferably composed of the same material.

The nonmagnetic interlayer 25 is composed of a nonmagnetic material containing at least one of Ru, Rh, Ir, Cr, Re, and Cu. Preferably, the nonmagnetic interlayer 25 is composed of Ru.

A nonmagnetic material layer 27 is formed on the pinned magnetic layer 23. The nonmagnetic material layer 27 prevents the pinned magnetic layer 23 and a free magnetic layer 28 described later from being magnetically coupled to each other. Since sensing current mainly flows in the nonmagnetic material layer 27, the nonmagnetic material layer 27 is preferably composed of a conductive nonmagnetic material such as Cu, Cr, Au, or Ag. Preferably, the nonmagnetic material layer 27 is composed of Cu.

A free magnetic layer 28 is formed on the nonmagnetic material layer 27. In the embodiment shown in FIG. 1, the free magnetic layer 28 has a two-layer structure comprising an anti-diffusion sublayer 29 and a magnetic material sublayer 30. The anti-diffusion sublayer 29 is composed of Co, CoFe, or the like and prevents interdiffusion between the free magnetic layer 28 and the nonmagnetic material layer 27. The magnetic material sublayer 30 is disposed on the anti-diffusion sublayer 29 and is composed of a NiFe alloy, for example.

A second antiferromagnetic layer 31 is disposed on the free magnetic layer 28. As with the first antiferromagnetic layer 22, the second antiferromagnetic layer 31 is composed of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

In the embodiment shown in FIG. 1, a nonmagnetic layer 32 is disposed on the second antiferromagnetic layer 31. A third antiferromagnetic layer 33 is disposed on each of the two side portions 32a of the nonmagnetic layer 32. As with the first antiferromagnetic layer 22, the third antiferromagnetic layers 33 are composed of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr. Preferably, the third antiferromagnetic layer 33 and the second antiferromagnetic layer 31 are composed of the same material.

An electrode layer 34 is disposed on each of the third antiferromagnetic layers 33. The electrode layers 34 are composed of, for example, Au, W, Cr, Ru, or Ta.

In this embodiment, the gap between the third antiferromagnetic layers 33 and the gap between the electrode layers 34 widens along the Z direction in the drawing, as shown in FIG. 1. Accordingly, ends 33a of the third antiferromagnetic layers 33 and ends 34a of the electrode layers 34 are formed as slopes having either flat surfaces or curved surfaces.

The features of the magnetic sensing element of this embodiment shown in FIG. 1 will now be described.

As shown in FIG. 1, the second antiferromagnetic layer 31 is disposed on the free magnetic layer 28, and the third antiferromagnetic layers 33 is formed on each of two side portions C of the second antiferromagnetic layer 31, with the nonmagnetic layer 32 therebetween. The two side portions 32a of the nonmagnetic layer 32 disposed between the second antiferromagnetic layer 31 and the third antiferromagnetic layers 33 have a small thickness. Preferably, the two side portions 32a have a thickness in the range of 0.2 to 3 Å, and more preferably 0.2 to 1.0 Å.

The nonmagnetic layer 32 is composed of Cr. The average thickness can be calculated by X-ray fluorescence analysis.

The average thickness of the nonmagnetic layer 32 is sometimes less than 1 Å. As is widely known, no uniform thin film has a thickness of less than 1 Å since 1 Å corresponds to the diameter of one atom or less. However, in a nonuniform thin film containing unevenly distributed Cr atoms, there exist regions with chromium atoms and regions without any chromium atoms. Accordingly, the average thickness of the nonmagnetic layer 32 is sometimes less than 1 Å. At such a thickness, ferromagnetic interaction occurs between the second antiferromagnetic layer 31 and the third antiferromagnetic layers 33 through the nonmagnetic layer 32. As a result, the second antiferromagnetic layer 31 and the third antiferromagnetic layers 33 readily function as a single antiferromagnetic layer.

In view of the above, the embodiment shown in FIG. 1 has a structure similar to a magnetic sensing element comprising a ferromagnetic layer with a large thickness disposed on each of the two side portions C of the free magnetic layer 28. The magnetization directions of the two side portions C of the free magnetic layer 28 are properly pinned in the track width direction (the X direction in the drawing) by an exchange coupling magnetic field with the two side portions C of the second antiferromagnetic layer 31.

In the embodiment shown in FIG. 1, the second antiferromagnetic layer 31 also covers a center portion D of the free magnetic layer 28. However, the third antiferromagnetic layers 33 are not disposed over the center portion D.

In this embodiment, the thickness h1 of the second antiferromagnetic layer 31 is controlled during deposition so that the center portion D of the second antiferromagnetic layer 31 does not exhibit antiferromagnetic properties and become nonantiferromagnetic or nonmagnetic instead.

The thickness h1 of the second antiferromagnetic layer 31 is preferably in the range of 5 to 50 Å, more preferably 10 to 50 Å, and most preferably 30 to 40 Å.

Since the nonmagnetic layer 32 disposed on the second antiferromagnetic layer 31 functions as a protective layer, the antiferromagnetic characteristics at the two side portions of the second antiferromagnetic layer 31 during or after manufacture are prevented from being degraded. Accordingly, in this embodiment, the thickness h1 of the second antiferromagnetic layer 31 may be 5 to 50 Å, for example, approximately 10 Å.

At such a small thickness, the center portion D of the second antiferromagnetic layer 31 rarely transforms into an ordered structure even after field annealing. The exchange coupling magnetic field between the center portion D of the second antiferromagnetic layer 31 and the center portion D of the free magnetic layer 28 is small, if any.

The thickness of the second antiferromagnetic layer 31 is at least 5 Å because, at a smaller thickness, the exchange coupling magnetic fields between the two side portions C of the second antiferromagnetic layer 31 and the two side portions C of the free magnetic layer 28 become weak. As a result, the magnetization directions of the two side portions C of the free magnetic layer 28 may not be sufficiently pinned in the track width direction.

Although the third antiferromagnetic layers 33 and the two side portions C of the second antiferromagnetic layer 31 function as a single antiferromagnetic layer due to the antiferromagnetic interaction via the nonmagnetic layer 32, the third antiferromagnetic layer 33 and the second antiferromagnetic layer 31 are not physically a single layer. If the thickness of the second antiferromagnetic layer 31 is small, the second antiferromagnetic layer 31 only moderately transforms into an ordered structure. Thus, the exchange coupling magnetic field between the two side portions C of the second antiferromagnetic layer 31 and the two side portions C of the free magnetic layer 28 becomes weak. In view of the above, the thickness of the second antiferromagnetic layer 31 is set to at least 5 Å.

Moreover, shunt loss at the center portion D can be decreased and the read output can be increased by adjusting the thickness of the second antiferromagnetic layer 31 in the range of 5 to 50 Å.

The total of the thickness of the second antiferromagnetic layer 31 at the side portion C and the thickness of the third antiferromagnetic layer 33 is preferably in the range of 80 to 300 Å. In this manner, the two side portions C of the second antiferromagnetic layer 31 can properly exhibit antiferromagnetic characteristics and can be transformed in to an ordered structure by field annealing. As a result, exchange coupling magnetic fields are generated between the two side portions C of the second antiferromagnetic layer 31 and the two side portions C of the free magnetic layer 28, and the magnetization directions of the two side portions C of the free magnetic layer 28 can be pinned in the track width direction.

The nonmagnetic layer 32 will now be explained. The nonmagnetic layer 32 functions as a protective layer for preventing the second antiferromagnetic layer 31 from being oxidized in air in a manufacturing method, as described below.

The nonmagnetic layer 32 is preferably composed of a material less easily oxidizable than Ta. Preferably, the nonmagnetic layer 32 is constituted from an element that does not affect the antiferromagnetic properties of the second antiferromagnetic layer 31 and the third antiferromagnetic layers 33. This is because the element may diffuse into the second antiferromagnetic layer 31 and the third antiferromagnetic layers 33 during deposition or during field annealing for controlling the magnetization direction of the pinned magnetic layer 23 or free magnetic layer 28.

In this embodiment, the nonmagnetic layer 32 is composed of Cr. Chromium is rarely oxidized in the thickness direction by exposure to air. Thus, the thickness of the nonmagnetic layer 32 is likely to be prevented from increasing due to oxidation resulting from exposure to air.

Moreover, when the nonmagnetic layer 32 is composed of Cr, the exchange coupling magnetic fields (Hex) between the second antiferromagnetic layer 31 and the free magnetic layer 28 at side portions can become larger than that with the nonmagnetic layer 32 composed of at least one of Ru, Re, Pd, Os, Ir, Pt, Au, and Rh.

When the second antiferromagnetic layer 31 composed of a PtMn alloy, the X—Mn alloy, or the Pt—Mn—X' alloy is annealed along with the free magnetic layer 28 underneath and the third antiferromagnetic layers 33 on top, the PtMn alloy, the X—Mn alloy, or the Pt—Mn—X' alloy transforms into an ordered structure. However, part around the interface between the second antiferromagnetic layer 31 and the free magnetic layer 28 does not easily transform into the ordered structure. When a nonmagnetic layer 32 composed of Cr is provided at the interface, the transformation into the ordered structure around the interface can progress nearly completely, thereby increasing the magnitudes of the exchange coupling magnetic fields generated at the interface.

When the nonmagnetic layer 32 composed of Cr is provided, chromium atoms of the nonmagnetic layer 32 diffuse into the second antiferromagnetic layer 31. The diffused atoms promote transformation of the PtMn alloy, the X—Mn alloy, or the Pt—Mn—X' alloy into ordered structures.

In this embodiment, because the nonmagnetic layer 32, functioning as the protective layer, is disposed on the second antiferromagnetic layer 31, the thickness h1 of the second antiferromagnetic layer 31 can be reduced to a thickness in the range of 5 to 50 Å, for example, approximately 10 Å. When Cr atoms of the nonmagnetic layer 32 diffuse into the second antiferromagnetic layer 31 having such a small thickness, the transformation into ordered structures can be efficiently promoted around the interface between the second antiferromagnetic layer 31 and the free magnetic layer 28, and the exchange coupling magnetic field generated at the interface can be increased.

Accordingly, in the magnetic sensing element of this embodiment, the magnetization of the two side portions C of the free magnetic layer 28 can be firmly pinned with the two side portions C of the second antiferromagnetic layer 31. Thus, side reading can be reduced.

The crystal structure of the second antiferromagnetic layer 31 is, for example, of a CuAuI type. Chromium atoms diffusing from the nonmagnetic layer 32 partly replace the lattice points of the crystal lattice constituted from atoms of Pt and Mn, the crystal lattice constituted from atoms of X and Mn, or the crystal lattice constituted from atoms of Pt, Mn, and X'.

Whether chromium atoms of the nonmagnetic layer 32 are diffused into the second antiferromagnetic layer 31 and the third antiferromagnetic layers 33 can be examined by secondary ion mass spectrometry (SIMS) analysis, for example. When the second antiferromagnetic layer 31 is formed using a PtMn alloy and the nonmagnetic layer 32 is formed using Cr, a diffusion layer composed of a Cr—Pt—Mn alloy is formed by field annealing.

The thickness of the nonmagnetic layer 32 will now be explained. The nonmagnetic layer 32 is deposited to a thickness of 2 to 10 Å and preferably 2 to 5 Å. The nonmagnetic layer 32 composed of Cr is a dense layer that prevents oxidation in the thickness direction when exposed to air. Thus, the nonmagnetic layer 32 can adequately prevent the second antiferromagnetic layer 31 from being oxidized by exposure to air even at a small thickness.

The thickness of a center portion 32$b$ of the nonmagnetic layer 32 remains the same as initially deposited. This is because the center portion 32$b$ is not affected by ion milling, as will be described in later sections in the description of the fabrication process.

The two side portions 32$a$ of the nonmagnetic layer 32 are milled by ion milling. The thickness of the two side portions 32$a$ is smaller than the center portion 32$b$ of the nonmagnetic layer 32. The reason for making the thickness of the center portion 32$b$ larger than that of the two side portions 32$a$ is to properly produce an antiferromagnetic interaction between the two side portions C of the second antiferromagnetic layer 31 and the third antiferromagnetic layers 33 so that the second antiferromagnetic layer 31 and the third antiferromagnetic layers 33 can function as a single antiferromagnetic layer. Note that the nonmagnetic layer 32 is provided between the second antiferromagnetic layer 31 and the third antiferromagnetic layers 33. When the thickness of the nonmagnetic layer 32 is large, the concentration of Cr, which is a nonmagnetic substance, does not sufficiently decrease as a result of diffusion, and the nonmagnetic layer 32 remains thick after annealing. This eliminates the antiferromagnetic interaction between the second antiferromagnetic layer 31 and the third antiferromagnetic layers 33. Since the second antiferromagnetic layer 31 alone is so thin that no exchange coupling magnetic field is generated between the second antiferromagnetic layer 31 alone and the free magnetic layer 28, the magnetization of the two side portions C of the free magnetic layer 28 cannot be properly pinned.

As described above, the thickness of the two side portions 32$a$ of the nonmagnetic layer 32 is preferably 3 Å or less, and more preferably 1.0 Å or less. At such a small thickness, an antiferromagnetic interaction occurs between the two side portions C of the second antiferromagnetic layer 31 and the third antiferromagnetic layers 33 and the second antiferromagnetic layer 31 and the third antiferromagnetic layers 33 can thus function as a single antiferromagnetic layer.

The two side portions 32$a$ of the nonmagnetic layer 32 preferably have an average thickness of 0.2 Å or more. In this manner, the second antiferromagnetic layer 31 can remain unaffected by the ion milling and can thus exhibit sufficient magnetic characteristics.

As shown in FIG. 1, the two side portions 32$a$ of the nonmagnetic layer 32 can be milled to a small thickness of 3 Å or less because low-energy ion milling can be employed. The nonmagnetic layer 32 is formed as a thin layer, i.e., 2 to 10 Å, or more preferably, 2 to 5 Å, from the beginning. Thus, the thickness of the nonmagnetic layer 32 can be properly adjusted by employing low-energy ion milling. The milling rate is lower compared to that of high-energy ion milling, and it is relatively easy to stop milling before completely removing the nonmagnetic layer 32.

Here, the term "low-energy ion milling" refers to ion milling employing ion beams having beam voltages (accelerating voltage) of less than 1,000 V. For example, beam voltages in the range of 100 to 500 V may be employed. In this embodiment, an Ar ion beam having a beam voltage of 200 V is used.

Preferably, a noble metal layer 90 is disposed between the nonmagnetic layer 32 and the second antiferromagnetic layer 31, as indicated by a broken line in FIG. 1.

When the nonmagnetic layer 32 is deposited directly on the second antiferromagnetic layer 31, transformation into an ordered structure occurs even though the thickness of the second antiferromagnetic layer 31 is small. As a result, the exchange coupling magnetic field between the second antiferromagnetic layer 31 and the center portion of the free magnetic layer 28 readily increases, and the amount of change in the magnetization direction in response to external magnetic fields readily decreases. By providing the noble metal layer 90 between the nonmagnetic layer 32 and the second antiferromagnetic layer 31, the tendency of the second antiferromagnetic layer 31 to transform into ordered structures can be adequately controlled. Accordingly, a decrease in the rate of change in magnetic resistance can be prevented.

The noble metal layer 90 is composed of at least one element selected from the group consisting of Ru, Re, Pd, Os, Ir, Pt, Au, and Rh.

In the embodiment shown in FIG. 1, the track width Tw is defined by the gap between the lower portions of the third antiferromagnetic layers 33 in the track width direction (the X direction in the drawing). The track width Tw is preferably 0.2 μm or less.

In the embodiment shown in FIG. 1, the magnetization directions of the two side portions C of the free magnetic layer 28 are properly pinned in the track width direction (the X direction). In contrast, the magnetization direction of the center portion D of the free magnetic layer 28 is only moderately put in a single-magnetic-domain state so that the magnetization direction can rotate in response to external magnetic fields. The length of the center portion D of the free magnetic layer 28 in the track width direction is approximately the same as the track width Tw. In this manner, the magnetization direction of part of the free magnetic layer 28 corresponding to the track width Tw can properly rotate in response to external magnetic fields.

In this embodiment, the second antiferromagnetic layer 31 is formed on the free magnetic layer 28, and the nonmagnetic layer 32 is milled by ion milling. Thus, there is no danger of the free magnetic layer 28 being removed by ion milling, and magnetic characteristics of the free magnetic layer 28 are not degraded by damage inflicted by ion milling.

Moreover, since the second antiferromagnetic layer 31 is formed on the free magnetic layer 28 and the third antiferromagnetic layers 33 are formed on the two side portions C of the second antiferromagnetic layer 31 with the nonmagnetic layer 32 therebetween. According to this structure the magnetization of the free magnetic layer 28 can be properly controlled even with narrow tracks. Thus, a magnetic sensing element that meets the demand for narrower tracks can be obtained.

Second Embodiment

Figure 2:
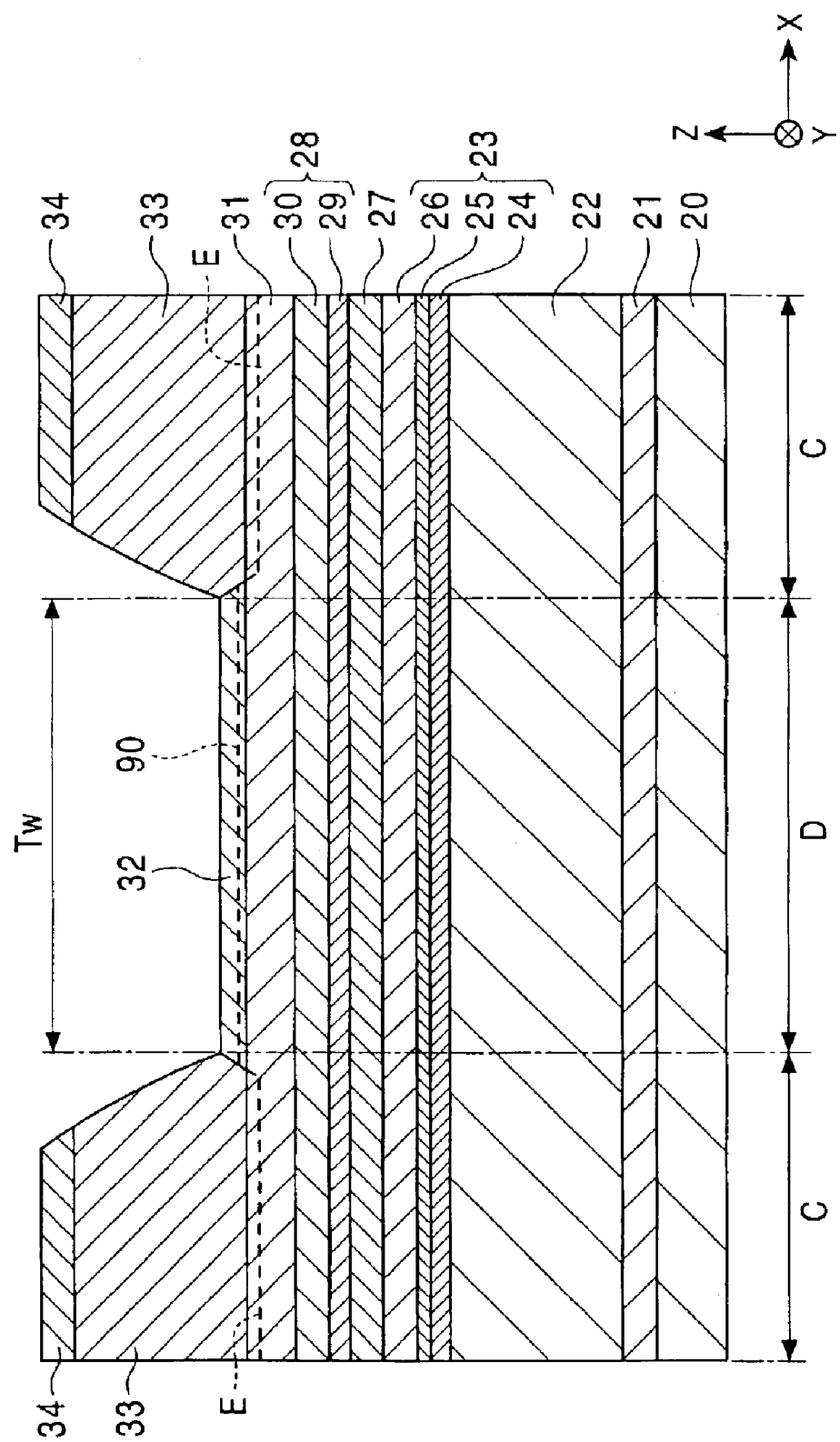
FIG. 2 is a partial cross-sectional view of a magnetic sensing element according to a second embodiment of the present invention viewed from the face opposing a recording medium.

FIG. 2 is a partial cross-sectional view of a magnetic sensing element according to a second embodiment of the present invention.

The magnetic sensing element in FIG. 2 differs from the magnetic sensing element in FIG. 1 in that the nonmagnetic layer 32 is provided only in the gap between the third antiferromagnetic layers 33, i.e., the gap corresponding to the track width Tw. No nonmagnetic layer 32 is provided between the third antiferromagnetic layers 33 and the two side portions C of the second antiferromagnetic layer 31.

As in the first embodiment shown in FIG. 1, the second antiferromagnetic layer 31 of this embodiment shown in FIG. 2 has a thickness of 5 to 50 Å. The center portion D of the second antiferromagnetic layer 31 exhibits nonantiferromagnetic properties. The exchange coupling magnetic field between the center portion D of the second antiferromagnetic layer 31 and the center portion D of the free magnetic layer 28 is small if any. The magnetization direction of the center portion D of the free magnetic layer 28 is properly oriented in the track width direction (the X direction) and rotates in response to external magnetic fields.

The second antiferromagnetic layer 31 are disposed on the free magnetic layer 28, and the third antiferromagnetic layer 33 is disposed directly on each of the two side portions C of the second antiferromagnetic layer 31. The second antiferromagnetic layer 31 exhibits antiferromagnetic properties as a result of the antiferromagnetic interaction between the second antiferromagnetic layer 31 and the third antiferromagnetic layers 33. When these layers are annealed in a magnetic field, the two side portions C of the second antiferromagnetic layer 31 transforms into an ordered structure, and exchange coupling magnetic fields are produced between the second antiferromagnetic layer 31 and the free magnetic layer 28 at the two side portions C. As a result, the magnetization direction of the free magnetic layer 28 in the two side portions C is firmly pinned in the track width direction (the X direction in the drawing).

The nonmagnetic layer 32 in FIG. 2 is composed of Cr. When the nonmagnetic layer 32 is formed using Cr, oxidation rarely progresses in the layer thickness direction when exposed to air. The nonmagnetic layer 32 made of Cr can prevent the second antiferromagnetic layer 31 from being oxidized even when the nonmagnetic layer 32 has a small thickness. In this embodiment, the nonmagnetic layer 32 preferably has a thickness of 2 to 10 Å, and more preferably 2 to 5 Å immediately after the deposition.

As will be described in a manufacturing method below, the nonmagnetic layer 32 is initially formed over the entire surface of the second antiferromagnetic layer 31, and two side portions of the nonmagnetic layer 32 is subsequently removed by ion milling to expose the second antiferromagnetic layer 31 at the two side portions C. The third antiferromagnetic layers 33 are then deposited on the second antiferromagnetic layer 31 at the two side portions C. Since the thickness of the nonmagnetic layer 32 is small, i.e., approximately 2 to 10 Å, the nonmagnetic layer 32 can be properly removed by low-energy ion milling. Controlling the milling process so as not to remove all of the second antiferromagnetic layer 31 is easier compared to when high-energy ion milling is employed. Thus, less damage is inflicted to the second antiferromagnetic layer 31 under the nonmagnetic layer 32.

As described above, since the surface of the second antiferromagnetic layer 31 at the two side portions C suffers less from ion milling, the second antiferromagnetic layer 31 maintains superior magnetic characteristics.

In the magnetic sensing element shown in FIG. 2 also, Cr atoms of the nonmagnetic layer 32 diffuse into the second antiferromagnetic layer 31. Since the nonmagnetic layer 32, functioning as a protective layer, is provided on the second antiferromagnetic layer 31, the thickness h1 of the second antiferromagnetic layer 31 can be reduced to 5 to 50 Å, for example, to approximately 10 Å. Chromium atoms diffusing into the second antiferromagnetic layer 31 from the nonmagnetic layer 32 promote transformation into an ordered structure around the interface between the second antiferromagnetic layer 31 and the free magnetic layer 28. This increases the magnitude of the exchange coupling magnetic field generated at the interface.

Accordingly, the magnetization directions of the free magnetic layer 28 at the two side portions C can be firmly pinned by the two side portions C of the second antiferromagnetic layer 31. Side reading can be reduced.

The crystal structure of the second antiferromagnetic layer 31 is, for example, of a CuAuI type. Chromium atoms diffusing from the nonmagnetic layer 32 partly replace the lattice points of the crystal lattice constituted from atoms of Pt and Mn, the crystal lattice constituted from atoms of X and Mn, or the crystal lattice constituted from atoms of Pt, Mn, and X'.

In the embodiment shown in FIG. 2, the second antiferromagnetic layer 31 is disposed on the free magnetic layer 28, and the nonmagnetic layer 32 is milled by ion milling. Unlike conventional techniques, ion milling does not affect the free magnetic layer 28. The problem of magnetic characteristics degradation of the free magnetic layer 28 due to damage inflicted by ion milling does not occur.

According to the structure shown in FIG. 2, the magnetization directions of the free magnetic layer 28 can be properly controlled even with narrower tracks, and a magnetic sensing element that can meet the demand for narrower tracks can be obtained.

Note that the second antiferromagnetic layer 31 at the two side portions C may be partially milled, as shown by a broken line E in FIG. 2. In such a case, the thickness of the second antiferromagnetic layer 31 at the two side portions C becomes smaller than the thickness at the center portion D. However, since the second antiferromagnetic layer 31 at the two side portions C is removed by low-energy ion milling, the damage inflicted to the two side portions C is less compared to when high-energy ion milling is employed. The second antiferromagnetic layer 31 at the two side portions C shows antiferromagnetic characteristics and generates exchange coupling magnetic fields sufficient for firmly pinning the magnetization direction of the free magnetic layer 28 at the two side portions C.

Third Embodiment

Figure 3:
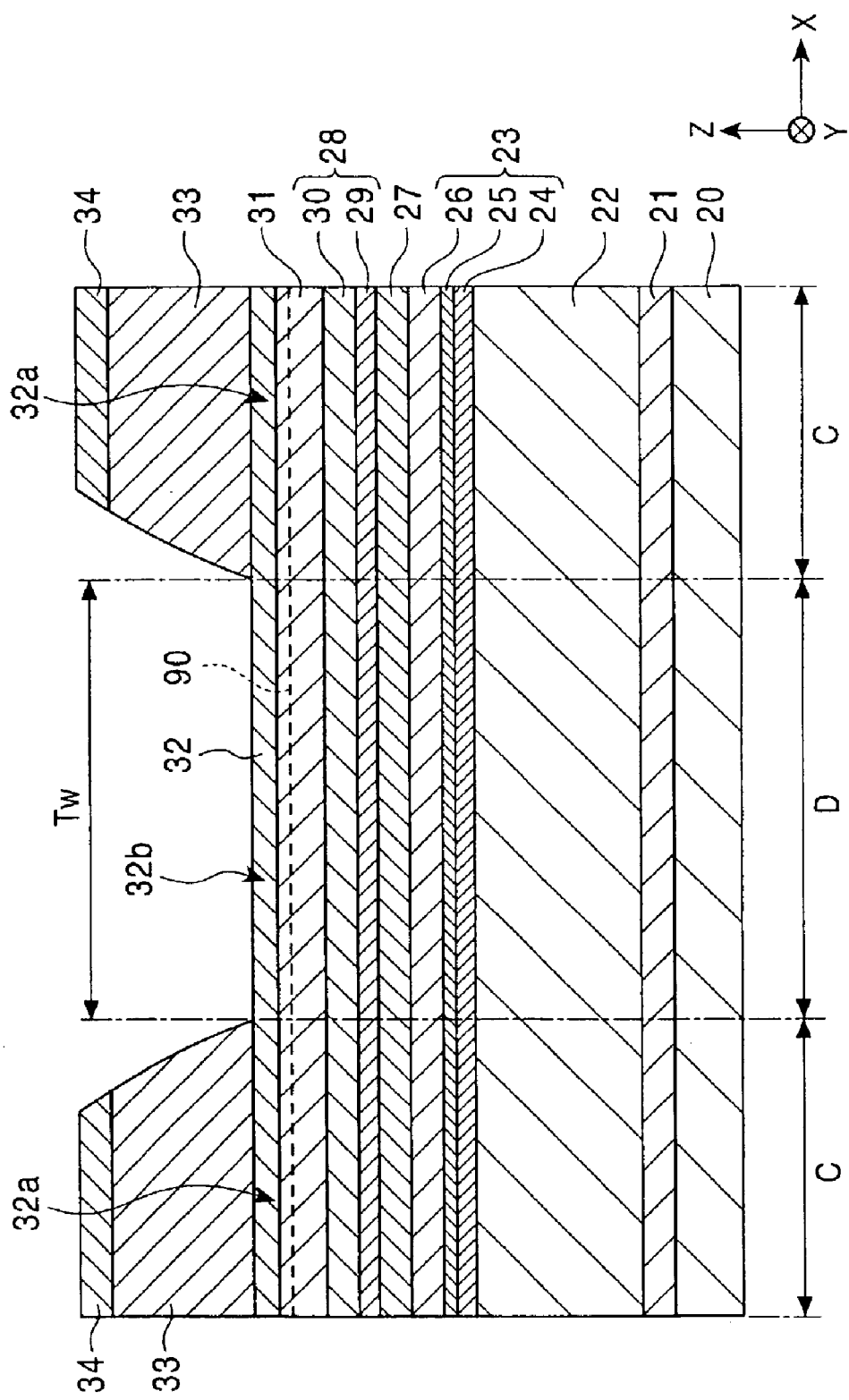
FIG. 3 is a partial cross-sectional view of a magnetic sensing element according to a third embodiment of the present invention viewed from the face opposing a recording medium.

FIG. 3 is a partial cross-sectional view of a magnetic sensing element according to a third embodiment of the present invention viewed from the opposing face.

The embodiment shown in FIG. 3 differs from that shown in FIG. 1 in that the nonmagnetic layer 32 has a uniform thickness. In other words, the center portion 32b and the two side portions 32a of the nonmagnetic layer 32 have the same thickness.

When the thickness of the nonmagnetic layer 32 exceeds 3 Å, the concentration of Cr, which is the nonmagnetic substance, does not sufficiently decrease as a result of diffusion, and the nonmagnetic layer 32 remains thick after annealing. This eliminates the antiferromagnetic interaction between the second antiferromagnetic layer 31 and the third antiferromagnetic layers 33 and inhibits the second antiferromagnetic layer 31 at the two side portions C and the third antiferromagnetic layers 33 from functioning as a single antiferromagnetic layer. Since the second antiferromagnetic layer 31 alone is so thin that no exchange coupling magnetic field is generated between the second antiferromagnetic layer 31 alone and the free magnetic layer 28, the two side portions C of the second antiferromagnetic layer 31 do not properly transform into an ordered structure by field annealing. As a result, the exchange coupling magnetic fields generated between the two side portions C of the second antiferromagnetic layer 31 and the free magnetic layer 28 becomes small, if any. Moreover, the magnetization of the two side portions C of the free magnetic layer 28 cannot be firmly pinned in the track width direction (the X direction).

Accordingly, in this embodiment, the thickness of the nonmagnetic layer 32 should be 3 Å or less. More preferably, the thickness of the nonmagnetic layer 32 is 1 Å or less. The nonmagnetic layer 32 may have an average thickness of 0.2 Å. In other words, the average thickness of the nonmagnetic layer 32 is preferably in the range of 0.2 to 3 Å, and more preferably in the range of 0.2 to 1 Å.

As in the first embodiment, the second antiferromagnetic layer 31 of the third embodiment shown in FIG. 3 preferably has a thickness of 5 to 50 Å. The center portion D of the second antiferromagnetic layer 31 exhibits nonantiferromagnetic or nonmagnetic properties. The exchange coupling magnetic field between the center portion D of the second antiferromagnetic layer 31 and the center portion D of the free magnetic layer 28 is small, if any. The magnetization direction of the center portion D of the free magnetic layer 28 is properly oriented in the track width direction (the X direction) and rotates in response to external magnetic fields.

The second antiferromagnetic layer 31 are disposed on the free magnetic layer 28, and the third antiferromagnetic layer 33 is disposed on each of the two side portions C of the second antiferromagnetic layer 31 with the nonmagnetic layer 32 therebetween. The second antiferromagnetic layer 31 exhibits antiferromagnetic properties as a result of the antiferromagnetic interaction between the second antiferromagnetic layer 31 and the third antiferromagnetic layers 33. When these layers are annealed in a magnetic field, the two side portions C of the second antiferromagnetic layer 31 transforms into an ordered structure, and exchange coupling magnetic fields are produced between the second antiferromagnetic layer 31 and the free magnetic layer 28 at the two side portions C. As a result, the magnetization direction of the free magnetic layer 28 in the two side portions C is firmly pinned in the track width direction (the X direction in the drawing).

Unlike conventional techniques, in this embodiment shown in FIG. 3, the free magnetic layer 28 is unaffected by ion milling, and the problem of magnetic characteristics degradation of the free magnetic layer 28 due to damage inflicted by ion milling does not occur.

According to the structure shown in FIG. 3, the magnetization directions of the free magnetic layer 28 can be properly controlled even with narrower tracks, and a magnetic sensing element that can meet the demand for narrower tracks can be obtained.

In the magnetic sensing element shown in FIG. 3 also, chromium atoms of the nonmagnetic layer 32 diffuse into the second antiferromagnetic layer 31. The diffusion of Cr atoms into the second antiferromagnetic layer 31 promotes the transformation of the PtMn alloy, the X—Mn alloy, and the Pt—Mn—X' alloy into an ordered structure.

Accordingly, in the magnetic sensing element of this embodiment, the magnetization direction of the free magnetic layer 28 at the two side portions C can be firmly pinned in relation with the two side portions C of the second antiferromagnetic layer 31, and side reading can be prevented.

In this embodiment, the crystal structure of the second antiferromagnetic layer 31 is, for example, of a CuAuI type. Chromium atoms diffusing from the nonmagnetic layer 32 partly replace the lattice points of the crystal lattice constituted from atoms of Pt and Mn, the crystal lattice constituted from atoms of X and Mn, or the crystal lattice constituted from atoms of Pt, Mn, and X'.

Fourth Embodiment

Figure 4:
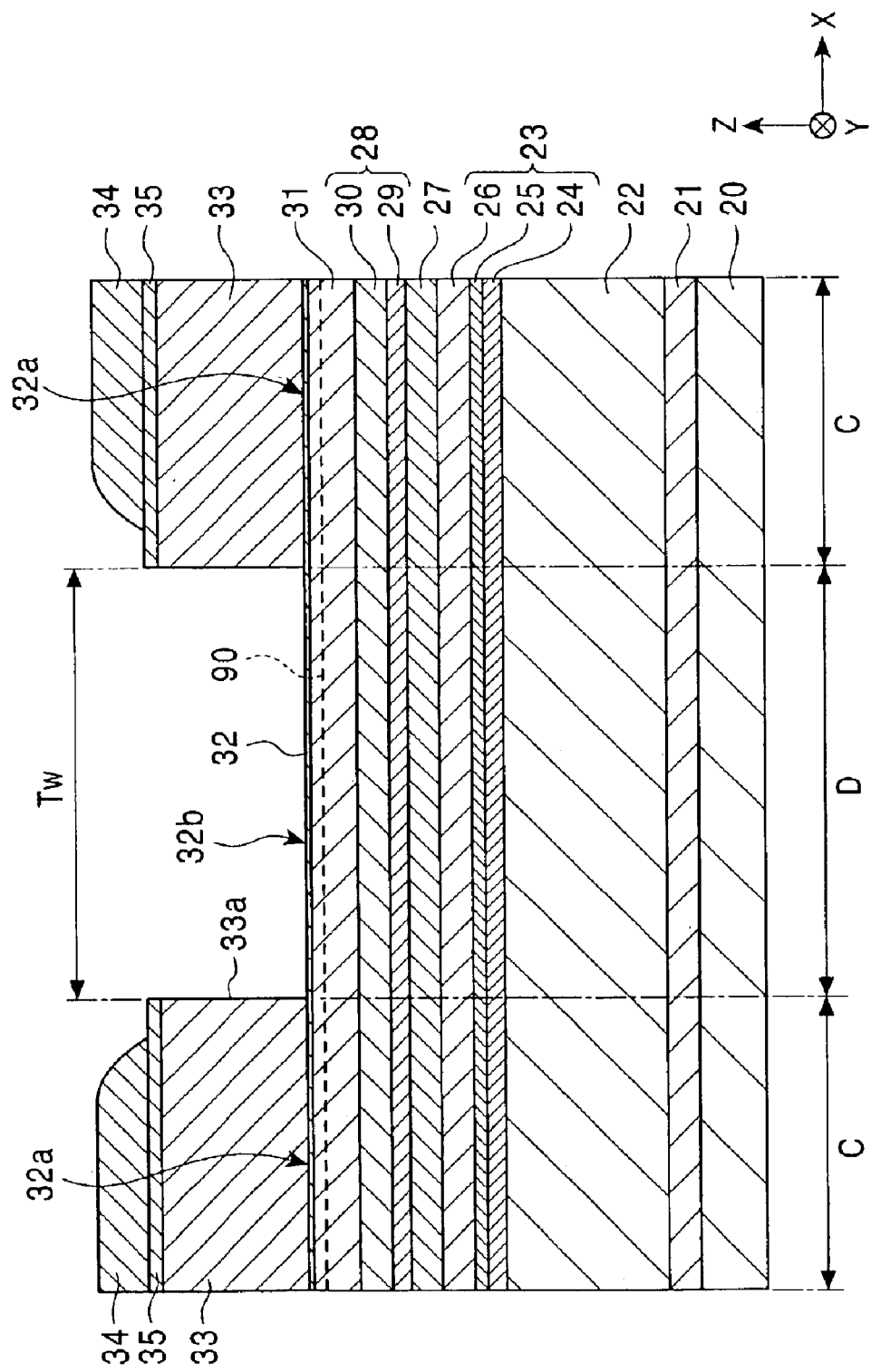
FIG. 4 is a partial cross-sectional view of a magnetic sensing element according to a fourth embodiment of the present invention viewed from the face opposing a recording medium.

FIG. 4 is a partial cross-sectional view of a magnetic sensing element according to a fourth embodiment of the present invention.

Referring to FIG. 4, the seed layer 21, the first antiferromagnetic layer 22, the pinned magnetic layer 23, the nonmagnetic material layer 27, the free magnetic layer 28, the second antiferromagnetic layer 31, and the third antiferromagnetic layers 33 are sequentially formed on the substrate 20. The material of each layer is the same as that of the first embodiment described above.

In this embodiment shown in FIG. 4, the third antiferromagnetic layer 33 is formed on each of the two side portions 32a of the nonmagnetic layer 32. The electrode layer 34 is disposed on each of the third antiferromagnetic layers 33 with an interlayer 35 therebetween. The interlayer 35 is composed of Ta or the like.

In the embodiment shown in FIG. 4, the track width Tw is determined by the gap between the lower faces of the third antiferromagnetic layers 33. The track width Tw is preferably 0.2 μm or less.

The nonmagnetic layer 32 covers the entire surface of the second antiferromagnetic layer 31. The nonmagnetic layer 32 is thin and is composed of Cr. The Cr layer is rarely oxidized in the thickness direction when exposed to air.

The thickness of the nonmagnetic layer 32 is preferably 0.2 to 3 Å, and more preferably 0.2 to 1.0 Å. The term "thickness of 0.2 Å" means the average thickness of the entire nonmagnetic layer 32 is 0.2 Å. Since the size of atoms is larger than 0.2 Å, the nonmagnetic layer 32 having an average thickness of 0.2 Å has an island structure including regions without atoms and regions with atoms.

When the nonmagnetic layer 32 has such a small thickness, an antiferromagnetic interaction can still be produced between the second antiferromagnetic layer 31 and the third antiferromagnetic layer 33, although the nonmagnetic layer 32 is provided therebetween. As a result, the second antiferromagnetic layer 31 at the two side portions C exhibits antiferromagnetic properties and transforms into an ordered structure by field annealing. Exchange coupling magnetic fields are then produced between the second antiferromagnetic layer 31 and the free magnetic layer 28 at the two side portions C, and the magnetization of the two side portions C of the free magnetic layer 28 is firmly pinned in the track width direction (the X direction).

Although the second antiferromagnetic layer 31 is formed on the center portion D of the free magnetic layer 28, the thickness of the second antiferromagnetic layer 31 is so small that the second antiferromagnetic layer 31 alone does not exhibit antiferromagnetic properties. The thickness of the second antiferromagnetic layer 31 is preferably 5 to 50 Å, more preferably 10 to 50 Å, and most preferably 30 to 40 Å.

With this structure, the center portion D of the second antiferromagnetic layer 31 rarely transforms into an ordered structure even when field annealed. The exchange coupling magnetic field between the free magnetic layer 28 and the second antiferromagnetic layer 31 at the center portion D is small, if any. The magnetization direction of the free magnetic layer 28 at the center portion D is moderately put in a single-magnetic-domain state so that the magnetization direction can rotate in response to external magnetic fields.

When the nonmagnetic layer 32 is composed of Cr, the exchange coupling magnetic fields (Hex) between the second antiferromagnetic layer 31 and the free magnetic layer 28 can become larger than that with the nonmagnetic layer 32 composed of at least one of Ru, Re, Pd, Os, Ir, Pt, Au, and Rh.

The material, i.e., chromium, of the nonmagnetic layer 32 may diffuse into the second antiferromagnetic layer 31 and third antiferromagnetic layers 33 during field annealing for controlling the magnetization directions of the resist layer 38 and the pinned magnetic layer 23. In particular, when the second antiferromagnetic layer 31 and the third antiferromagnetic layers 33 are composed of a PtMn alloy and the nonmagnetic layer 32 is composed of Cr, the region around the upper face of the second antiferromagnetic layer 31 and the region around the lower face of each third antiferromagnetic layer 33 become an antiferromagnetic layer composed of Cr—Pt—Mn.

In this embodiment, the nonmagnetic layer 32 functioning as a protective layer is deposited on the second antiferromagnetic layer 31. Thus, the thickness h1 of the second antiferromagnetic layer 31 can be reduced to a thickness of 5 to 50 Å, e.g., approximately 10 Å. Chromium atoms diffusing from the nonmagnetic layer 32 into the second antiferromagnetic layer 31 having such a small thickness effectively promote the transformation into an ordered structure around the interface between the second antiferromagnetic layer 31 and the free magnetic layer 28. Thus, the magnitude of the exchange coupling magnetic field generated at the interface can be increased.

Accordingly, in the magnetic sensing element of this embodiment, the magnetization of the two side portions C of the free magnetic layer 28 can be firmly pinned with the two side portions C of the second antiferromagnetic layer 31. Thus, side reading can be reduced.

The fourth embodiment shown in FIG. 4 differs from the first to third embodiment shown in FIGS. 1 to 3 in that the end 33a of each third antiferromagnetic layer 33 is perpendicular to the surface of the substrate 20, i.e., extends along the Z direction in the drawing. Such a difference in shape is derived from the difference in the manufacturing processes, as will be described later.

Alternatively, as in the first to third embodiments shown in FIGS. 1 to 3, the side end face 33a may be formed as a flat or curved slope in such a manner that the gap between the ends 33a of the third antiferromagnetic layers 33 gradually increases along the Z direction.

Figure 5:
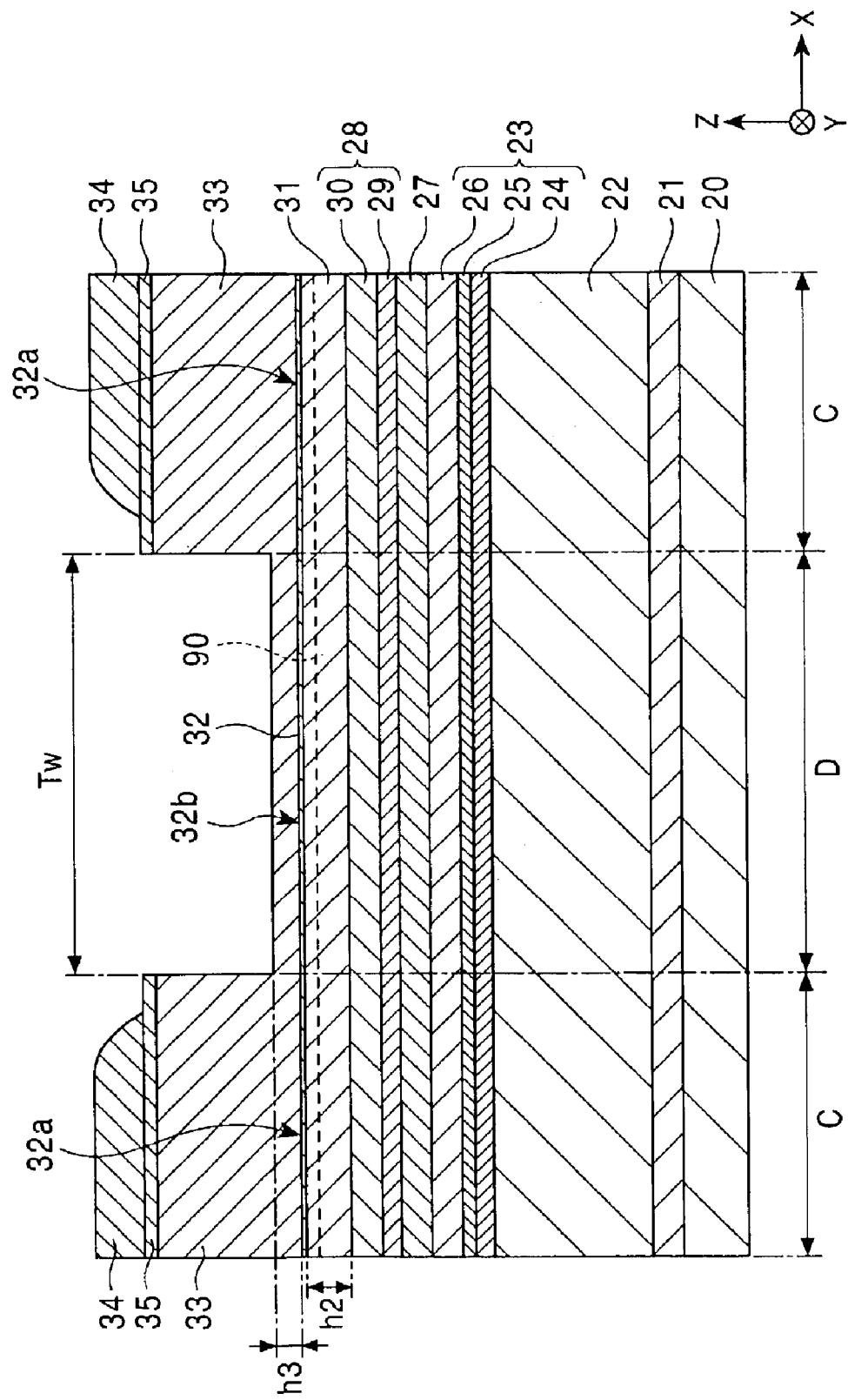
FIG. 5 is a partial cross-sectional view of a magnetic sensing element according to a fifth embodiment of the present invention viewed from the face opposing a recording medium.
Figure 6:
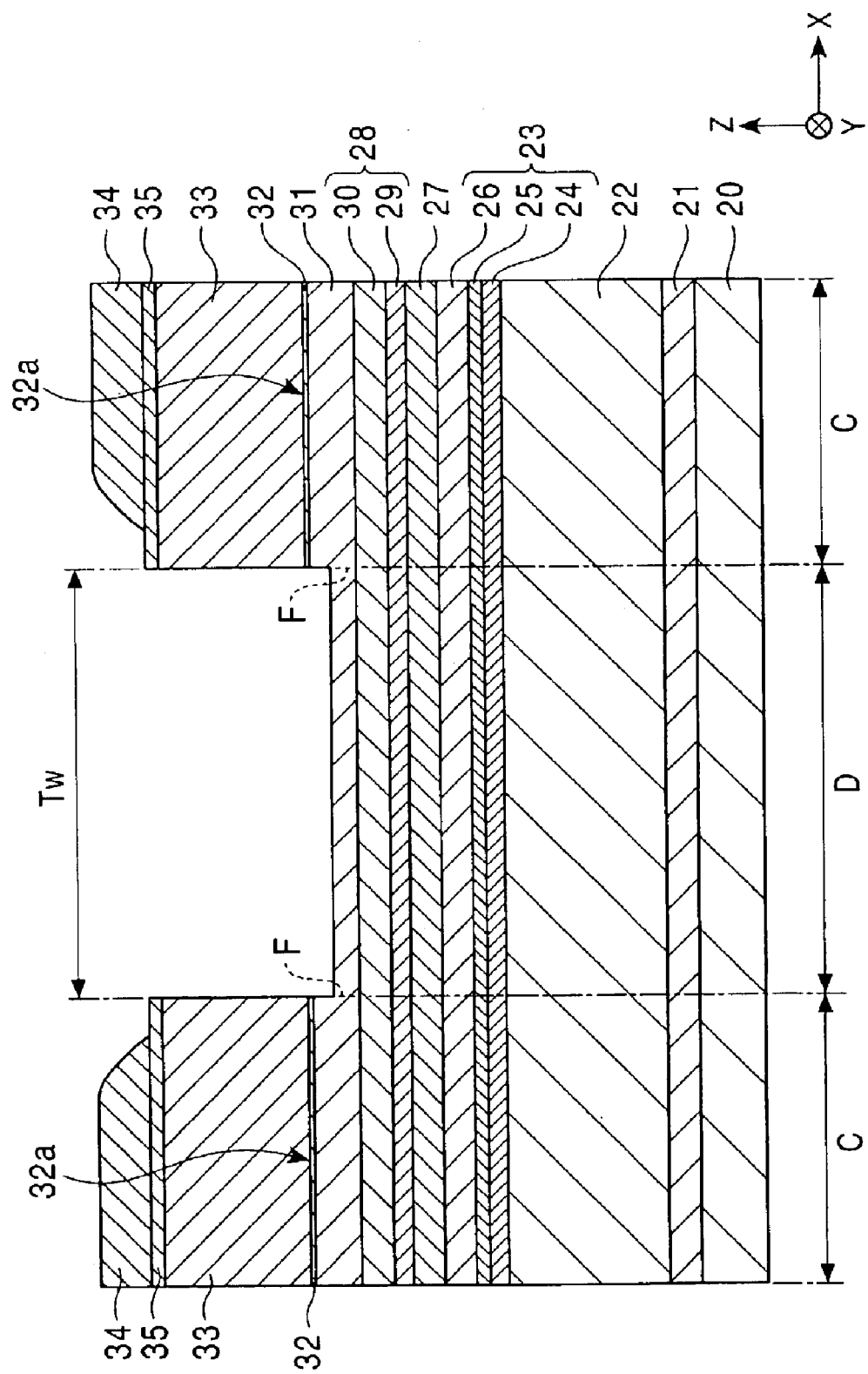
FIG. 6 is a partial cross-sectional view of a magnetic sensing element according to a sixth embodiment of the present invention viewed from the face opposing a recording medium.

The magnetic sensing elements shown in FIGS. 1 to 3 are manufactured by the same process whereas the magnetic sensing elements shown in FIGS. 4 to 6 (the fourth to six embodiments) are manufactured by a different process. The magnetic sensing elements shown in FIGS. 1 to 3 are similar in that the center portion 32b of the nonmagnetic layer 32 is disposed in the gap between the third antiferromagnetic layers 33. In contrast, the magnetic sensing elements shown in FIGS. 4 to 6 are similar in that the nonmagnetic layer 32 is provided between the third antiferromagnetic layers 33 and the two side portions C of the second antiferromagnetic layer 31.

The structures of magnetic sensing elements according to other embodiments manufactured by the same process as that of the fourth embodiment will now be described.

Fifth Embodiment

FIG. 5 is a partial cross-sectional view of a magnetic sensing element according to a fifth embodiment of the present invention viewed from the opposing face.

The magnetic sensing element of fifth embodiment differs from that of the fourth embodiment in that the third antiferromagnetic layer 33 is disposed on the center portion 32b of the nonmagnetic layer 32.

In this embodiment shown in FIG. 5, the two side portions C of the second antiferromagnetic layer 31 and the third antiferromagnetic layers 33 are separated from each other by the nonmagnetic layer 32 having a thickness of 0.2 to 3 Å therebetween and function as a single antiferromagnetic layer as a result of an antiferromagnetic interaction. The two side portions C of the second antiferromagnetic layer 31 exhibit antiferromagnetic properties. When field-annealed, the two side portions C of the second antiferromagnetic layer 31 transform into an ordered structure, and exchange coupling magnetic fields are generated between the second antiferromagnetic layer 31 and the free magnetic layer 28 at the two side portions C. The two side portions C of the free magnetic layer 28 is thereby firmly pinned in the track width direction (the X direction).

The thickness of the third antiferromagnetic layer 33 is smaller in the center portion D than in the two side portions C.

Thus, the sum of the thickness h2 of the second antiferromagnetic layer 31 the thickness h3 of the third antiferromagnetic layer 33 at the center portion D must be small. Otherwise, the second antiferromagnetic layer 31 exhibits antiferromagnetic properties by an antiferromagnetic interaction with then third antiferromagnetic layer 33, and ah exchange coupling magnetic field is generated between the second antiferromagnetic layer 31 and the free magnetic layer 28 at the center portion D, which is undesirable.

Thus, the sum of the thickness h2 and the thickness h3 is preferably in the range of 5 to 50 Å, more preferably 10 to 50 Å, and most preferably 30 to 40 Å.

At such a thickness, the center portion D of the second antiferromagnetic layer 31 rarely transforms into an ordered structure by field annealing, and the antiferromagnetic interaction rarely occurs between the second antiferromagnetic layer 31 and the third antiferromagnetic layer 33. Thus, the second antiferromagnetic layer 31 does not exhibit antiferromagnetic properties. The exchange coupling magnetic field generated between the second antiferromagnetic layer 31 and the free magnetic layer 28 at the center portion D is small, if any. The magnetization direction in the center portion D of the free magnetic layer 28 is prevented from being pinned as firmly as the magnetization directions in the two side portions C.

In the embodiment shown in FIG. 5, the center portion D of the free magnetic layer 28 is moderately put in a single-magnetic-domain state so that the magnetization direction can rotate in response to external magnetic fields. This magnetic sensing element has superior sensitivity that can meet the demand for narrow tracks.

When the nonmagnetic layer 32 is composed of Cr, the exchange coupling magnetic fields (Hex) between the second antiferromagnetic layer 31 and the free magnetic layer 28 become larger than that with the nonmagnetic layer 32 composed of at least one of Ru, Re, Pd, Os, Ir, Pt, Au, and Rh.

Accordingly, in the magnetic sensing element of this embodiment, the magnetization of the two side portions C of the free magnetic layer 28 can be firmly pinned with the two side portions C of the second antiferromagnetic layer 31. Thus, side reading can be reduced.

Preferably, the noble metal layer 90 is disposed between the nonmagnetic layer 32 and the second antiferromagnetic layer 31.

When the nonmagnetic layer 32 is deposited directly on the second antiferromagnetic layer 31, transformation of the second antiferromagnetic layer 31 into an ordered structure occurs even though the thickness of the second antiferromagnetic layer 31 is small. As a result, the exchange coupling magnetic field between the second antiferromagnetic layer 31 and the free magnetic layer 28 at the center portion readily increases, and the amount of change in the magnetization direction in response to external magnetic fields readily decreases. By providing the noble metal layer 90 between the nonmagnetic layer 32 and the second antiferromagnetic layer 31, the tendency of the second antiferromagnetic layer 31 toward transformation into ordered structures can be adequately controlled. Accordingly, a decrease in the rate of change in magnetic resistance can be prevented.

The noble metal layer 90 is composed of at least one element selected from the group consisting of Ru, Re, Pd, Os, Ir, Pt, Au, and Rh.

Sixth Embodiment

FIG. 6 is a partial cross-sectional view of a magnetic sensing element according to a sixth embodiment of the present invention viewed from the opposing face.

The magnetic sensing element shown in FIG. 6 differs from that shown in FIG. 4 in that no nonmagnetic layer 32 is provided in the gap between the third antiferromagnetic layers 33 and that part of the second antiferromagnetic layer 31 is removed.

In the embodiment shown in FIG. 6, the nonmagnetic layer 32 composed of Cr having a thickness of 0.2 to 3 Å is formed on the third antiferromagnetic layer 33 at each of the two side portions C, and the third antiferromagnetic layer 33 is formed on each nonmagnetic layer 32. The sum of the thickness of the third antiferromagnetic layer 33 and the second antiferromagnetic layer 31 at each of the two side portions C is preferably large, namely, 80 to 300 Å.

According to this structure, an antiferromagnetic interaction occurs between the two side portions C of the second antiferromagnetic layer 31 and the third antiferromagnetic layers 33 through the nonmagnetic layers 32. The two side portions C of the second antiferromagnetic layer 31 and the third antiferromagnetic layer 33 functions as a single antiferromagnetic layer, and the two side portions C of the second antiferromagnetic layer 31 thus exhibit antiferromagnetic properties. The two side portions C of the second antiferromagnetic layer 31 transform into an ordered structure by field annealing, and exchange coupling magnetic fields are generated between the second antiferromagnetic layer 31 and the free magnetic layer 28 at the two side portions C. As a result, the two side portions C of the free magnetic layer 28 is firmly pinned in the track width direction (the X direction).

The thickness of the second antiferromagnetic layer 31 at the center portion D is small, namely, 5 to 50 Å. At such a small thickness, the center portion D of the second antiferromagnetic layer 31 does not exhibit antiferromagnetic properties and does not transform into an ordered structure by field annealing. The exchange coupling magnetic field between the second antiferromagnetic layer 31 and the free magnetic layer 28 at the center portion D is small, if any. Accordingly, the center portion D of the free magnetic layer 28 is moderately put to a single-magnetic-domain state so that the magnetization direction of the center portion D can rotate in response to external magnetic fields. Thus, a magnetic sensing element having superior sensitivity that can meet the demand for narrower tracks can be obtained.

Alternatively, the center portion D of the second antiferromagnetic layer 31 may be completely removed, as indicated by broken lines F in FIG. 6 so as to expose the center portion D of the free magnetic layer 28. In this manner, however, the exposed center portion D of the free magnetic layer 28 is likely to suffer damage inflicted by ion milling or reactive ion etching (RIE). It is preferable to leave some of the second antiferromagnetic layer 31 on the center portion D of the free magnetic layer 28.

In the embodiment shown in FIG. 6, the center portion D of the second antiferromagnetic layer 31 is removed by ion milling. Damage inflicted by ion milling on the center portion D of the second antiferromagnetic layer 31 may degrade the magnetic characteristics. However, the center portion D of the second antiferromagnetic layer 31 is sufficiently thin so as not to exhibit antiferromagnetic properties and thus does not magnetically influence layers such as free magnetic layer 28. Damage on the center portion D of the second antiferromagnetic layer 31 by ion milling is not likely to significantly affect the read characteristics.

When the nonmagnetic layer 32 is composed of Cr, the exchange coupling magnetic fields (Hex) between the second antiferromagnetic layer 31 and the free magnetic layer 28 at side portions C can become larger than that with the nonmagnetic layer 32 composed of at least one of Ru, Re, Pd, Os, Ir, Pt, Au, and Rh.

Accordingly, in the magnetic sensing element of this embodiment, the magnetization of the two side portions C of the free magnetic layer 28 can be firmly pinned with the two side portions C of the second antiferromagnetic layer 31. Thus, side reading can be reduced.

In the above-described fourth to sixth embodiments shown in FIGS. 4 to 6, instead of providing a separate nonmagnetic layer 32, chromium atoms may be diffused into the second antiferromagnetic layer 31. In such a case, the concentration of Cr atoms preferably increases toward the upper face of the second antiferromagnetic layer 31.

In the magnetic sensing elements according to the first to sixth embodiments shown in FIGS. 1 to 6, the electrode layer 34 is disposed on the third antiferromagnetic layer 33 disposed on each of two sides of the composite comprising layers from the substrate 20 to the second antiferromagnetic layer 31. According to this structure, an electric current flows in the composite in a direction parallel to the surfaces of layers constituting the composite (a current-in-the-plane (CIP) magnetic sensing element).

Seventh Embodiment

Figure 7:
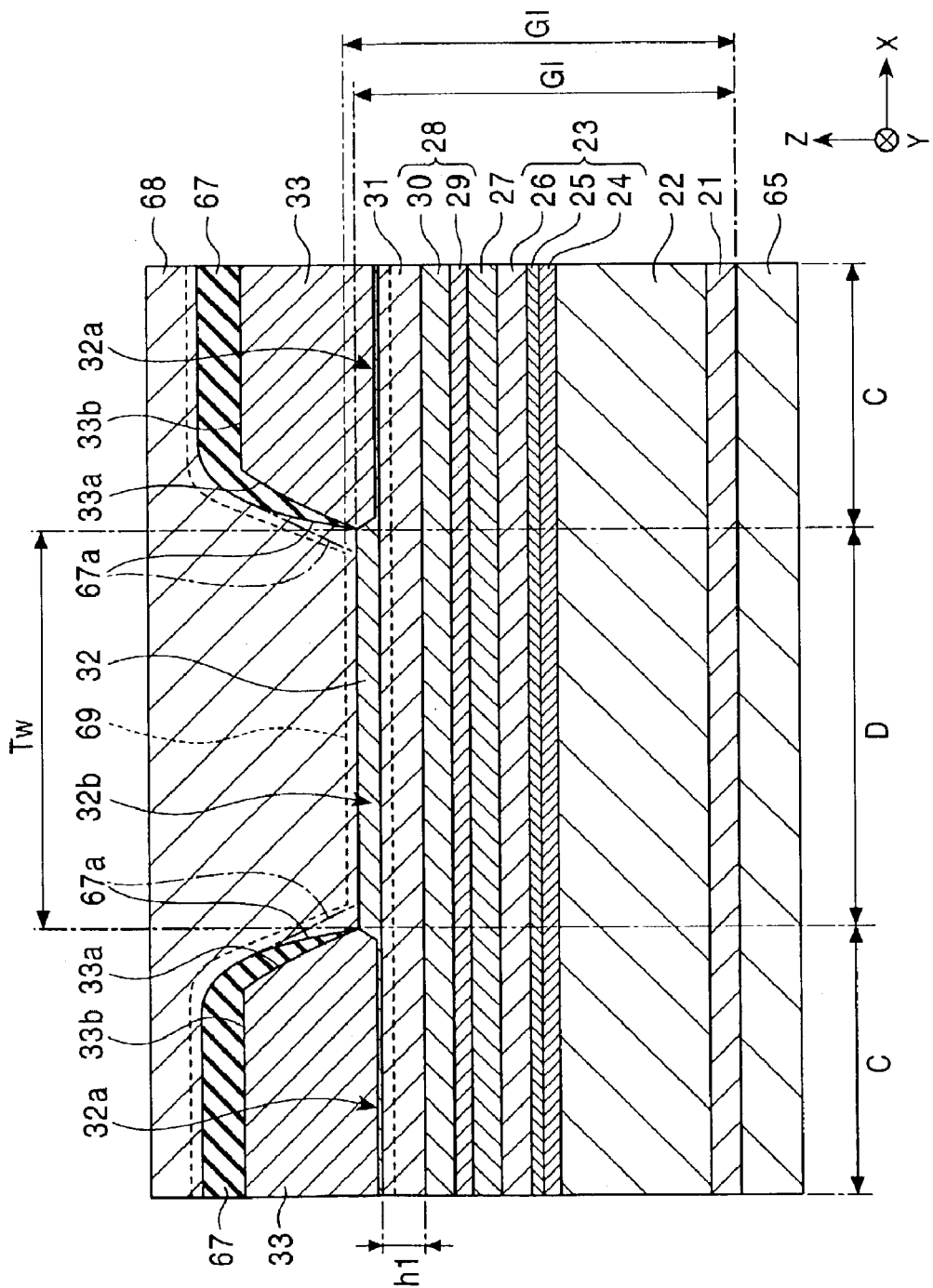
FIG. 7 is a partial cross-sectional view of a magnetic sensing element according to a seventh embodiment of the present invention viewed from the face opposing a recording medium.

FIG. 7 is a partial cross-sectional view of a magnetic sensing element according to a seventh embodiment of the present invention.

As shown in FIG. 7, the magnetic sensing element has a lower shield layer 65 and an upper shield layer 68 at the bottom and the top, respectively, of the composite film that includes layers from the seed layer 21 to the second antiferromagnetic layer 31. The shield layers 65 and 68 also function as electrode layers. An electric current flows in the composite film between the shield layers 65 and 68 in a direction perpendicular to the surfaces of the layers of the composite film (current-perpendicular-to-the-plane (CPP) magnetic sensing element). The present invention is applicable to CPP magnetic sensing elements.

The layer structure of the composite film is the same as that of the first embodiment. The description is omitted to avoid redundancy. Note that the seed layer 21 shown in FIG. 7 may be omitted.

As shown in FIG. 7, the lower shield layer 65 that functions as the lower electrode is disposed under the seed layer 21. The lower shield layer 65 is made by plating a magnetic material such as permalloy (NiFe).

The third antiferromagnetic layer 33 is formed on each of the two side portions C of the composite film with the nonmagnetic layer 32 therebetween. An insulating layer 67 is formed over the upper face 33b and the end 33a.

Referring again to FIG. 7, the upper shield layer 68 that also functions as the upper electrode is disposed over the insulating layer 67 and the center portion 32b of the nonmagnetic layer 32.

According to this structure the electric current flows in the composite film in a direction parallel to the surfaces of the layers of the composite film.

Since the upper faces 33b and the ends 33a of the third antiferromagnetic layer 33 are covered with the insulating layers 67, the electric current flowing from the upper shield layer 68 into the composite film does not shunt to the third antiferromagnetic layers 33. Thus, the structure shown in FIG. 7 prevents the current path from deviating outside the track width Tw. A CPP magnetic sensing element having a large output can be obtained.

Ends 67a of the insulating layers 67 preferably cover the two sides of the center portion 32b of the nonmagnetic layer 32, as indicated by a dotted chain line in FIG. 7. According to this structure, the electric current can be prevented from shunting into the third antiferromagnetic layers 33.

A nonmagnetic layer 69 indicated by a broken line in FIG. 7 may be provided over the insulating layer 67 and the center portion 32b of the nonmagnetic layer 32, if necessary. The nonmagnetic layer 69 is preferably composed of a nonmagnetic conductive material such as Ta, Ru, Rh, Ir, Cr, Re, or Cu. The nonmagnetic layer 69 functions as an upper gap layer. Since the nonmagnetic layer 69 is disposed on the surface of the center portion D of the composite film, which is the entrance and exit of the electric current, an insulating material that inhibits the current from flowing into the sensing element is not preferred. The nonmagnetic layer 69 is preferably made of a nonmagnetic conductive material.

In this embodiment, the nonmagnetic material layer 27 shown in FIG. 7 may be made of a nonmagnetic conductive material so as to make a CPP spin-valve GMR head. Alternatively, the nonmagnetic material layer 27 may be made of an insulating material such as $Al_2O_3$ or $SiO_2$ so as to make a CPP spin-valve tunneling magnetoresistive (TMR) head.

A tunneling magnetoresistive element utilized a spin tunneling effect to generate changes in resistance. When the magnetization directions of the pinned magnetic layer 23 and the free magnetic layer 28 are antiparallel to each other, tunneling current is prevented from flowing through the nonmagnetic material layer 27, thereby giving the maximum resistance. When the magnetization directions of the pinned magnetic layer 23 and the free magnetic layer 28 are parallel to each other, the tunneling current flows easily, thereby giving the minimum resistance.

Based on this principle, as the magnetization direction of the free magnetic layer 28 changes in response to an external magnetic field, a change in electrical resistance is detected as a change in voltage (constant current operation) or as a change in current (constant voltage operation) so as to detect the leakage magnetic field from a recording medium.

Eighth and Ninth Embodiments

Figure 8:
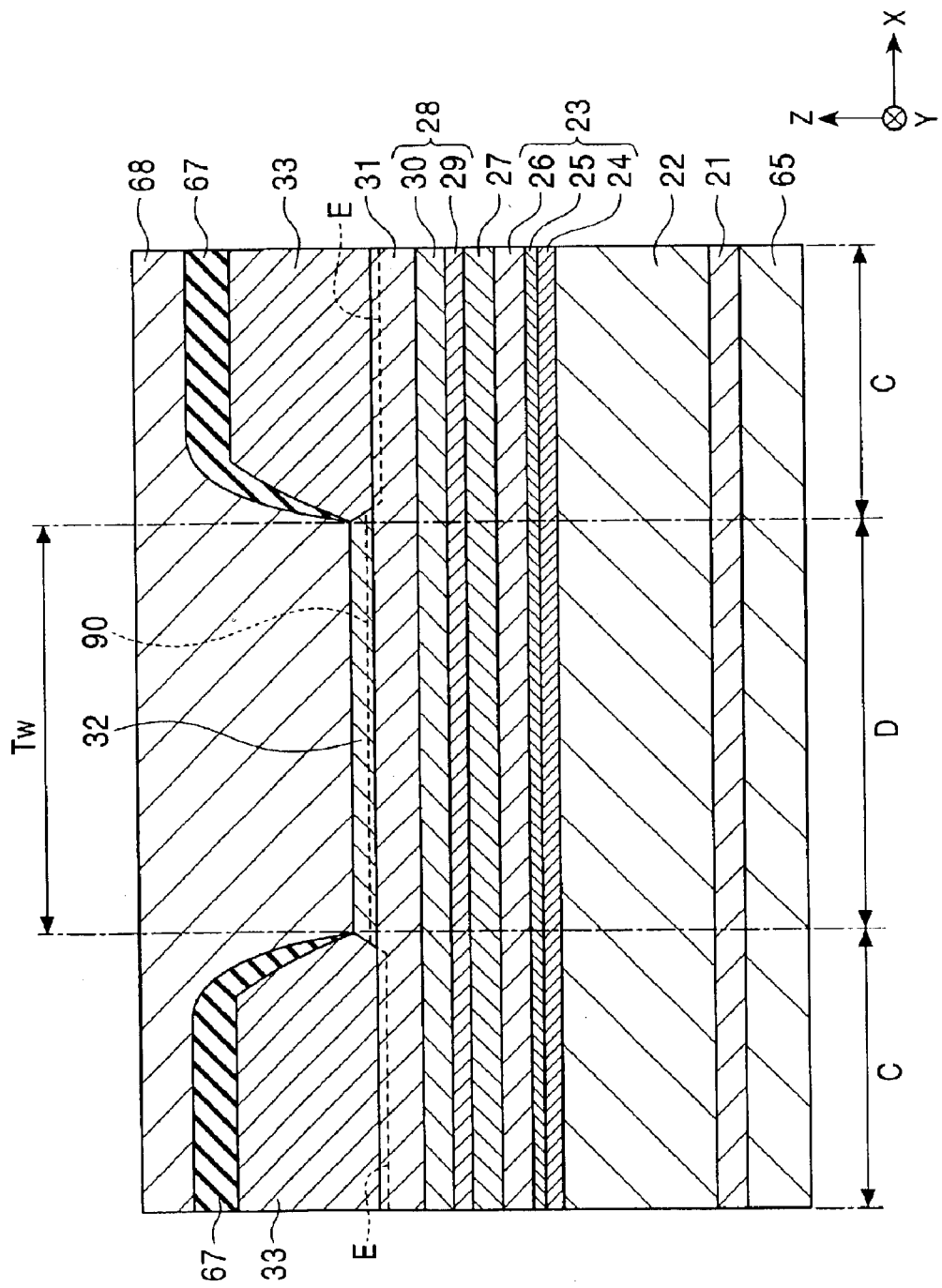
FIG. 8 is a partial cross-sectional view of a magnetic sensing element according to an eighth embodiment of the present invention viewed from the face opposing a recording medium.
Figure 9:
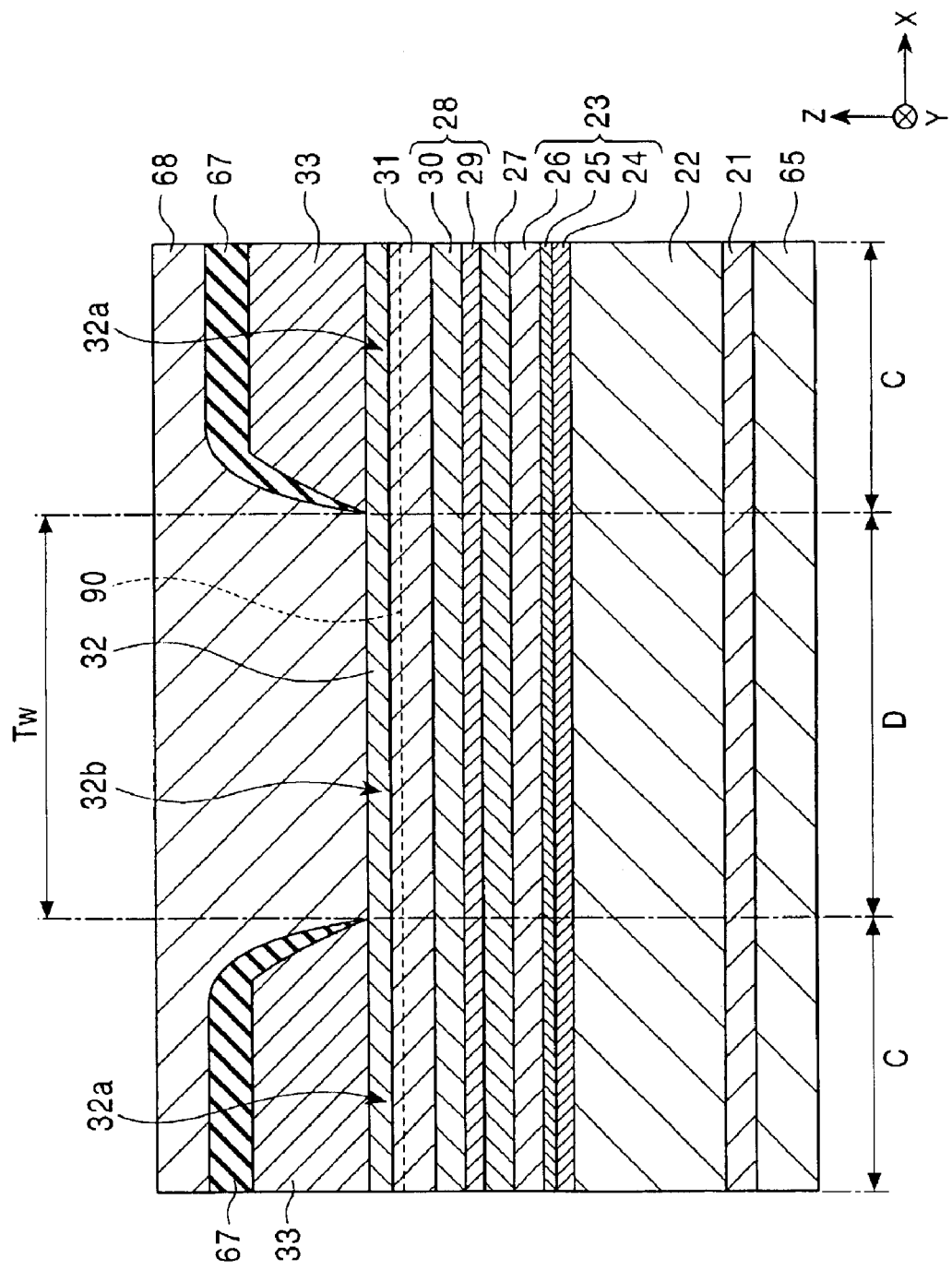
FIG. 9 is a partial cross-sectional view of a magnetic sensing element according to a ninth embodiment of the present invention viewed from the face opposing a recording medium.

FIG. 8 shows a magnetic sensing element according to an eighth embodiment of the present invention. The magnetic sensing element is of a CPP type combining the magnetic sensing element shown in FIG. 2 and the magnetic sensing element shown in FIG. 7. FIG. 9 shows a magnetic sensing element according to a ninth embodiment of the present invention. The magnetic sensing element of this embodiment is of a CPP type combining the magnetic sensing element shown in FIG. 3 and the magnetic sensing element shown in FIG. 7.

Tenth Embodiment

Figure 10:
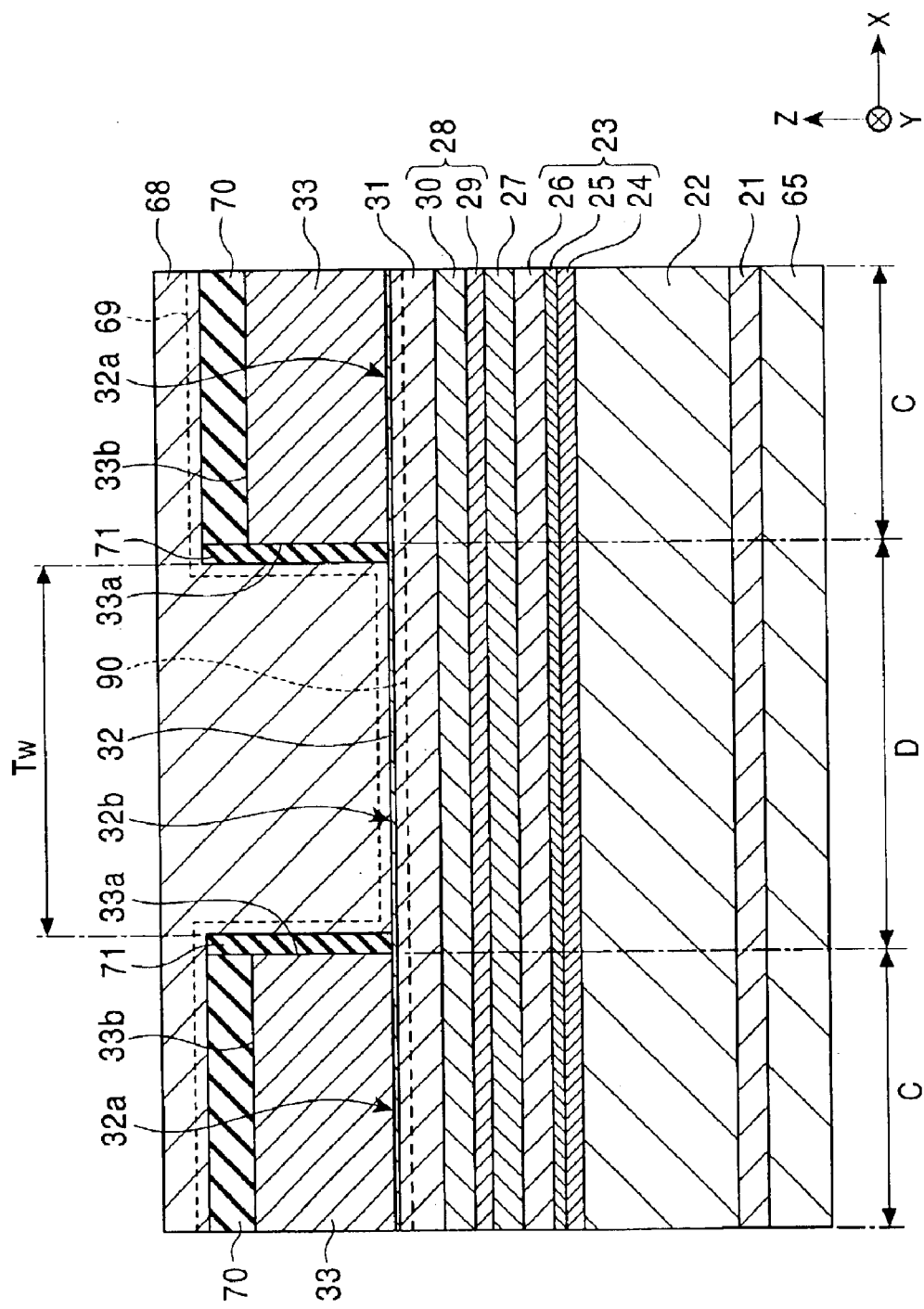
FIG. 10 is a partial cross-sectional view of a magnetic sensing element according to a tenth embodiment of the present invention viewed from the face opposing a recording medium.

FIG. 10 shows a magnetic sensing element according to a tenth embodiment of the present invention. The magnetic sensing element is of a CPP type combining the magnetic sensing element shown in FIG. 4 and the magnetic sensing element shown in FIG. 7. The magnetic sensing element shown in FIG. 10 differs from that shown in FIG. 7 in that first insulating layer 70 is formed on each upper face 33b of the third antiferromagnetic layer 33 and that a separate second insulating layer 71 is formed on each end 33a of the third antiferromagnetic layer 33. These differences are derived from differences in fabrication methods.

The first insulating layer 70 and the second insulating layer 71 have the same function as that of the insulating layer 67 shown in FIG. 7. The first and second insulating layers 70 and 71 properly prevents an electric current flowing in the composite film from shunting into the third antiferromagnetic layers 33 from the upper shield layer 68.

The first and second insulating layers 70 and 71 are composed of an insulating material such as $Al_2O_3$, $SiO_2$, AlN, Al—Si—O—N, Al—Si—O, $Ti_2O_3$, $Ti_3O_5$, or $Ta_2O_5$.

In the embodiment shown in FIG. 10, the end 33a of the third antiferromagnetic layer 33 is perpendicular with respect to the track width direction (the X direction). Alternatively, the gap between the third antiferromagnetic layers 33 may be arranged to gradually increase along the Z direction. In such a case each end 33a may be formed as a flat or curved slope.

When the ends 33a are formed as flat or curved slopes, it is relatively easy to deposit the second insulating layers 71 to a proper thickness on the ends 33a. Thus, shunt loss can be decreased.

As shown in FIG. 10, the upper face 33b and the ends 33a of the third antiferromagnetic layer 33 are covered with the first and second insulating layers 70 and 71. According to this structure, an electric current flowing in the composite film does not shunt into the third antiferromagnetic layers 33 and flows within the track width Tw determined by the gap between the second insulating layers 71. The magnetic sensing element shown in FIG. 10 can thus exhibit large output.

The nonmagnetic layer 69 may be provided over the first and second insulating layers 70 and 71 and the center portion D of the composite film, as indicated by a broken line in FIG. 10. The nonmagnetic layer 69 is preferably composed of a nonmagnetic conductive material such as Ta, Ru, Rh, Ir, Cr, Re, or Cu. The nonmagnetic layer 69 functions as an upper gap layer. Since the nonmagnetic layer 69 is disposed on the surface of the center portion D of the composite film, which is the entrance and exit of the electric current, an insulating material that inhibits the current from flowing into the sensing element is not preferred. The nonmagnetic layer 69 is preferably made of a nonmagnetic conductive material.

In this embodiment shown in FIG. 10, the nonmagnetic material layer 27 may be made of a nonmagnetic conductive material so as to make a CPP spin-valve GMR head. Alternatively, the nonmagnetic material layer 27 may be made of an insulating material such as $Al_2O_3$ or $SiO_2$ so as to make a CPP spin-valve tunneling magnetoresistive (TMR) head.

Eleventh and Twelfth Embodiments

Figure 11:
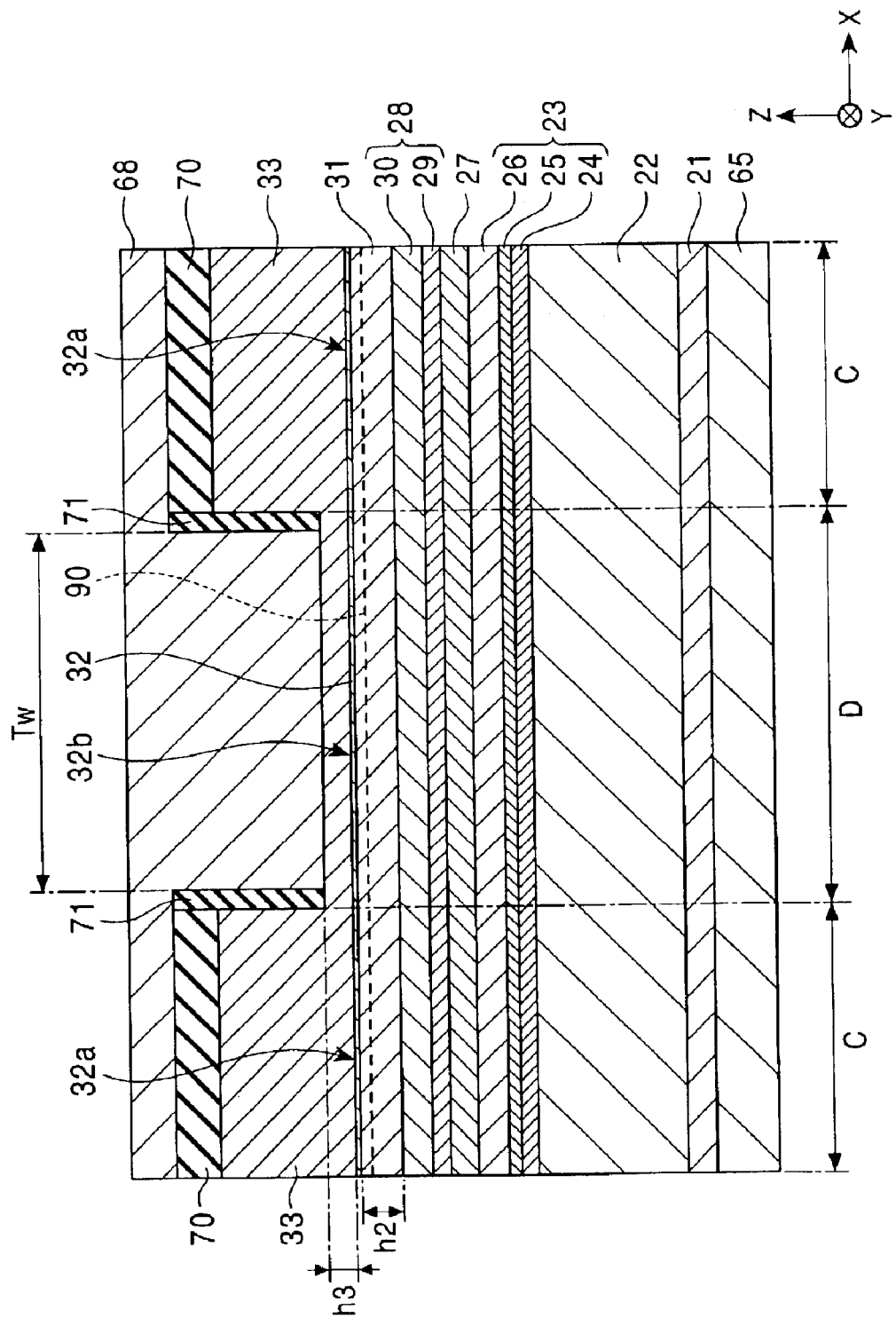
FIG. 11 is a partial cross-sectional view of a magnetic sensing element according to an eleventh embodiment of the present invention viewed from the face opposing a recording medium.
Figure 12:
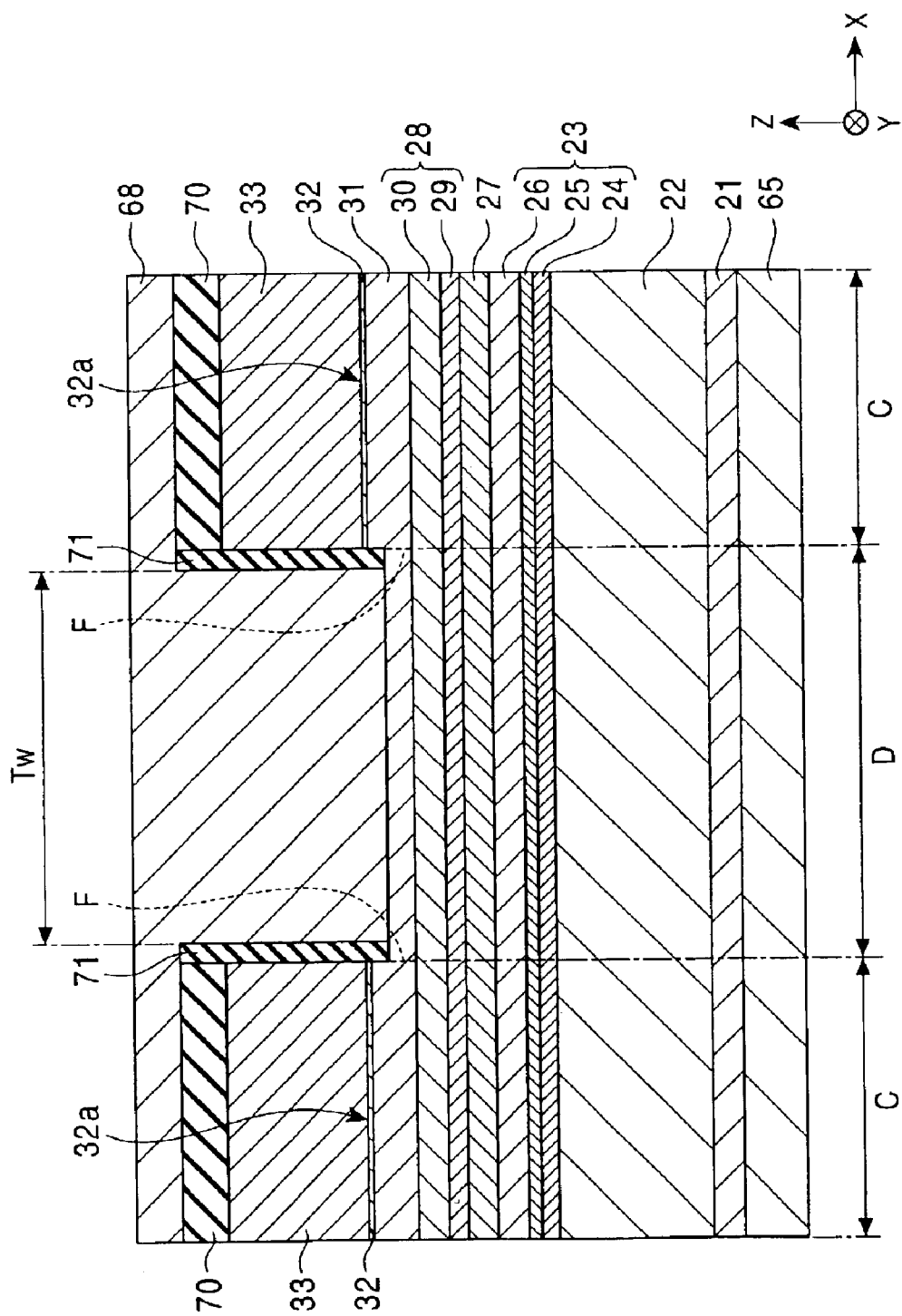
FIG. 12 is a partial cross-sectional view of a magnetic sensing element according to a twelfth embodiment of the present invention viewed from the face opposing a recording medium.

FIG. 11 shows a CPP magnetic sensing element according to a eleventh embodiment of the present invention combining the magnetic sensing element shown in FIG. 5 and the magnetic sensing element shown in FIG. 10. FIG. 12 shows a CPP magnetic sensing element according to a twelfth embodiment of the present invention combining the magnetic sensing element shown in FIG. 6 and the magnetic sensing element shown in FIG. 10.

Thirteenth and Fourteenth Embodiments

Figure 13:
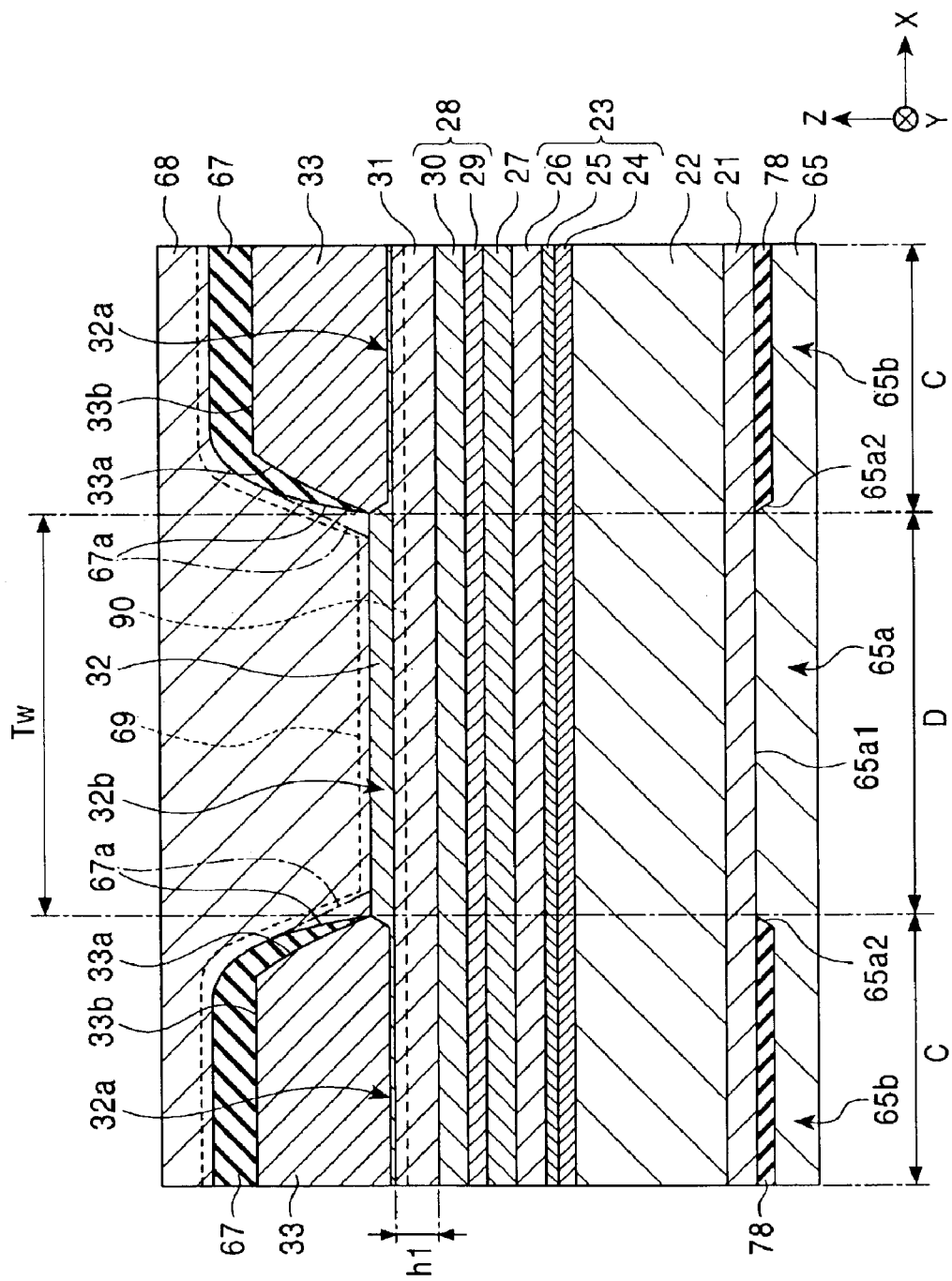
FIG. 13 is a partial cross-sectional view of a magnetic sensing element according to a thirteenth embodiment of the present invention viewed from the face opposing a recording medium.
Figure 14:
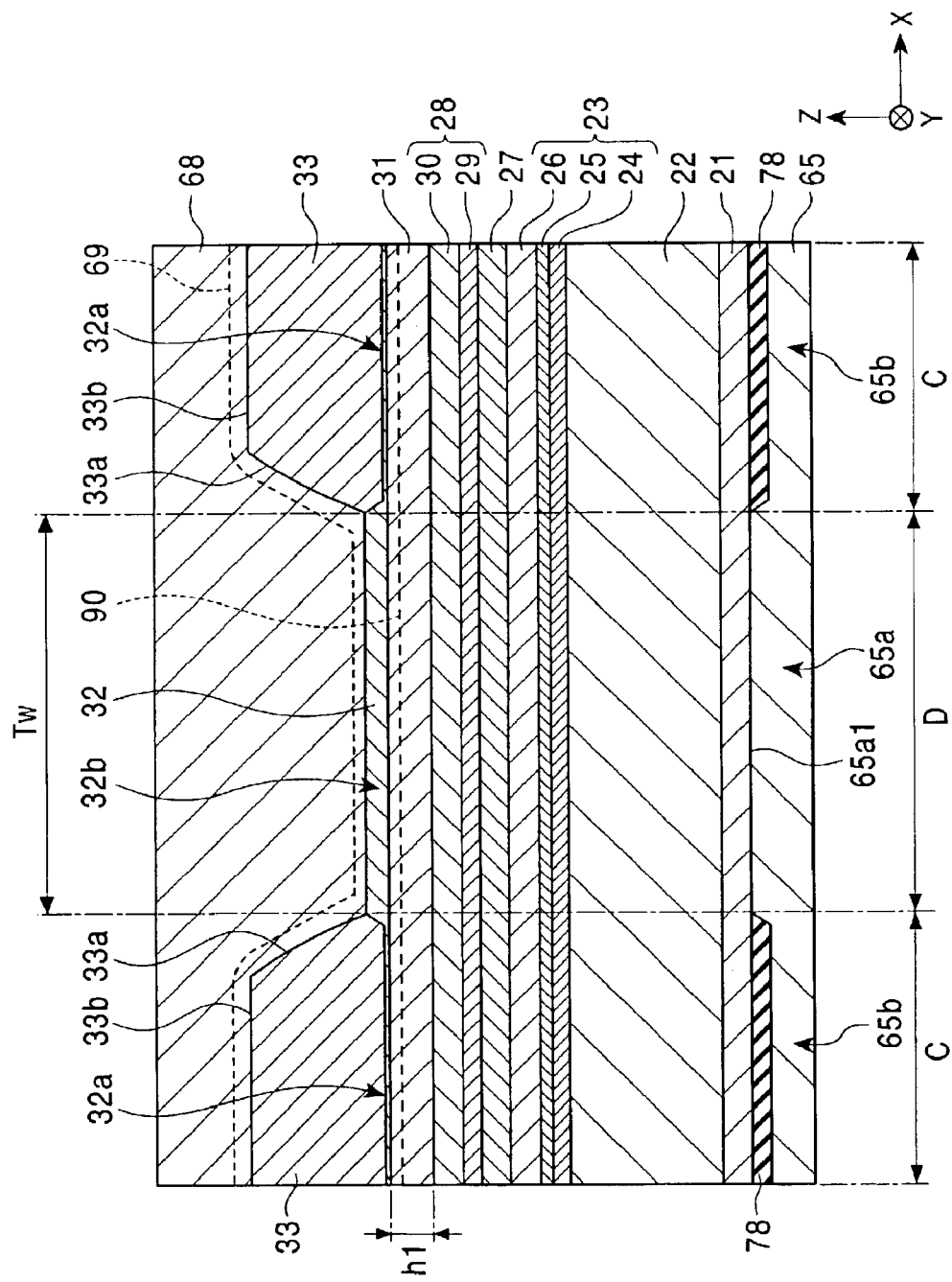
FIG. 14 is a partial cross-sectional view of a magnetic sensing element according to a fourteenth embodiment of the present invention viewed from the face opposing a recording medium.

Magnetic sensing elements according to the thirteenth and fourteenth embodiments of the present invention shown in FIGS. 13 and 14 are the same as those shown in FIGS. 7 and 12 in that they are of a CPP type but differ in the shape of the lower shield layer 65.

Referring now to FIG. 13, the lower shield layer 65, which also functions as the lower electrode, of the magnetic sensing element according of the thirteenth embodiment has a protrusion 65a at the center portion D in the track width direction (the X direction). The protrusion 65a projects toward the composite film in the Z direction. An upper face 65a1 of the protrusion 65a is in contact with the lower face of the seed layer 21. In this structure, an electric current flows into the composite film via the protrusion 65a (or an electric current flows from the composite film to the protrusion 65a).

In the thirteenth embodiment shown in FIG. 13, an insulating layer 78 is formed on each of two side portions 65b of the lower shield layer 65 in the track width direction and between the side portion 65b and the seed layer 21. The insulating layer 78 is composed of an insulating material such as $Al_2O_3$, $SiO_2$, AlN, Al—Si—O—N, Al—Si—O, $Ti_2O_3$, $Ti_3O_5$, or $Ta_2O_5$.

In the embodiment shown in FIG. 13, the current path is narrowed by the protrusion 65a of the lower shield layer 65. Since the insulating layers 78 are provided between the composite film and the two side portions 65b of the lower shield layer 65, the electric current flowing in the composite film is prevented from shunting through the two side portions 65b. As a result, the magnetic sensing element exhibits large output with narrower effective track width.

In the embodiment shown in FIG. 13, the length of the upper face 65a1 of the protrusion 65a of the lower shield layer 65 in the track width direction (the X direction) is the same as that of the center portion D in the track width direction (the X direction). Alternatively, the length of the upper face 65a1 in the track width direction may be larger than that of the center portion D. Most preferably, the length of the upper face 65a1 in the track width direction is the same as that of the track width Tw. In this manner, an electric current can be effectively supplied to the magnetic sensing element only in the side portion. Thus, the magnetic sensing element exhibits a large output.

As shown in FIG. 13, two side faces 65a2 of the protrusion 65a are formed as flat or curved slopes so that the length of the protrusion 65a in the track width direction gradually increases along the direction opposite to the Z direction. Alternatively, the two side faces 65a2 may be perpendicular to the track width direction (the X direction).

The magnetic sensing element of the fourteenth embodiment shown in FIG. 14 also has the lower shield layer 65 having the same shape as in the thirteenth embodiment shown in FIG. 13. Since the arrangement of the upper face 65a1, the seed layer 21, and the insulating layers 78 are the same as in the thirteenth embodiment, the description thereof is omitted to avoid redundancy.

The fourteenth embodiment differs from the thirteenth embodiment in that no insulating layer 67 is provided on the upper face 33b and the ends 33a of the third antiferromagnetic layer 33. Moreover, the upper shield layer 68, which also functions as the upper electrode, is in direct contact with the center portion D of the composite film and the third antiferromagnetic layers 33.

In the embodiment shown in FIG. 14, the upper shield layer 68 is not insulated from the third antiferromagnetic layers 33. Thus, the current path tends to broaden beyond the track width Tw, and the output may be degraded as a result. However, since the protrusion 65a of the lower shield layer 65 narrows the current path at the bottom face of the magnetic sensing element, the broadening of the current path can be inhibited, and a decrease in output can be avoided.

Preferably, the upper face 65a1 of the protrusion 65a formed in the lower shield layer 65 is flush with the upper faces of the insulating layers 78 disposed at the sides. In this manner, layers of the composite film can be formed parallel to each other in the track width direction, and a magnetic sensing element having superior read characteristics can be made.

Note that the thirteenth and fourteenth embodiments shown in FIGS. 13 and 14 may be applied to a CPP magnetic sensing element shown in FIGS. 8 to 12.

The CPP magnetic sensing elements shown in FIGS. 7 to 14 have the lower and upper shield layers (electrodes) 65 and 68 in contact with the bottom and the top of the composite film, respectively, so that no separate electrode layers are necessary. Thus, the process for making CPP magnetic sensing elements can be simplified.

Moreover, when the shield layers also function as electrodes, the gap length G1 between shield layers can be decreased (refer to FIG. 7). Note when the nonmagnetic layer 69 is provided, the gap length G1 also determined by the thickness of the nonmagnetic layer 69. Accordingly, a magnetic sensing element that can meet the trend for higher recording density can be obtained.

The application of the present invention is not limited to the embodiments shown in FIGS. 7 to 14. An electrode layer composed of Au, W, Cr, Ta, or the like may be provided at the bottom and/or the top of the composite film, and a shield layer composed of magnetic material may be disposed on the surface of the electrode layer remote from the magnetic sensing element.

The free magnetic layer 28 of the present invention will now be described.

The free magnetic layer 28 shown in each of the first to fourteenth embodiments shown in FIGS. 1 to 14 has a two-layer structure comprising the anti-diffusion sublayer 29 and the magnetic material sublayer 30. The anti-diffusion sublayer 29 is composed of Co, CoFe, or the like and prevents interdiffusion between the free magnetic layer 28 and the nonmagnetic material layer 27. The magnetic material sublayer 30 is disposed on the anti-diffusion sublayer 29 and is composed of a magnetic material such as a NiFe alloy.

Alternatively, the free magnetic layer 28 may be of a single layer structure composed of a magnetic material such as a NiFe alloy, a CoFe alloy, a CoFeNi alloy, elemental Co, or a CoNi alloy. Preferably, the free magnetic layer is composed of a CoFeNi alloy.

Figure 15:
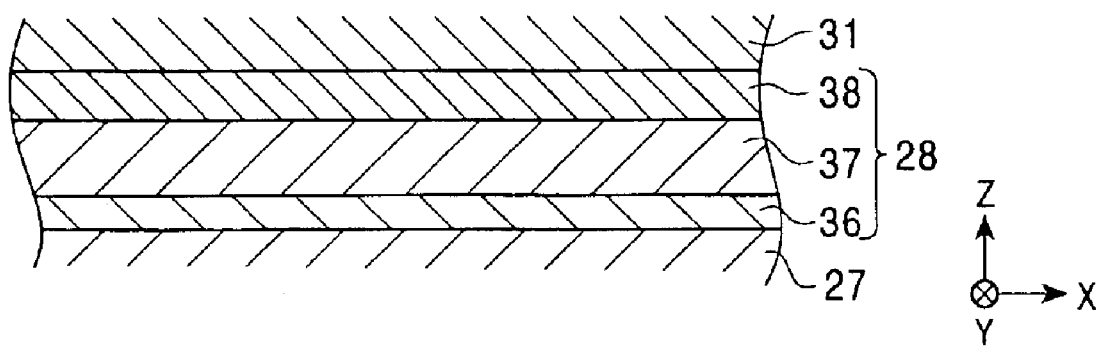
FIG. 15 is a partial enlarged cross-sectional view of an example of the free magnetic layer viewed from the face opposing a recording medium.

FIG. 15 is an enlarged partial cross-sectional view of an example of the free magnetic layer 28 according to the present invention viewed from the opposing face.

In FIG. 15, the free magnetic layer 28 has a three-layer structure comprising a magnetic material sublayers 36 to 38. The magnetic material sublayer 36 is an anti-diffusion sublayer for preventing the diffusion of atoms into the nonmagnetic material layer 27. The magnetic material sublayer 36 is composed of CoFe, Co, or the like.

The magnetic material sublayer 38 is in contact with the second antiferromagnetic layer 31. The magnetic material sublayer 38 is preferably made of a CoFe alloy so that the magnitude of the exchange coupling magnetic field generated between the magnetic material sublayer 38 and the second antiferromagnetic layer 31 can be increased.

An example of the materials for the three-layer structure is magnetic material sublayer 36: CoFe/magnetic material sublayer 37: NiFe/magnetic material sublayer 38: CoFe.

The thickness of the free magnetic layer 28 composed of only a magnetic material is preferably approximately 30 to 40 Å. An example of the composition of a CoFe alloy used in the free magnetic layer 28 is Co: 90 at % and Fe: 10 at %.

Figure 16:
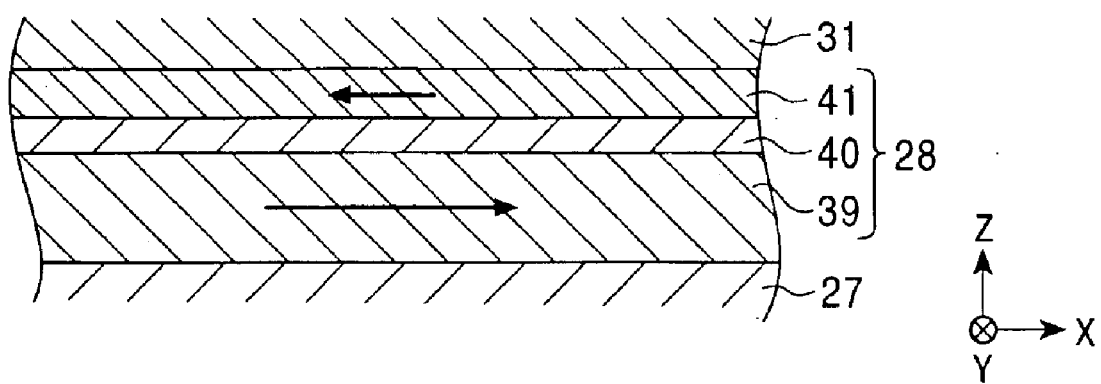
FIG. 16 is a partial enlarged cross-sectional view of another example of the free magnetic layer viewed from the face opposing a recording medium.

FIG. 16 is an enlarged partial cross sectional view of another example of the free magnetic layer 28. The free magnetic layer 28 shown in FIG. 16 has a so-called synthetic ferrimagnetic structure. With this structure, the effective magnetic thickness of the free magnetic layer 28 can be decreased without significantly decreasing the physical thickness of the free magnetic layer 28. Thus, the sensitivity toward external magnetic fields can be enhanced.

Referring to FIG. 16, the free magnetic layer 28 is constituted from magnetic sublayers 39 and 41 and a nonmagnetic interlayer 40. The magnetic sublayers 39 and 41 are composed of a magnetic material such as a NiFe alloy, a CoFe alloy, a CoFeNi alloy, elemental Co, or a CoNi alloy. Preferably, at least one of the magnetic sublayers 39 and 41 is composed of a CoFeNi alloy. The CoFeNi alloy preferably contains 9 to 17 at % of Fe, 0.5 to 10 at % of Ni, and the balance being Co.

In this manner, the coupling magnetic field resulting from a Ruderman-Kittel-Kasuya-Yosida (RKKY) interaction can be increased. In particular, the spin-flop magnetic field (Hsf) can be increased to approximately at least 293 kA/m. As a result, the magnetization directions of the magnetic sublayers 39 and 41 can be properly oriented antiparallel to each other. Moreover, by using the CoFeNi alloy satisfying the above-described composition ranges, the magnetostriction of the free magnetic layer 28 can be adjusted within the range of $-3 \times 10^{-6}$ to $3 \times 10^{-6}$, and the coercive force can be reduced to 790 A/m or less. Moreover, the soft magnetic characteristics of the free magnetic layer 28 can be improved, and a decrease in amount of change in resistance ($\Delta R$) and in rate of change in resistance ($\Delta R/R$) due to diffusion of Ni atoms between the free magnetic layer 28 and the nonmagnetic material layer 27 can be avoided.

The nonmagnetic interlayer 40 is preferably made of at least one selected from the group consisting of Ru, Rh, Ir, Cr, Re, and Cu.

The thickness of the magnetic sublayer 39 is, for example, approximately 35 Å. The thickness of the nonmagnetic interlayer 40 is, for example, approximately 9 Å. The thickness of the magnetic sublayer 41 is, for example, approximately 15 Å.

Fifteenth Embodiment

Figure 19:
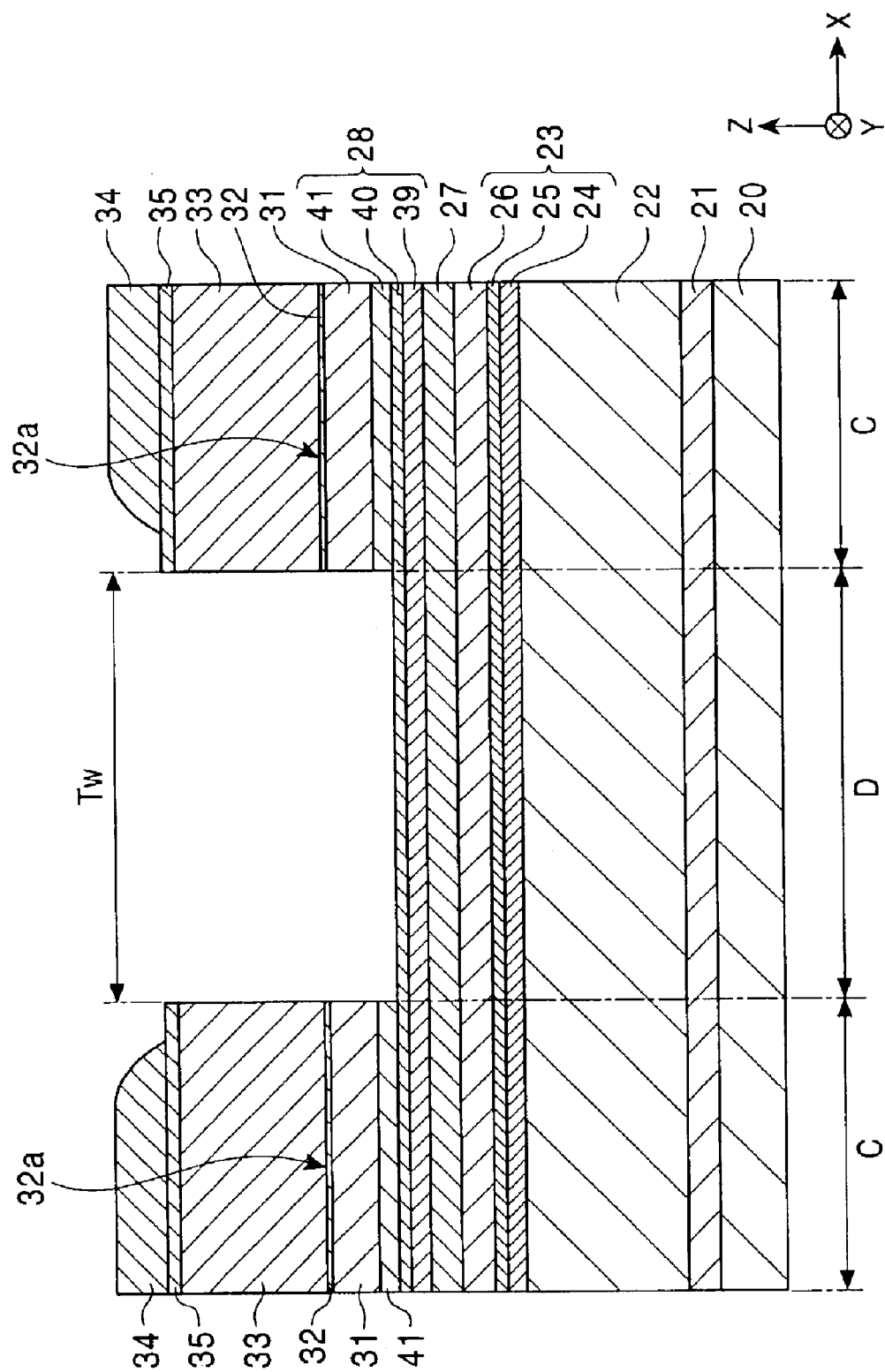
FIG. 19 is a partial cross-sectional view of a magnetic sensing element according to a fifteenth embodiment of the present invention viewed from the face opposing a recording medium.

A magnetic sensing element having the free magnetic layer 28 of a synthetic ferromagnetic structure is illustrated in FIG. 19 (a fifteenth embodiment). As shown in FIG. 19, the layers from the magnetic sublayer 41 and above are completely removed at the center portion D, and the nonmagnetic interlayer 40 is exposed between the third antiferromagnetic layers 33. According to this structure, the center portion D of the free magnetic layer 28 does not have a synthetic ferrimagnetic structure and functions as a free magnetic layer composed of only a normal magnetic layer. In contrast, the two side portions C of the free magnetic layer 28 have a synthetic ferrimagnetic structure. This structure increases the magnitude of the unidirectional bias magnetic field, reliably pins the magnetization directions of the two side portions C of the free magnetic layer 28 in the track width direction, and prevents side reading.

An anti-diffusion layer composed of a CoFe alloy, elemental Co, or the like may be formed between the magnetic sublayer and the nonmagnetic material layer 27. Moreover, a magnetic layer made of a CoFe alloy may be provided between the magnetic sublayer 41 and the second antiferromagnetic layer 31.

In such a case, the CoFeNi alloy constituting the magnetic sublayer and/or the magnetic sublayer 41 preferably contains 7 to 15 at % of Fe, 5 to 15 at % of Ni, and the balance being Co.

With this alloy, the magnitude of the coupling magnetic field resulting from a Ruderman-Kittel-Kasuya-Yosida (RKKY) interaction can be increased. In particular, the spin-flop magnetic field (Hsf) can be increased to approximately at least 293 kA/m. As a result, the magnetization directions of the magnetic sublayers 39 and 41 can be properly oriented antiparallel to each other. Moreover, by using the CoFeNi alloy satisfying the above-described composition ranges, the magnetostriction of the free magnetic layer 28 can be adjusted within the range of $-3 \times 10^{-6}$ to $3 \times 10^{-6}$, and the coercive force can be reduced to 790 A/m or less. Moreover, the soft magnetic characteristics of the free magnetic layer 28 can be improved.

When the free magnetic layer 28 has a synthetic ferrimagnetic structure, chromium atoms diffusing from the nonmagnetic layer 32 preferably exist in a region at the nonmagnetic-interlayer 40 side from the interface between the magnetic sublayer 41 and the second antiferromagnetic layer 31. More preferably, a chromium-atom-free region exists in a region at the second-antiferromagnetic-layer-31-side from the interface between the magnetic sublayer 41 and the nonmagnetic interlayer 40.

In this manner, the magnitude of the coupling exchange coupling magnetic field (Hex) between the magnetic sublayer 41 and the second antiferromagnetic layer 31 can be increased. Moreover, the magnitudes of the antiparallel coupling magnetic between the magnetic sublayer 41 and the magnetic sublayer with the nonmagnetic interlayer 40 therebetween resulting from the RKKY interaction can be increased. Thus, the unidirectional exchange bias magnetic fields (Hex*) at the two side portions of the free magnetic layer 28 can be increased compared to conventional techniques.

The unidirectional exchange bias magnetic field (Hex*) at the two side portions of the free magnetic layer 28 can still be increased when the chromium content at the interface between the magnetic sublayer 41 and the second antiferromagnetic layer 31 is larger than the chromium content at the interface between the nonmagnetic interlayer 40 and the magnetic sublayer 41.

However, in order to increase the coupling magnetic field between the magnetic sublayer 41 and the magnetic sublayer 41 as a result of the RKKY interaction, a chromium-free magnetic region preferably exists at the interface between the nonmagnetic interlayer 40 and the magnetic sublayer 41.

Figure 17:
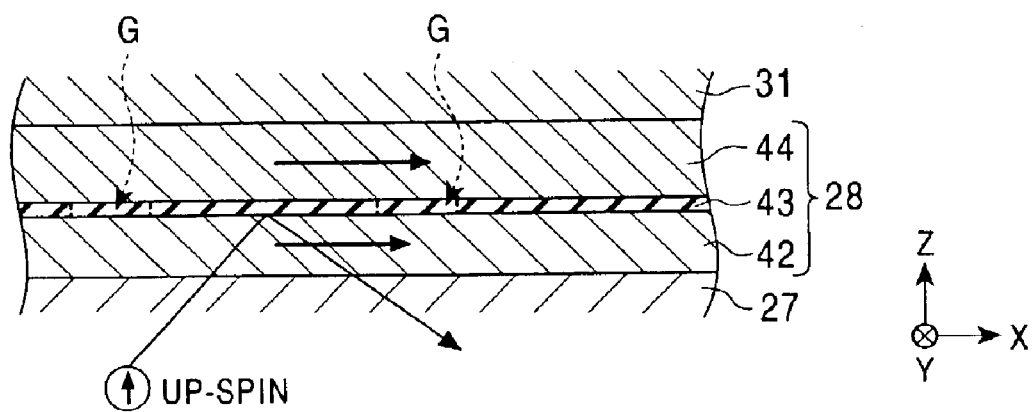
FIG. 17 is a partial enlarged cross-sectional view of yet another example of the free magnetic layer viewed from the face opposing a recording medium.
Figure 18:
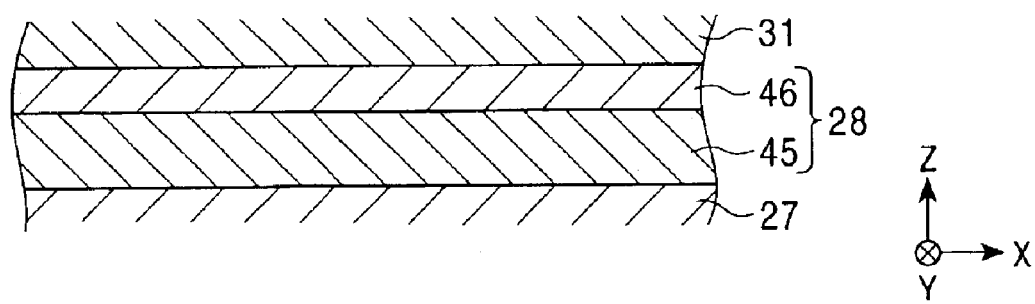
FIG. 18 is a partial enlarged cross-sectional view of still another example of the free magnetic layer viewed from the face opposing a recording medium.

FIG. 17 is a partial enlarged cross-sectional view showing another example of the free magnetic layer 28. As shown in FIG. 17, the free magnetic layer 28 has magnetic material sublayers 42 and 44 and a specular film 43 disposed between the magnetic material sublayers 42 and 44. The specular film 43 may include defective parts (pinholes) G, as shown in FIG. 18. The magnetic material sublayers 42 and 44 are magnetized in antiparallel to each other with the specular film 43 therebetween.

The magnetic material sublayers 42 and 44 is made of a magnetic material such as a NiFe alloy, a CoFe alloy, a CoFeNi alloy, elemental Co, or a CoNi alloy.

When the specular film 43 is in the free magnetic layer 28, conduction electrons, such as spin-up conduction electrons, are specular-reflected at the specular film 43 while maintaining their spinning state, i.e., the energy and the quantum state. The reflected spin-up conduction electrons change the direction and can pass through the free magnetic layer.

Thus, the mean free path $\lambda^+$ of the spin-up conduction electrons can be increased by providing the specular film 43. Accordingly, the difference between the mean free path $\lambda^+$ of the spin-up conduction electrons and the mean free path $\lambda^-$ of the spin-down conduction electrons can be widened, and the rate of change in resistance ($\Delta R/R$) and the output can be improved.

The specular film 43 is made as follows. The layers up to the magnetic material sublayer 42 are first deposited, and the surface of the magnetic material sublayer 42 is oxidized. The oxidized part of the magnetic material sublayer 42 functions as the specular film 43. The nonmagnetic material layer 44 is then deposited on the specular film 43.

Examples of the material of the specular film 43 include oxides such as Fe—O, Ni—O, Co—O, Co—Fe—O, Co—Fe—Ni—O, Al—O, Al-Q-O (wherein Q is at least one selected from the group consisting of B, Si, N, Ti, V, Cr, Mn, Fe, Co, and Ni), and R—O (wherein R is at least one selected from the group consisting of Cu, Ti, V, Cr, Zr, Nb, Mo, Hf, Ta, and W); nitrides such as Al—N, Al-Q-N (wherein Q is at least one selected from the group consisting of B, Si, O, Ti, V, Cr, Mn, Fe, Co, and Ni), and R—N (wherein R is at least one selected from the group consisting of Ti, V, Cr, Zr, Nb, Mo, Hf, Ta, and W); and Heusler alloys.

FIG. 18 is a partial enlarged cross-sectional view of yet another example of the free magnetic layer 28.

The free magnetic layer 28 shown in FIG. 18 is constituted from a magnetic sublayer 45 and a back sublayer 46. The back sublayer 46 is disposed between the magnetic sublayer 45 and the second antiferromagnetic layer 31. The back sublayer 46 is made of, for example, Cu, Au, Cr, or Ru. The magnetic sublayer 45 is made of a magnetic material such as a NiFe alloy, a CoFe alloy, a CoFeNi alloy, elemental Co, or a CoNi alloy.

The back sublayer 46 is formed to extend the mean free path of the spin-up conduction electrons that contribute to the magnetoresistive effect. By a so-called spin-filter effect, the resulting magnetic sensing element exhibits a large rate of change in resistance and can meet the demand for higher recording densities. Since the back sublayer 46 functions as a medium for the exchange coupling, the magnitude of the exchange coupling magnetic field between the second antiferromagnetic layer 31 and the nonmagnetic material layer 4 may slightly decrease, but is still maintained at a sufficient magnitude.

Sixteenth Embodiment

Figure 20:
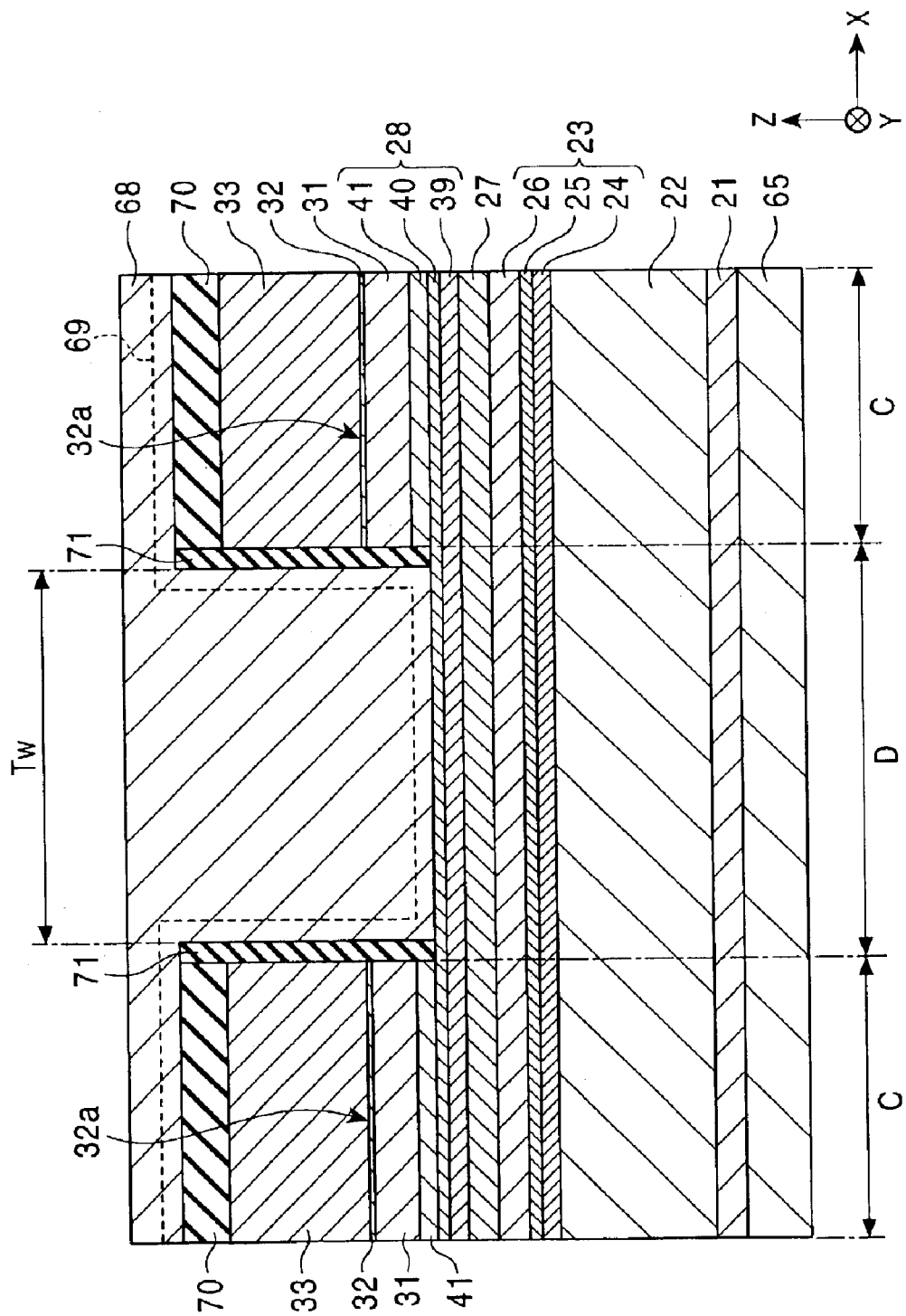
FIG. 20 is a partial cross-sectional view of a magnetic sensing element according to a sixteenth embodiment of the present invention viewed from the face opposing a recording medium.

FIG. 20 shows a magnetic sensing element according to a sixteenth embodiment of the present invention. The magnetic sensing element shown in FIG. 20 is based on the structures shown in FIGS. 10 and 19. In particular, the first insulating layer 70 is disposed on each of the upper faces 33b of the third antiferromagnetic layers 33, and the second insulating layer 71 is formed on the end 33a of each third antiferromagnetic layer 33 and on the end of each of the second antiferromagnetic layers 31. The lower shield layer (electrode) 65 composed of a magnetic material is disposed at the bottom of the composite film. The upper shield layer 68 is disposed to cover the first insulating layer 70, the second insulating layer 71, and the center portion D of the composite film.

Alternatively, the nonmagnetic layer 69 composed of a nonmagnetic conductive material such as Ta may be provided between the upper shield layer 68 and the first insulating layer 70, between the upper shield layer 68 and the second insulating layer 71, and between the center portion D of the composite film and the upper shield layer 68, as indicated by a broken line in FIG. 20.

The second antiferromagnetic layer 31 of each magnetic sensing element shown in FIGS. 1 to 14, 19, and 20 is composed of, for example, a Cr-containing PtMn alloy, an Cr-containing X—Mn alloy, wherein X is at least one element selected from the group consisting of Pd, Ir, Rh, Ru, Os, Ni, and Fe, or a Cr-containing Pt—Mn—X' alloy, wherein X' is at least one element selected from the group consisting of Pd, Ir, Rh, Ru, Au, Ag, Os, Ni, Ar, Ne, Xe, and Kr, may also be used to form the second antiferromagnetic layer 31.

When the second antiferromagnetic layer 31 is composed of a PtMnCr alloy, X—Mn—Cr alloy, or a Pt—Mn—X—Cr alloy, the region around the interface between the second antiferromagnetic layer 31 and the free magnetic layer 28 can easily transform into an ordered structure by annealing. Thus, in such a case, the thickness of the second antiferromagnetic layer 31 is adjusted in the range of 5 to 10 Å so as to prevent the second antiferromagnetic layer 31 from transforming into an ordered structure prior to the formation of the third antiferromagnetic layer 33.

In each of the above-described embodiments of the present invention, the nonmagnetic layer 32 is made of Cr. Alternatively, the nonmagnetic layer 32 may be made of at least one of Ti, Zr, Hf, V, Nb, Al, Si, Mo, W, Y, and rare earth elements.

Figure 21:
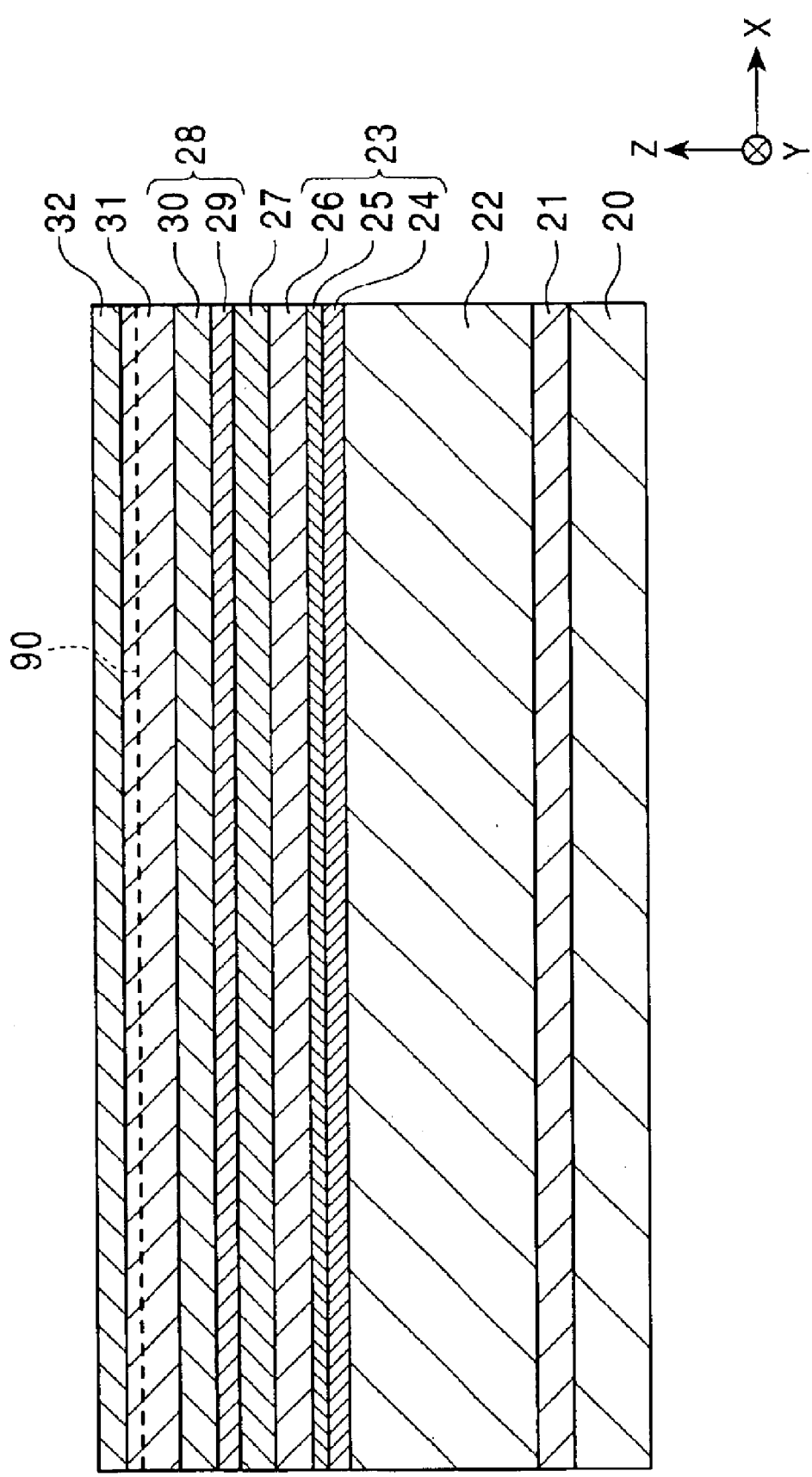
FIG. 21 is a cross-sectional view showing a step of fabricating the magnetic sensing element shown in FIG. 1.
Figure 22:
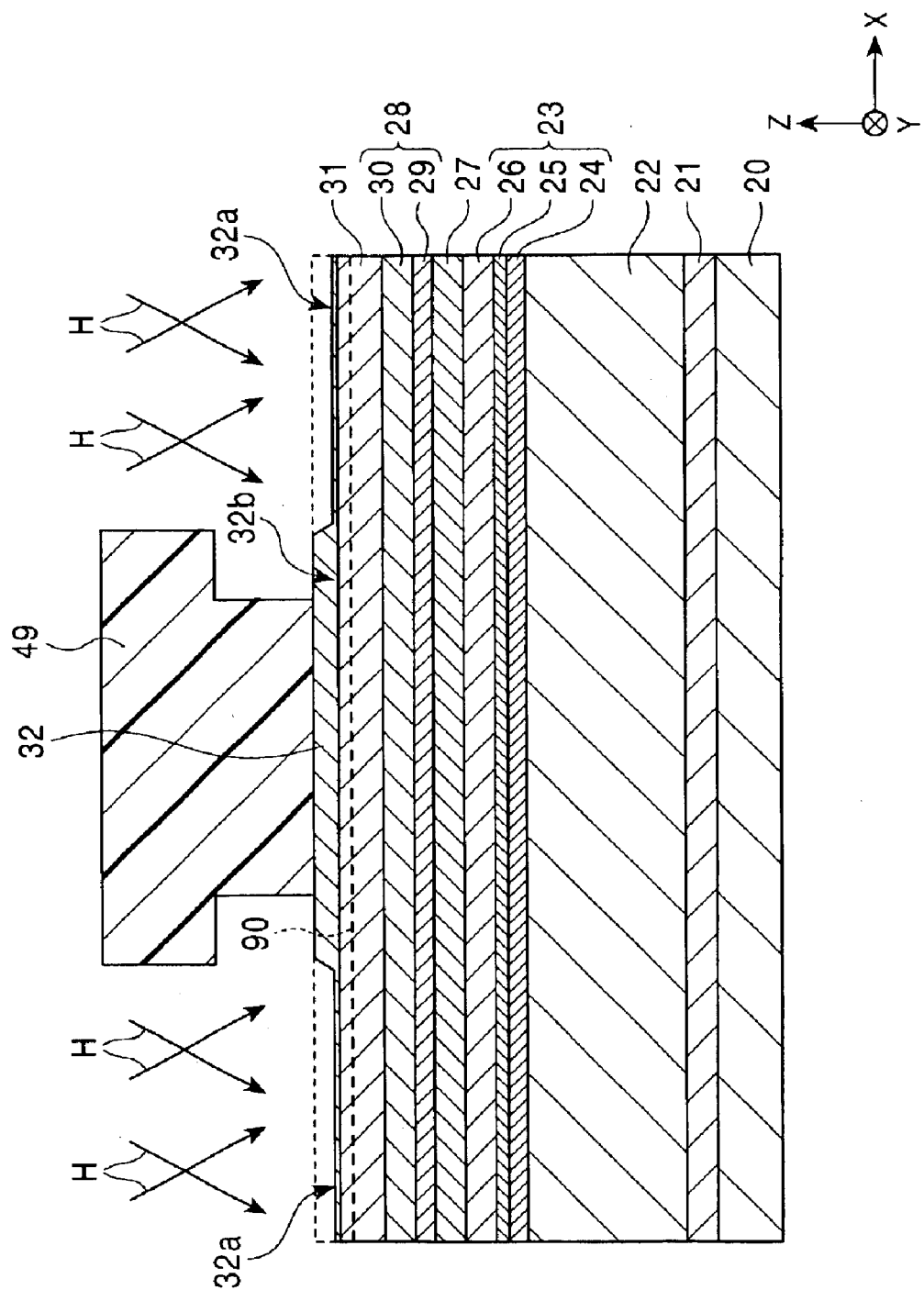
FIG. 22 is a cross-sectional view showing a step subsequent to the step shown in FIG. 21.
Figure 23:
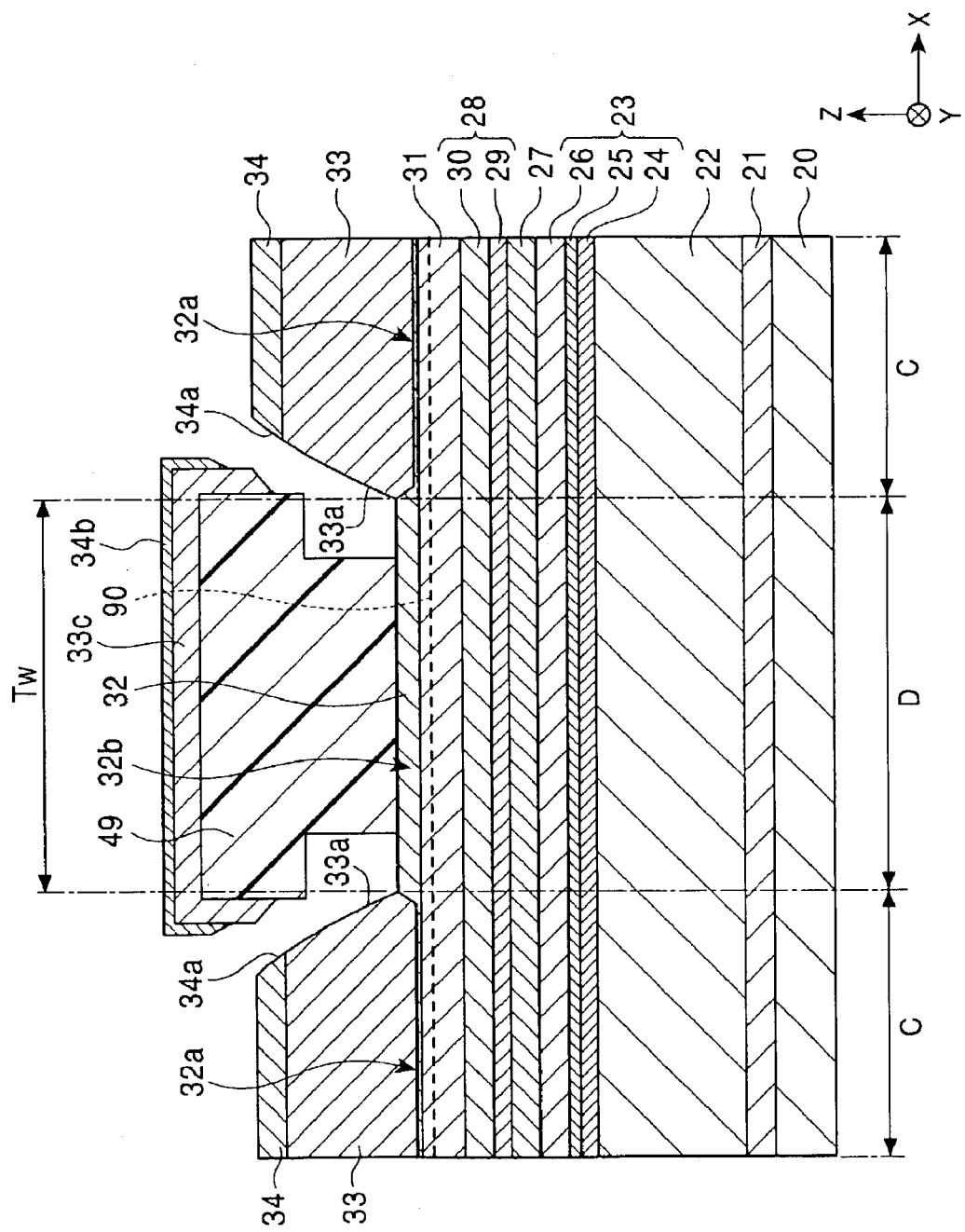
FIG. 23 is a cross-sectional view showing a step subsequent to the step shown in FIG. 22.

FIGS. 21 to 23 show steps of fabricating the magnetic sensing element show in FIG. 1. FIGS. 21 and 23 are partial cross-sectional viewed from the opposing face.

In the step shown in FIG. 21, the seed layer 21, the first antiferromagnetic layer 22, the pinned magnetic layer 23, the nonmagnetic material layer 27, the free magnetic layer 28, the second antiferromagnetic layer 31, and the nonmagnetic layer 32 are sequentially formed on the substrate 20. These layers are formed by sputtering or vapor deposition. The pinned magnetic layer 23 shown in FIG. 21 has, for example, a synthetic ferrimagnetic structure comprising the magnetic sublayers 24 and 26 composed of a CoFe alloy or the like and the nonmagnetic interlayer 25 composed of Ru. The nonmagnetic interlayer 25 is disposed between the magnetic sublayers 24 and 26. The free magnetic layer 28 has, for example, a synthetic ferrimagnetic structure comprising the anti-diffusion sublayer 29 composed of a CoFe alloy or the like and the magnetic material sublayer 30 composed of a NiFe alloy.

Preferably, the first antiferromagnetic layer 22 is composed of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

Preferably, the second antiferromagnetic layer 31 is composed of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The PtMn alloy and the X—Mn alloy preferably contain 37 to 63 at % of Pt and X, respectively. The PtMn alloy and the X—Mn alloy preferably contain 47 to 57 at % of Pt and X, respectively.

The Pt—Mn—X' alloy preferably contains 37 to 63 at %, and, more preferably, 47 to 57 at % of X'+Pt. The Pt—Mn—X' preferably contains 0.2 to 10 at % of X'. However, when the X' is at least one of Pd, Ir, Rh, Ru, Os, Ni, and Fe, the X' content is preferably in the range of 0.2 to 40 at %.

The thickness of the first antiferromagnetic layer 22 is preferably in the range of 80 to 300 Å. At such a thickness, a large exchange coupling magnetic field can be generated between the first antiferromagnetic layer 22 and the pinned magnetic layer 23 by field annealing. In particular, an exchange coupling magnetic field of 48 kA/m or more, for example, exceeding 64 kA/m can be generated.

The thickness of the second antiferromagnetic layer 31 is preferably in the range of 5 to 50 Å, more preferably, 10 to 50 Å, and most preferably 30 to 40 Å.

One of the features of the present invention is to form the second antiferromagnetic layer 31 at such a small thickness.

When the second antiferromagnetic layer 31 has a thickness of 50 Å or less, the second antiferromagnetic layer 31 exhibits nonantiferromagnetic properties. Thus, the second antiferromagnetic layer 31 rarely transforms into an ordered structure even after a first field annealing process described below. As a result, the exchange coupling magnetic field between the second antiferromagnetic layer 31 and the free magnetic layer 28 is small, if any. The magnetization direction of the free magnetic layer 28 is not as firmly pinned as the pinned magnetic layer 23.

The thickness of the second antiferromagnetic layer 31 is preferably at least 5 Å, and more preferably at least 10 Å. Otherwise, the two side portions C of the second antiferromagnetic layer 31 do not easily exhibit antiferromagnetic properties even after the third antiferromagnetic layers 33 are formed. As a result, an exchange coupling magnetic field having a proper magnitude cannot be generated between the free magnetic layer 28 and the second antiferromagnetic layer 31 at the two side portions C.

Referring again to FIG. 21, the nonmagnetic layer 32 also prevents the second antiferromagnetic layer 31 from oxidation resulting from exposure to air.

The nonmagnetic layer 32 is made of Cr. The dense nonmagnetic layer 32 composed of Cr is rarely oxidized in the thickness direction by exposure to air. Thus, the thickness of the nonmagnetic layer 32 need not be large to prevent the oxidization of the second antiferromagnetic layer 31. The thickness of the nonmagnetic layer 32 is preferably 2 to 10 Å, and more preferably 2 to 5 Å.

Another feature of the present invention is to form the nonmagnetic layer 32 with Cr at a small thickness such as approximately 2 to 10 Å. This allows low energy ion milling in the step shown in FIG. 22. The milling process can be more accurately controlled, as will be described below in the step shown in FIG. 22.

The layers up to the nonmagnetic layer 32 shown in FIG. 21 disposed on the substrate 20 are then subjected to first field annealing. In particular, the layers are annealed at a first annealing temperature while applying a first magnetic field in a direction orthogonal to the track width direction, i.e., a first magnetic field in the Y direction orthogonal to the X direction. By the first field annealing, the exchange coupling magnetic field is generated between the first antiferromagnetic layer 22 and magnetic sublayer 24 of the pinned magnetic layer 23, and the magnetic sublayer 24 is magnetized in the Y direction. The magnetic sublayer 26 is magnetized in a direction opposite to the Y direction by exchange coupling resulting from the RKKY interaction with the magnetic sublayer 24. For example, the first annealing temperature is 270° C., and the magnitude of the applied magnetic field is 800 kA/m.

As described above, the magnitude of the exchange coupling magnetic field between the second antiferromagnetic layer 31 and the magnetic material sublayer 30 is small, if any. This is because the second antiferromagnetic layer 31 has a small thickness of 50 Å or less and thus does not exhibit antiferromagnetic properties.

Chromium atoms constituting the nonmagnetic layer 32 diffuse into the second antiferromagnetic layer 31 by the first field annealing. The region of the second antiferromagnetic layer 31 close to the interface with the nonmagnetic layer 32 thus contains Cr in addition to the material of the second antiferromagnetic layer 31. The concentration of Cr is higher in the upper part of the second antiferromagnetic layer 31 than in the lower part of the second antiferromagnetic layer 31. The Cr concentration gradually decreases toward the lower face of the second antiferromagnetic layer 31. Such a gradual change in composition can be examined with a SIMS analyzer or the like.

Next, in the step shown in FIG. 22, a resist layer is formed on the upper face of the nonmagnetic layer 32. The resist layer is exposed and developed so as to leave a resist layer 49 having the shape shown in FIG. 22 on the nonmagnetic layer 32. For example the resist layer 49 is a lift-off resist layer.

The two side portions 32a of the nonmagnetic layer 32 not covered by the resist layer 49 are then partly removed by ion milling in the direction indicated by arrows H in FIG. 22. Portions of the nonmagnetic layer 32 indicated by broken lines in FIG. 22 are removed as a result.

The two side portions 32a of the nonmagnetic layer 32 are partly removed for the following reasons. The thickness of the two side portions 32a must be small in order to induce an antiferromagnetic interaction between the third antiferromagnetic layers 33 and the two side portions C of the second antiferromagnetic layer 31 in the subsequent step. Otherwise, the two side portions C of the second antiferromagnetic layer 31 do not exhibit antiferromagnetic properties, and the magnetization directions at the two side portions C of the free magnetic layer 28 cannot be firmly pinned.

The two side portions 32a of the nonmagnetic layer 32 are preferably milled to a thickness of 3 Å or less, and more preferably 1.0 Å or less by ion milling. In this manner, an antiferromagnetic interaction can be induced between the two side portions C of the second antiferromagnetic layer 31 and the third antiferromagnetic layers 33. As a result, the two side portions C of the second antiferromagnetic layer 31 and the third antiferromagnetic layers 33 can function as a single antiferromagnetic layer, and the two side portions C of the second antiferromagnetic layer 31 can exhibit antiferromagnetic properties. In order to protect the surfaces of the Cs of the second antiferromagnetic layer 31, the thickness of the two side portions 32a is preferably at least 0.2 Å (average thickness).

In the ion milling step shown in FIG. 22, low-energy ion milling is employed. This is because the nonmagnetic layer 32 has a small thickness of approximately 2 to 10 Å, and more preferably 2 to 5 Å.

Figure 37:
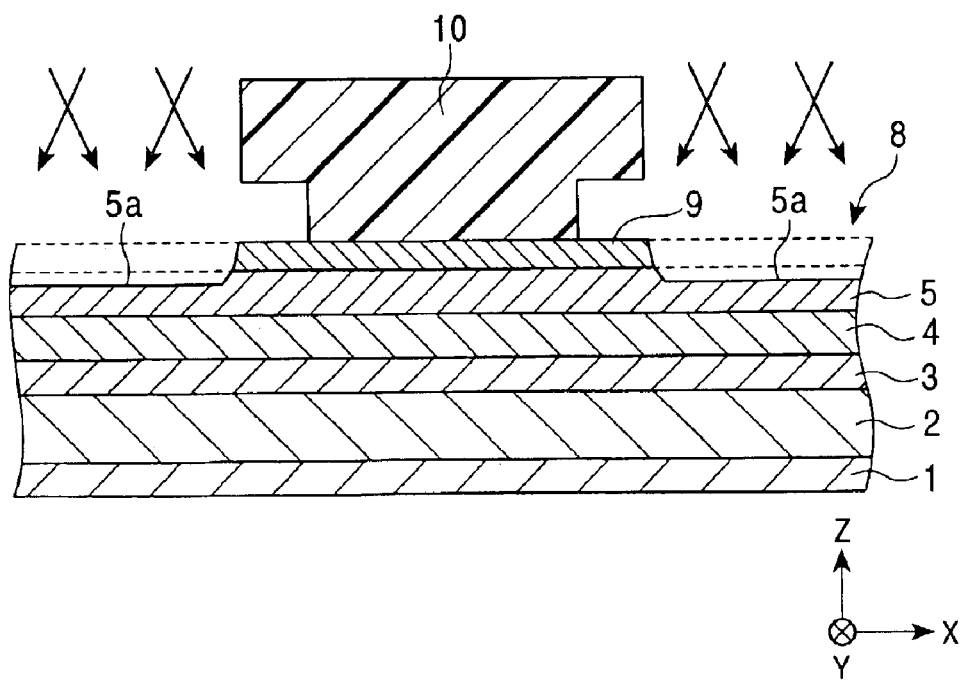
FIG. 37 is a cross-sectional view of a step of fabricating another conventional magnetic sensing element.
Figure 38:
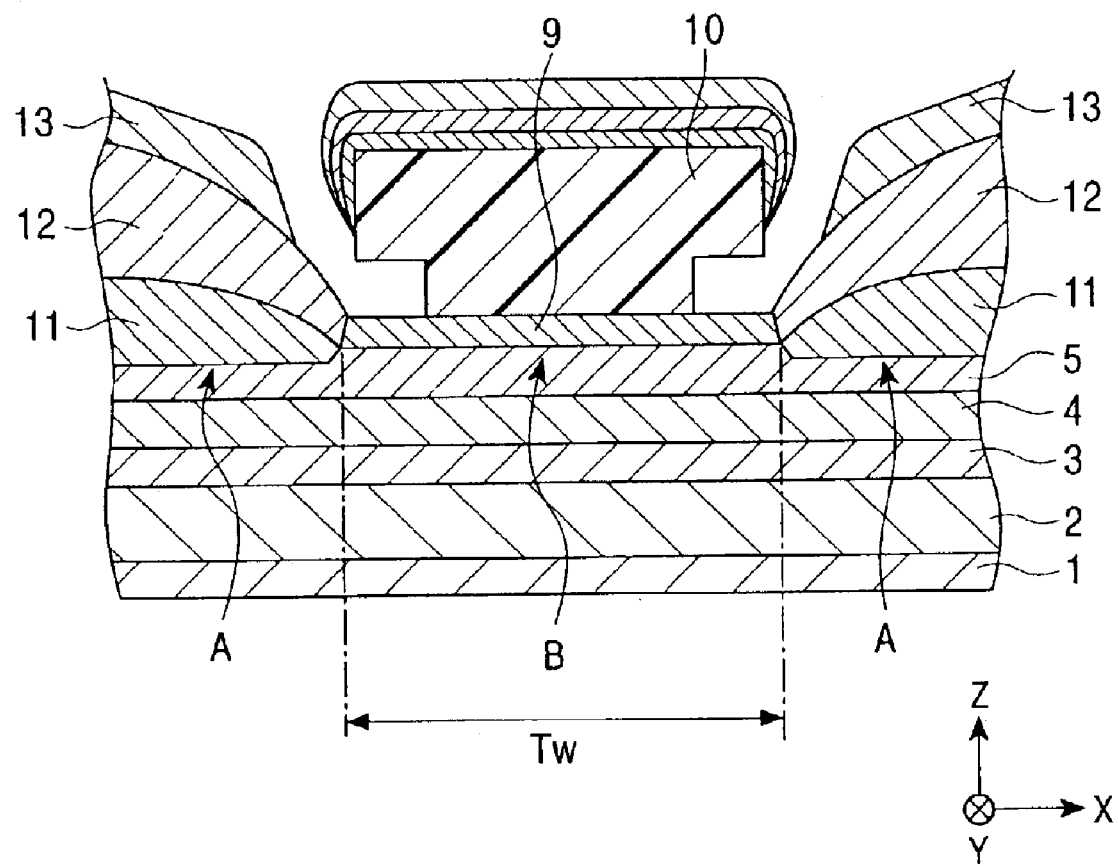
FIG. 38 is a cross-sectional view showing a step subsequent to the step shown in FIG. 37.

According to a conventional process shown in FIG. 37 that uses the Ta film 9, the Ta film 9 itself is oxidized by exposure to air. Thus, the thickness of the Ta film 9 must be 30 to 50 Å in order to sufficiently protect the underlying layer from oxidizing. Since the volume of the Ta film 9 increases by the oxidation, the thickness of the Ta film 9 may exceed 50 Å. To remove the Ta film 9 of such a large thickness, high-energy ion milling must be performed. However, it is difficult to control the milling process to partly remove the Ta film 9. The surface of the free magnetic layer 5 is often partly removed and suffers from damage due to the ion milling.

In the present invention, the thickness of the nonmagnetic layer 32 composed of Cr is approximately 2 to 10 Å, and 2 to 5 Å and still properly prevents the second antiferromagnetic layer 31 from being oxidized. Moreover, since low-energy ion milling is employed, it is easy to control the milling of the insulating layers 33 to stop partway.

Here, the term "low-energy ion milling" refers to ion milling employing ion beams having beam voltages (accelerating voltage) of less than 1,000 V. For example, beam voltages in the range of 100 to 500 V may be employed. In this embodiment, an Ar ion beam having a beam voltage of 200 V is used.

The time for milling is preferably approximately 20 to 40 seconds. The milling angle is 30 to 70 degrees, and more preferably 40 to 60 degrees with respect to an axis perpendicular to the surface of the substrate 20. In this manner, the antiferromagnetic interaction between the two side portions C of the second antiferromagnetic layer 31 and the third antiferromagnetic layers 33 can be intensified, and the magnitudes of the exchange coupling magnetic fields generated between the second antiferromagnetic layer 31 and the free magnetic layer 28 at the two side portions C can be increased.

Next, the step shown in FIG. 23 is performed. In this step, the third antiferromagnetic layer 33 and the electrode layer 34 are sequentially deposited on each of the two side portions 32a of the nonmagnetic layer 32 by sputtering or vapor deposition. The ends 33a of the third antiferromagnetic layers 33 and the ends 32a of the electrode layers 34 are formed as flat or curved slopes so that the gap between the third antiferromagnetic layers 33 and the gap between the electrode layers 34 gradually increases along the Z direction.

In this embodiment, the gap between the lower portions of the third antiferromagnetic layers 33 determines the track width Tw.

The third antiferromagnetic layer 33 is preferably composed of the same antiferromagnetic material as that of the second antiferromagnetic layer 31.

In the step shown in FIG. 23, the sum of the thickness of each third antiferromagnetic layer 33 and the thickness of the second antiferromagnetic layer 31 is preferably 80 to 300 Å. The thickness of the third antiferromagnetic layers 33 is preferably adjusted accordingly. At such a thickness, the two side portions C of the second antiferromagnetic layer 31, which alone do not exhibit antiferromagnetic properties, readily exhibit antiferromagnetic properties.

After the electrode layers 34 are formed as shown in FIG. 23, the resist layer 49 along with layers 33c and 34b deposited during the formation of the third antiferromagnetic layers 33 and the electrode layers 34, respectively, is removed by lifting-off.

Next, a second field annealing is performed. This time, the magnetic field is applied in the track width direction (the X direction in the drawing). In the second field annealing, the applied magnetic field, i.e., the second magnetic field, is smaller than the exchange anisotropic magnetic field of the first antiferromagnetic layer 22, and the annealing temperature is lower than the blocking temperature of the first antiferromagnetic layer 22. The magnitude of the second magnetic field is preferably larger than the saturation magnetization field and the demagnetizing fields of the free magnetic layer 28. In this manner, the exchange anisotropic magnetic field of the second antiferromagnetic layer 31 can be oriented in the track width direction (the X direction) without changing the direction of the exchange anisotropic magnetic field of the first antiferromagnetic layer 22. The second annealing temperature is, for example 250° C., and the magnitude of the applied magnetic field is 24 kA/m.

Since the third antiferromagnetic layers 33 are formed on the two side portions C of the second antiferromagnetic layer 31 with the nonmagnetic layer 32 therebetween, the antiferromagnetic interaction between the second antiferromagnetic layer 31 and the third antiferromagnetic layers 33 is intensified, and the two side portions C of the second antiferromagnetic layer 31, which alone do not exhibit antiferromagnetic properties, exhibit antiferromagnetic properties.

As a result, the two side portions C of the second antiferromagnetic layer 31 properly transform into an ordered structure by the second field annealing, and exchange coupling magnetic fields of proper magnitudes are produced between the free magnetic layer 28 and the second antiferromagnetic layer 31 at the two side portions C. Accordingly, the magnetization directions of the two side portions C of the free magnetic layer 28 are pinned in the track width direction (the X direction in the drawing).

The exchange coupling magnetic field is also generated between the second antiferromagnetic layer 31 and the free magnetic layer 28 at the side portion C by the second field annealing. However, the exchange coupling magnetic field is small, if any, and does not pin the magnetization direction of the center portion D of the free magnetic layer 28 as firmly as in the two side portions C.

The center portion D of the free magnetic layer 28 is moderately put in a single-magnetic-domain state. The magnetization direction in the center portion D can rotate in response to external magnetic fields.

Chromium atoms of the nonmagnetic layer 32 also diffuse into the second antiferromagnetic layer 31 and the third antiferromagnetic layers 33 as a result of the second field annealing. Thus, the second antiferromagnetic layer 31 and the third antiferromagnetic layer 33 after the second annealing contain chromium. The Cr concentration of the second antiferromagnetic layer 31 is higher in the upper part and lower in the bottom part. The Cr concentration of each third antiferromagnetic layer 33 is higher in the lower part and lower in the upper part. The Cr concentration in the second antiferromagnetic layer 31 gradually decreases along the direction opposite to the Z direction (the downward direction in the drawing). The Cr concentration in the third antiferromagnetic layer 33 gradually decreases along the Z direction (the upward direction in the drawing). Such a gradual change in concentration can be examined by a SIMS analyzer.

As the chromium atoms of the nonmagnetic layer 32 diffuse into the second antiferromagnetic layer 31, the PtMn alloy, the X—Mn alloy, or the Pt—Mn—X' alloy constituting the second antiferromagnetic layer 31 transforms into an ordered structure.

Since the nonmagnetic layer 32 is deposited on the second antiferromagnetic layer 31 to protect the second antiferromagnetic layer 31, the thickness h1 of the second antiferromagnetic layer 31 can be decreased to a thickness in the range of 5 to 50 Å, for example, approximately 10 Å. As Cr atoms diffuse into the second antiferromagnetic layer 31 having such a small thickness, the region around the interface between the second antiferromagnetic layer 31 and the free magnetic layer 28 rapidly transforms into an ordered structure, and the magnitude of the exchange coupling magnetic field at the interface can be increased.

Accordingly, in the resulting magnetic sensing element, the magnetization directions of the free magnetic layer 28 at the two side portions C can be firmly pinned by the two side portions C of the second antiferromagnetic layer 31. Side reading can be reduced.

The crystal structure of the second antiferromagnetic layer 31 is, for example, of a CuAuI type. Chromium atoms diffusing from the nonmagnetic layer 32 partly replace the lattice points of the crystal lattice constituted from atoms of Pt and Mn, the crystal lattice constituted from atoms of X and Mn, or the crystal lattice constituted from atoms of Pt, Mn, and X'.

As described above, the magnetization direction of the free magnetic layer 28 can be properly controlled by employing the production method of the present invention. A magnetic sensing element having superior sensitivity compatible with narrower tracks can be produced.

A process for fabricating the magnetic sensing element shown in FIG. 2 will now be described. The magnetic sensing element is made through the steps shown in FIGS. 21 to 23. During the step of ion milling shown in FIG. 22, the two side portions 32a of the nonmagnetic layer 32 composed of Cr are completely removed. As is previously described, the thickness of the nonmagnetic layer 32 is so small that the nonmagnetic layer 32 can be milled by low-energy ion milling. Since the milling rate is low in the low-energy ion milling compared to high-energy ion milling, milling can be stopped immediately after the nonmagnetic layer 32 is completely removed. Thus, damage inflicted to the surface of the second antiferromagnetic layer 31 by milling can be minimized.

Since second antiferromagnetic layer 31 is not significantly affected by milling, the magnetic characteristics of the second antiferromagnetic layer 31 can be maintained at a satisfactory level.

The surface of the second antiferromagnetic layer 31 may be partly milled, as indicated by broken lines E in FIG. 2. However, the surface of the second antiferromagnetic layer 31 is not significantly damaged. Thus, the two side portions C of the second antiferromagnetic layer 31 and the third antiferromagnetic layers 33 can function as a single antiferromagnetic layer, and the two side portions C of the second antiferromagnetic layer 31 can properly exhibit antiferromagnetic properties. When subjected to second field annealing, the two side portions C of the second antiferromagnetic layer 31 transform into an ordered structure, and exchange coupling magnetic fields are generated between the free magnetic layer 28 and the second antiferromagnetic layer 31 at the two side portions C. As a result the magnetization directions of the two side portions C of the free magnetic layer 28 can be pinned in the track width direction (the X direction).

The magnetic sensing element shown in FIG. 3 can be manufactured by performing the step shown in FIG. 21, forming the resist layer 49 in the step shown in FIG. 22, and performing the step shown in FIG. 23. In other words, no ion milling is performed during the step shown in FIG. 22.

In order to make the magnetic sensing element shown in FIG. 3, the thickness of the nonmagnetic layer 32 is adjusted to be 3 Å or less, and more preferably 1 Å or less, in the step shown in FIG. 21. Alternatively, the nonmagnetic layer 32 is deposited to a thickness of 2 to 10 Å, and more preferably 2 to 5 Å and is then milled to a thickness of 3 Å or less, and more preferably 1 Å or less by ion milling. The nonmagnetic layer 32 is preferably at least 0.2 Å in average thickness.

When the nonmagnetic layer 32 has a thickness of 3 Å or less, an antiferromagnetic interaction can be induced between the two side portions C of the second antiferromagnetic layer 31 and the third antiferromagnetic layers 33. There is no need to completely remove or reduced to thickness of the two side portions 32a of the nonmagnetic layer 32 by ion milling in the step shown in FIG. 22.

The nonmagnetic layer 32 constituted from the center portion 32b and the two side portions 32a of a uniform thickness can be formed through the steps described above.

When the free magnetic layer 28 having a structure shown in FIG. 16 or FIG. 18 is to be formed by this production method through steps shown in FIGS. 21 to 23, an additional step of covering the third antiferromagnetic layers 33 and the electrode layers 34 with a resist layer and removing the exposed center portion 32b of the nonmagnetic layer 32, the center portion of the second antiferromagnetic layer 31, and the center portion of the magnetic sublayer 41 shown in FIG. 16 or the back sublayer 46 shown in FIG. 19 by ion milling or the like is provided.

The above description regards the methods for fabricating the CIP magnetic sensing elements shown in FIGS. 1 to 3. Methods for fabricating the CPP magnetic sensing elements shown in FIGS. 7 to 9 will now be described. Only the steps different from those for fabricating the CIP magnetic sensing elements shown in FIGS. 1 to 3 will be described below.

Figure 24:
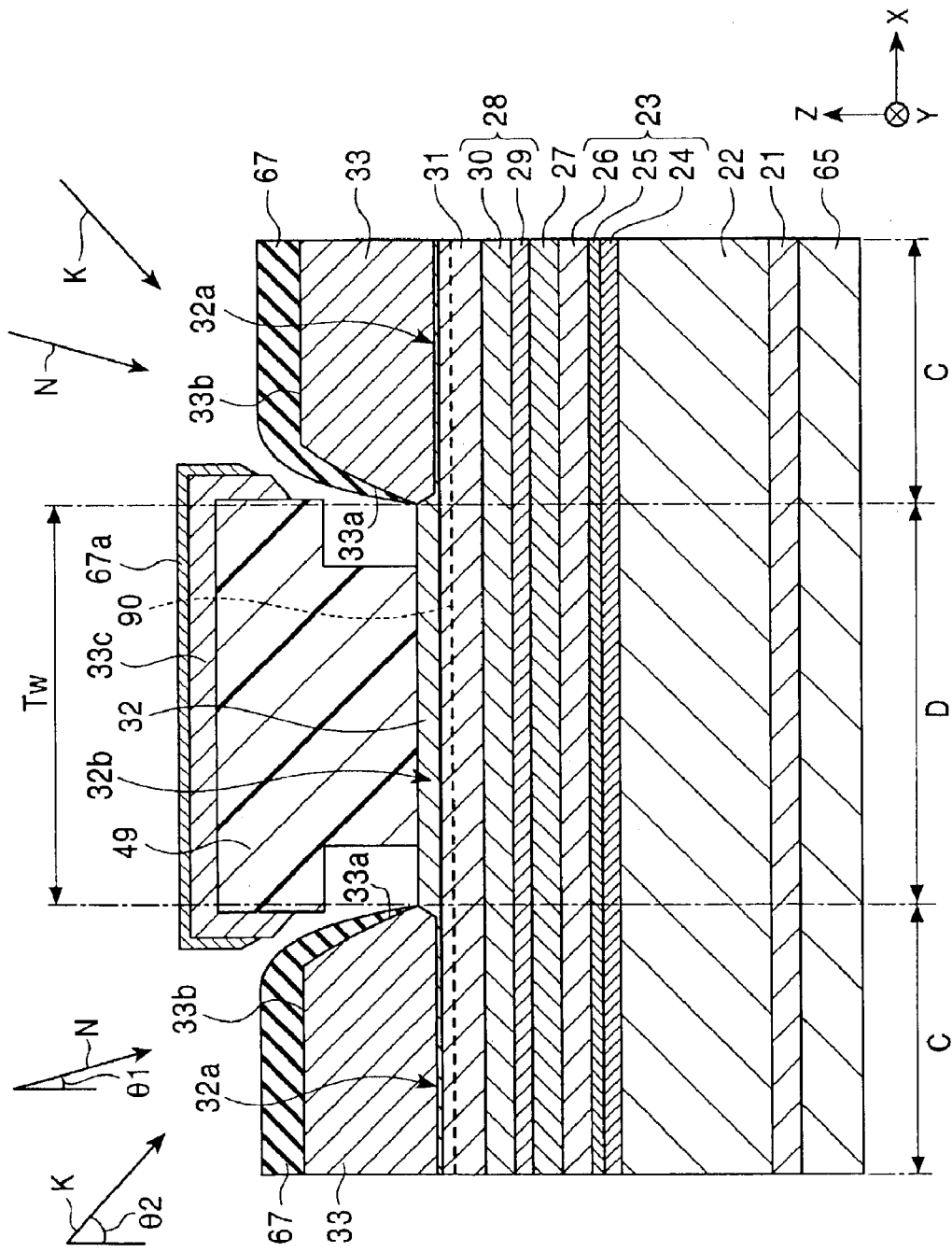
FIG. 24 is a cross-sectional view showing a step of fabricating the magnetic sensing element shown in FIG. 7.

First, the steps shown in FIGS. 21 and 22 are performed. Subsequently, in the step shown in FIG. 24, the third antiferromagnetic layers 33 are sputter-deposited on the two side portions 32a of the nonmagnetic layer 32. The sputtering is performed in the direction indicated by arrow N at a sputtering angle of θ1 (an angle with respect to the axis parallel to the Z direction). The insulating layers 67 are then sputter-deposited over the upper face 33b and the ends 33a of the third antiferromagnetic layer 33. This sputtering is performed in the direction indicated by arrow K at a sputtering angle of θ2 (an angle with respect to the axis parallel to the Z direction).

The angles θ1 and θ2 may be the same or different. Preferably, the sputtering angle θ2 is larger than the sputtering angle θ1. In this manner, the ends 67a can be extended over the two side ends of the center portion 32b of the nonmagnetic layer 32. Preferably, the angles θ1 and θ2 are not zero.

Figure 25:
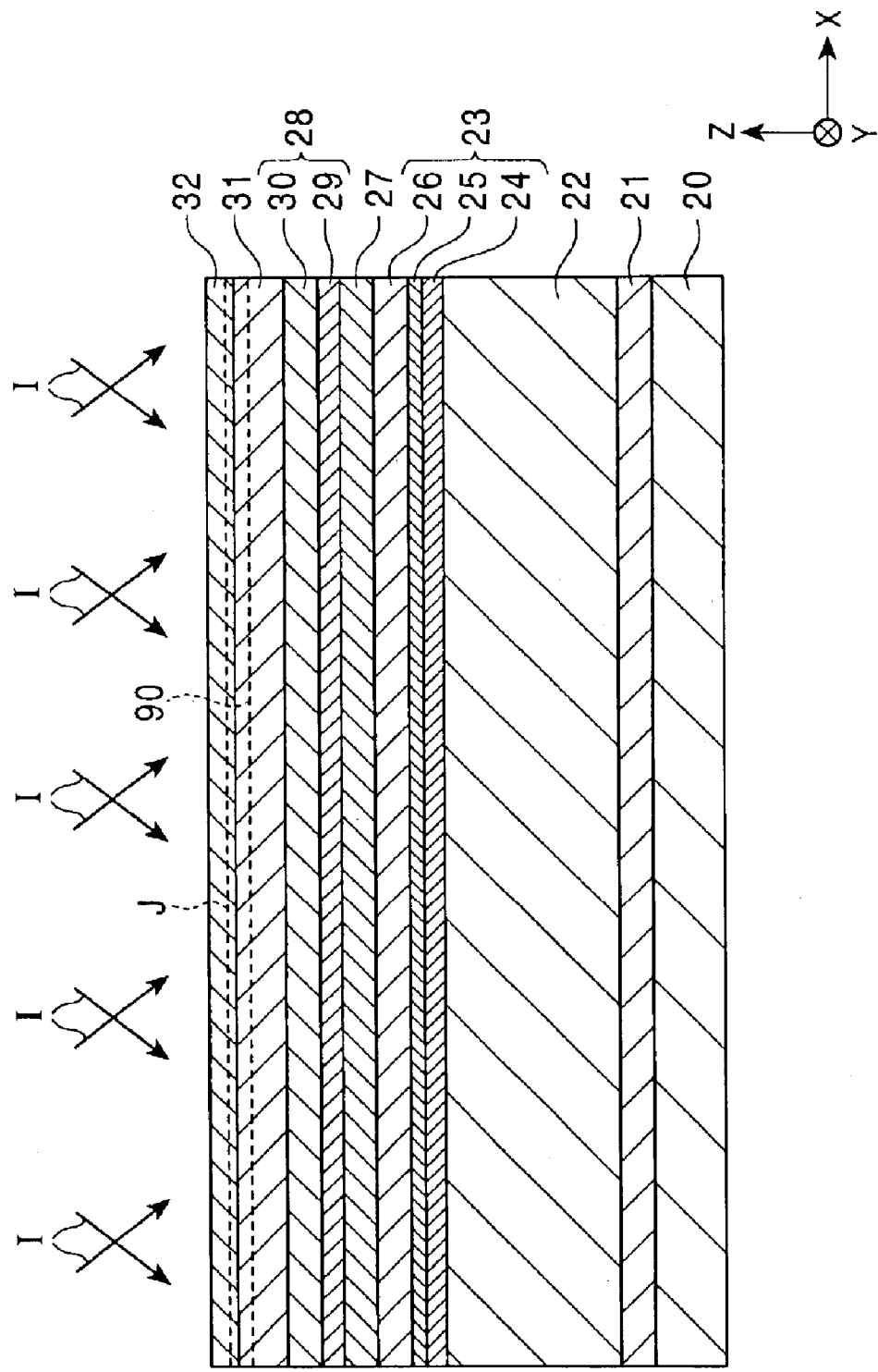
FIG. 25 is a cross-sectional view showing a step of fabricating the magnetic sensing element shown in FIG. 4.
Figure 26:
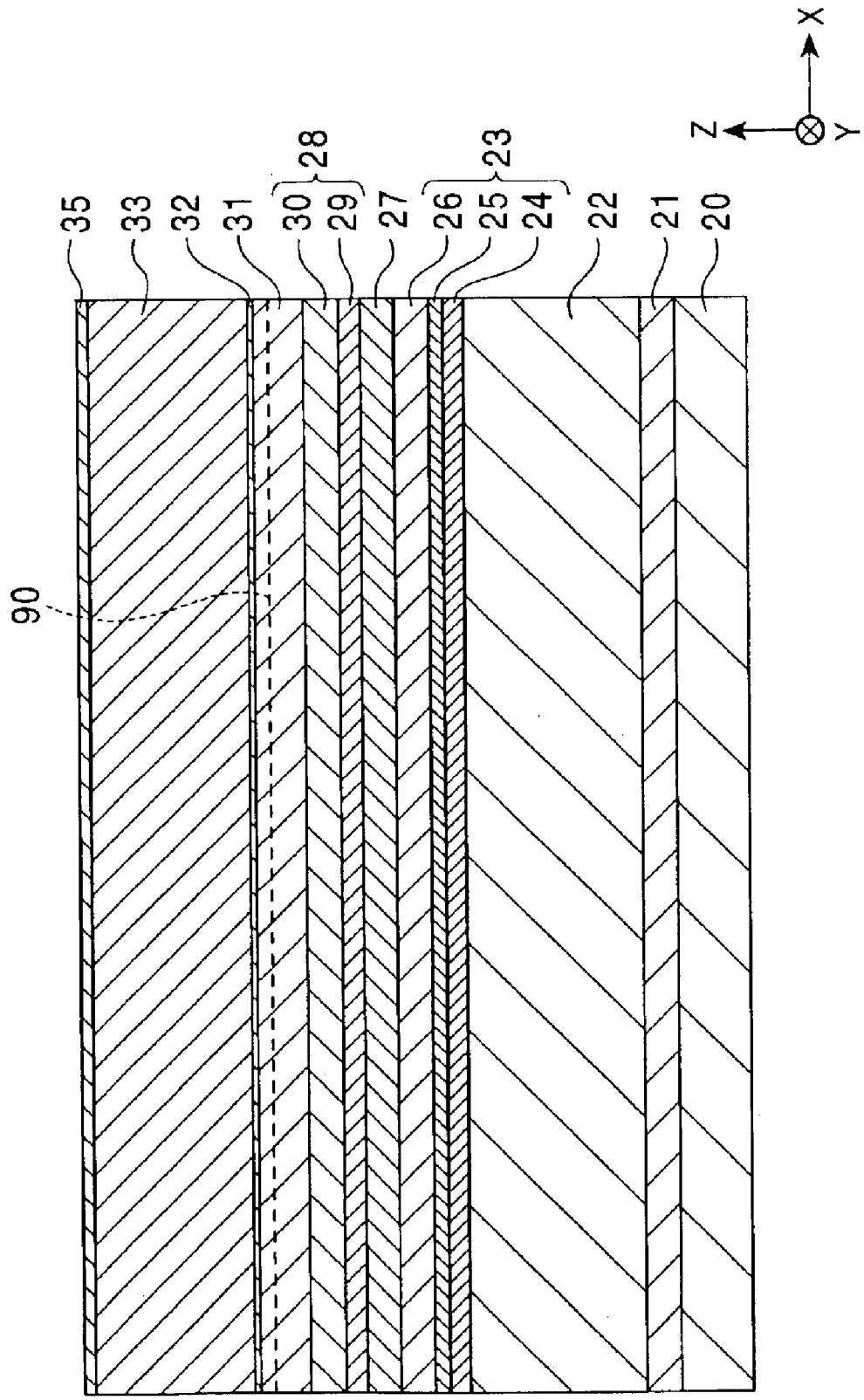
FIG. 26 is a cross-sectional view showing a step subsequent to the step shown in FIG. 25.
Figure 27:
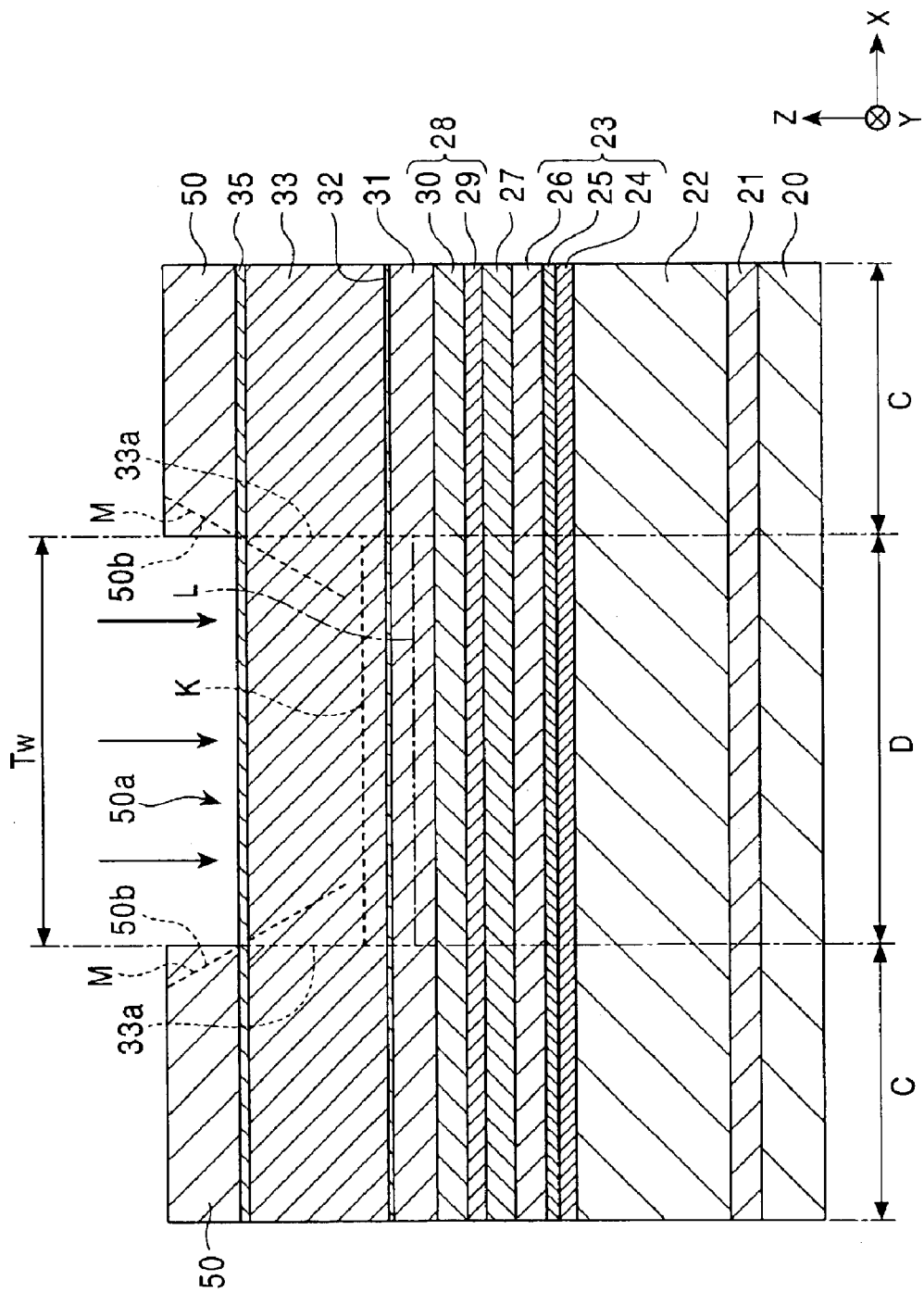
FIG. 27 is a cross-sectional view showing a step subsequent to the step shown in FIG. 26.

A method for fabricating the magnetic sensing element shown in FIG. 10 will now be described. FIGS. 25 to 27 are partial cross-sectional views of the magnetic sensing element viewed from the opposing face showing the steps of the fabrication method.

In the step shown in FIG. 25, the seed layer 21, the first antiferromagnetic layer 22, the pinned magnetic layer 23, the nonmagnetic material layer 27, the free magnetic layer 28, the second antiferromagnetic layer 31, and the nonmagnetic layer 32 are sequentially deposited on the substrate 20 by sputtering or vapor deposition. The pinned magnetic layer 23 in FIG. 25 has a synthetic ferrimagnetic structure comprising the magnetic sublayers 24 and 26 composed of, for example, a CoFe alloy and the nonmagnetic interlayer 25 composed of, for example, Ru disposed between the magnetic sublayers 24 and 26. The free magnetic layer 28 is constituted from the anti-diffusion sublayer 29 composed of, for example, a CoFe alloy and the magnetic material sublayer 30 composed of a NiFe alloy, for example.

The first antiferromagnetic layer 22 is preferably composed of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The second antiferromagnetic layer 31 is preferably composed of a PtMn alloy, an X—Mn alloy, or a Pt—Mn—X' alloy, wherein X is at least one element selected from the group consisting of Pd, Ir, Rh, Ru, Os, Ni, and Fe, and X' is at least one element selected from the group consisting of Pd, Ir, Rh, Ru, Au, Ag, Os, Cr, Ni, Ar, Ne, Xe, and Kr.

The PtMn alloy and the X—Mn alloy preferably contain 37 to 63 at % of Pt and X, respectively. The PtMn alloy and the X—Mn alloy preferably contain 47 to 57 at % of Pt and X, respectively.

The Pt—Mn—X' alloy preferably contains 37 to 63 at %, and, more preferably, 47 to 57 at % of X'+Pt. The Pt—Mn—X' preferably contains 0.2 to 10 at % of X'. However, when the X' is at least one of Pd, Ir, Rh, Ru, Os, Ni, and Fe, the X' content is preferably in the range of 0.2 to 40 at %.

The thickness of the first antiferromagnetic layer 22 is preferably in the range of 80 to 300 Å. At such a thickness, a large exchange coupling magnetic field can be generated between the first antiferromagnetic layer 22 and the pinned magnetic layer 23 by field annealing. In particular, an exchange coupling magnetic field of 48 kA/m or more, for example, exceeding 64 kA/m can be generated.

The thickness of the second antiferromagnetic layer 31 is preferably in the range of 5 to 50 Å, more preferably, 10 to 50 Å, and most preferably 30 to 40 Å.

One of the features of the present invention is to form the second antiferromagnetic layer 31 at such a small thickness.

When the second antiferromagnetic layer 31 has a thickness of 50 Å or less, the second antiferromagnetic layer 31 exhibits nonantiferromagnetic properties. Thus, the second antiferromagnetic layer 31 rarely transforms into an ordered structure even after a first field annealing process described below. As a result, the exchange coupling magnetic field between the second antiferromagnetic layer 31 and the free magnetic layer 28 is small, if any. The magnetization direction of the free magnetic layer 28 is not as firmly pinned as the pinned magnetic layer 23.

The thickness of the second antiferromagnetic layer 31 is preferably at least 5 Å, and more preferably at least 10 Å. Otherwise, the two side portions C of the second antiferromagnetic layer 31 do not easily exhibit antiferromagnetic properties even after the third antiferromagnetic layers 33 are formed. As a result, an exchange coupling magnetic field having a proper magnitude cannot be generated between the free magnetic layer 28 and the second antiferromagnetic layer 31 at the two side portions C.

Referring again to FIG. 25, the nonmagnetic layer 32 also prevents the second antiferromagnetic layer 31 from oxidation resulting from exposure of the composite film to air.

The nonmagnetic layer 32 is made of Cr. The nonmagnetic layer 32 composed of Cr is dense and is rarely oxidized in the thickness direction by exposure to air. Thus, the thickness of the nonmagnetic layer 32 need not be large to prevent the oxidization of the second antiferromagnetic layer 31. The thickness of the nonmagnetic layer 32 is preferably 2 to 10 Å, and more preferably to 5 Å.

Another feature of the present invention is to form the nonmagnetic layer 32 with Cr at a small thickness such as approximately 2 to 10 Å. This allows performance of low energy ion milling, which is relatively easy to control, in the subsequent step.

Referring again to FIG. 25, after the layers up to the nonmagnetic layer 32 are deposited on the substrate 20, first field annealing is performed. In particular, the layers are annealed at a first annealing temperature while applying a first magnetic field in a direction orthogonal to the track width direction, i.e., a first magnetic field in the Y direction orthogonal to the X direction. By the first field annealing, the exchange coupling magnetic field is generated between the first antiferromagnetic layer 22 and magnetic sublayer 24 of the pinned magnetic layer 23, and the magnetic sublayer 24 is magnetized in the Y direction. The magnetic sublayer 26 is magnetized in a direction opposite to the Y direction by exchange coupling resulting from the RKKY interaction with the magnetic sublayer 24. For example, the first annealing temperature is 270° C., and the magnitude of the applied magnetic field is 800 kA/m.

As described above, the second antiferromagnetic layer 31 rarely transforms into an ordered structure by the first field annealing since the thickness is small, and the magnitude of the exchange coupling magnetic field between the second antiferromagnetic layer 31 and the magnetic material sublayer 30 is small, if any. This is because the second antiferromagnetic layer 31 has a small thickness of 50 Å or less and thus does not exhibit antiferromagnetic properties.

Chromium atoms constituting the nonmagnetic layer 32 diffuse into the second antiferromagnetic layer 31 by the first field annealing. The region of the second antiferromagnetic layer 31 close to the interface with the nonmagnetic layer 32 thus contains Cr in addition to the material of the second antiferromagnetic layer 31. The concentration of Cr is higher in the upper part of the second antiferromagnetic layer 31 than in the lower part of the second antiferromagnetic layer 31. The Cr concentration gradually decreases toward the lower face of the second antiferromagnetic layer 31. Such a gradual change in composition can be examined with a SIMS analyzer or the like.

Next, in the step shown in FIG. 25, the entire surface of the nonmagnetic layer 32 is partly milled with ions to the position indicated by broken line J.

The nonmagnetic layer 32 is partly milled for the following reasons. The thickness of the nonmagnetic layer 32 must be small in order to induce an antiferromagnetic interaction between the third antiferromagnetic layers 33 and the two side portions C of the second antiferromagnetic layer 31 in the subsequent step. Otherwise, the magnetization direction of the free magnetic layer 28 cannot be properly controlled.

The two side portions 32a of the nonmagnetic layer 32 are preferably milled to a thickness (average thickness) in the range of 0.2 to 3 Å, and more preferably 0.2 to 1.0 Å by ion milling. In this manner, an antiferromagnetic interaction can be induced between the two side portions C of the second antiferromagnetic layer 31 and the third antiferromagnetic layers 33. As a result, the two side portions C of the second antiferromagnetic layer 31 and the third antiferromagnetic layers 33 can function as a single antiferromagnetic layer, and the two side portions C of the second antiferromagnetic layer 31 can exhibit antiferromagnetic properties.

In the ion milling step shown in FIG. 25, low-energy ion milling can be employed. This is because the nonmagnetic layer 32 after deposition has a small thickness of approximately 2 to 10 Å. Thus, milling of the nonmagnetic layer 32 can be stopped partway. In other words, milling can be more accurately controlled compared to conventional techniques.

Alternatively, the nonmagnetic layer 32 may be completely removed in the step shown in FIG. 25. Although no nonmagnetic layer 32 physically exists, chromium atoms are diffused in the second antiferromagnetic layer 31. The Cr concentration increases toward the upper face of the second antiferromagnetic layer 31.

Next, in the step shown in FIG. 26, the third antiferromagnetic layer 33 is formed on the nonmagnetic layer 32, and the interlayer (protective layer) 35 composed of Ta or the like is sequentially formed on the third antiferromagnetic layer 33. The interlayer 35 protects the third antiferromagnetic layer 33 from being oxidized by exposure to air.

Preferably, the third antiferromagnetic layer 33 and the second antiferromagnetic layer 31 are composed of the same material.

In the step shown in FIG. 26, the sum of the thickness of the third antiferromagnetic layer 33 and the thickness of the second antiferromagnetic layer 31 is preferably 80 to 300 Å. The thickness of the third antiferromagnetic layer 33 is preferably adjusted accordingly. At such a thickness, the second antiferromagnetic layer 31, which alone does not exhibit antiferromagnetic properties, exhibits antiferromagnetic properties.

In the subsequent step shown in FIG. 27, a mask layer 50 composed of, for example, an inorganic material is formed on the interlayer 35. The mask layer 50 has a predetermined void 50a. Examples of the inorganic material include Ta, Ti, Si, Zr, Nb, Cr, Mo, Hf, W, Al—O, Al—Si—O, and Si—O. In case the mask layer 50 is made of a metal, the mask layer 50 may be left to function as the electrode layers 34.

The mask layer 50 may be prepared as follows. A resist layer (not shown) is disposed on the center portion of the interlayer 35, and the two sides of the resist layer are filled with the material of the mask layer 50. The resist layer is then removed so as to form the gap 50a of a predetermined with and the mask layer 50. Alternatively, the mask layer 50 may be provided on the entire surface of the interlayer 35, and a resist layer (not shown) may be formed on the mask layer 50. A hole is formed at the center portion of the resist layer by exposure and development, and part of the mask layer 50 exposed at the hole is removed by reactive ion etching or the like so as to form the void 50a.

In the present invention, the mask layer 50 may be composed of a resist material.

In the step shown in FIG. 27, the interlayer 35 exposed at the void 50a in the mask layer 50, and part of the third antiferromagnetic layer 33 is removed by reactive ion etching or ion milling. Milling is performed down to a position indicated by broken line K in the drawing. The milling is preferably performed until the sum of the thickness of the third antiferromagnetic layer 33 in the center portion D and the thickness of the second antiferromagnetic layer 31 reaches a thickness in the range of 5 to 50 Å, and more preferably 10 to 50 Å. Otherwise, the center portion D of the second antiferromagnetic layer 31 exhibits antiferromagnetic properties, an exchange coupling magnetic field is generated between the second antiferromagnetic layer 31 and the free magnetic layer 28 at the center portion D, and the magnetization direction of the free magnetic layer 28 at the center portion D is firmly pinned in a certain direction.

When the third antiferromagnetic layer 33 is milled partway as indicated by broken line K in FIG. 27, the magnetic sensing element shown in FIG. 5 can be manufactured.

Alternatively, all of the third antiferromagnetic layer 33 exposed at the void 50a of the mask layer 50 may be removed, and the nonmagnetic layer 32 may be exposed at the void 50a. Here, the nonmagnetic layer 32 may be milled partway. When milling is stopped at the moment the nonmagnetic layer 32 is exposed at the void 50a, the magnetic sensing element shown in FIG. 4 is manufactured.

Alternatively, all of the nonmagnetic layer 32 exposed at the void 50a may be removed, and the second antiferromagnetic layer 31 may be milled partway until the position indicated by a single-dotted chain line L is reached. In this manner, the magnetic sensing element shown in FIG. 6 is manufactured.

As shown in FIG. 27, the third antiferromagnetic layer 33 is milled in a direction perpendicular to the surface of the substrate 20. Thus, the ends 33a of the third antiferromagnetic layer 33 are perpendicular to the surface of the substrate 20. In other words, the ends 33a extend in the Z direction. In case the layers below the third antiferromagnetic layer 33 are milled, the ends of these layers are, as a matter of course, also perpendicular to the surface of the substrate 20.

Note that in order to form ends 50b of the mask layer 50 as flat or curved slopes so that the gap between the ends 50b gradually increases along the Z direction (the upward direction), as indicated by broken lines M, the milling direction is shifted from the axis perpendicular to the surface of the substrate 20. Since the gap between the ends 33a of the third antiferromagnetic layer 33 gradually decreases toward the bottom, the track width Tw can be made smaller than the width of the void 50a in the mask layer 50. Thus, a magnetic sensing element that can meet the demand for narrower tracks can be manufactured.

The second antiferromagnetic layer 31 may be milled until a desired position is reached. However, the thickness of the second antiferromagnetic layer 31 in the center portion D should be sufficiently small so as not to exhibit antiferromagnetic properties. Moreover, the free magnetic layer 28 must not be milled by reaction ion etching or ion milling because the magnetic characteristics of the free magnetic layer 28 will be degraded by damage inflicted by milling.

In the embodiment shown in FIG. 19, the magnetic sublayer 41 may be completely removed, and the nonmagnetic interlayer 40 may be milled partway. When the free magnetic layer 28 having the structure shown in FIG. 18 is employed, the back sublayer 46 may be milled partway.

Subsequent to the RIE or ion milling, a second field annealing is performed. This time, the magnetic field is applied in the track width direction (the X direction in the drawing). In the second field annealing, the applied magnetic field, i.e., the second magnetic field, is smaller than the exchange anisotropic magnetic field of the first antiferromagnetic layer 22, and the annealing temperature is lower than the blocking temperature of the first antiferromagnetic layer 22. The magnitude of the second magnetic field is preferably larger than the saturation magnetization field and the demagnetizing fields of the free magnetic layer 28. In this manner, the exchange anisotropic magnetic field of the second antiferromagnetic layer 31 at the two side portions C can be oriented in the track width direction (the X direction) without changing the direction of the exchange anisotropic magnetic field of the first antiferromagnetic layer 22. The second annealing temperature is, for example 250° C., and the magnitude of the applied magnetic field is 24 kA/m.

The two side portions C of the second antiferromagnetic layer 31 exhibit antiferromagnetic properties due to an antiferromagnetic interaction with the third antiferromagnetic layers 33 formed on the second antiferromagnetic layer 31. By the second field annealing, the two side portions C of the second antiferromagnetic layer 31 transform into an ordered structure, and large exchange coupling magnetic fields are generated between the free magnetic layer 28 and the second antiferromagnetic layer 31 at the two side portions C. As a result, the magnetization directions of the two side portions C of the free magnetic layer 28 are pinned in the track width direction (the X direction).

Since the antiferromagnetic layer disposed on the center portion D of the free magnetic layer 28 is thin and thus does not exhibit antiferromagnetic properties, the second antiferromagnetic layer 31 at the center portion D does not transform into an ordered structure by the second field annealing. Therefore, only a small exchange coupling magnetic field is generated, if any, between the free magnetic layer 28 and the second antiferromagnetic layer 31 at the center portion D. The center portion D of the free magnetic layer 28 is not pinned as firmly as in the two side portions C.

The center portion D of the free magnetic layer 28 is only moderately put in a single-magnetic-domain state so that the magnetization direction thereof can rotate in response to external magnetic fields.

According to present invention described above, the magnetization direction of the free magnetic layer 28 can be properly controlled, and a magnetic sensing element having a high sensitivity even with narrow tracks can be manufactured.

Chromium atoms of the nonmagnetic layer 32 also diffuse into the second antiferromagnetic layer 31 and the third antiferromagnetic layers 33 as a result of the second field annealing. Thus, the second antiferromagnetic layer 31 and the third antiferromagnetic layer 33 after the second annealing contain chromium. The Cr concentration of the second antiferromagnetic layer 31 is higher in the upper part and lower in the bottom part. The Cr concentration of each third antiferromagnetic layer 33 is higher in the lower part and lower in the upper part. The Cr concentration in the second antiferromagnetic layer 31 gradually decreases along the direction opposite to the Z direction (the downward direction in the drawing). The Cr concentration in the third antiferromagnetic layer 33 gradually decreases along the Z direction (the upward direction in the drawing). Such a gradual change in concentration can be examined by a SIMS analyzer.

As the chromium atoms of the nonmagnetic layer 32 diffuse into the second antiferromagnetic layer 31, the PtMn alloy, the X—Mn alloy, or the Pt—Mn—X' alloy constituting the second antiferromagnetic layer 31 rapidly transforms into an ordered structure.

Since the nonmagnetic layer 32 is deposited on the second antiferromagnetic layer 31 to protect the second antiferromagnetic layer 31, the thickness h1 of the second antiferromagnetic layer 31 can be decreased to a thickness in the range of 5 to 50 Å, for example, approximately 10 Å. As Cr atoms diffuse into the second antiferromagnetic layer 31 having such a small thickness, the region around the interface between the second antiferromagnetic layer 31 and the free magnetic layer 28 rapidly transforms into an ordered structure, and the magnitude of the exchange coupling magnetic field at the interface can be increased.

Accordingly, in the resulting magnetic sensing element, the magnetization directions of the free magnetic layer 28 at the two side portions C can be firmly pinned by the two side portions C of the second antiferromagnetic layer 31. Side reading can be reduced.

The crystal structure of the second antiferromagnetic layer 31 is, for example, of a CuAuI type. Chromium atoms diffusing from the nonmagnetic layer 32 partly replace the lattice points of the crystal lattice constituted from atoms of Pt and Mn, the crystal lattice constituted from atoms of X and Mn, or the crystal lattice constituted from atoms of Pt, Mn, and X'.

The second field annealing may be performed after the step shown in FIG. 26, i.e., the step of forming the third antiferromagnetic layer 33 and the interlayer 35 on the nonmagnetic layer 32. Since the second antiferromagnetic layer 31 exhibits antiferromagnetic properties because of the third antiferromagnetic layers 33 thereon, the second antiferromagnetic layer 31 transforms to an ordered structure by the second field annealing. As a result, a large exchange coupling magnetic field is generated between the second antiferromagnetic layer 31 and the free magnetic layer 28 and pins the magnetization direction of the free magnetic layer 28 in the track width direction. However, since the center portion D of the third antiferromagnetic layer 33 and the second antiferromagnetic layer 31 are milled in the step shown in FIG. 27, the exchange coupling magnetic field between the free magnetic layer 28 and the center portion D of the second antiferromagnetic layer 31 weakens. Accordingly, the magnetization direction of the center portion D of the free magnetic layer 28 is moderately oriented so as to be responsive to external magnetic fields.

Figure 28:
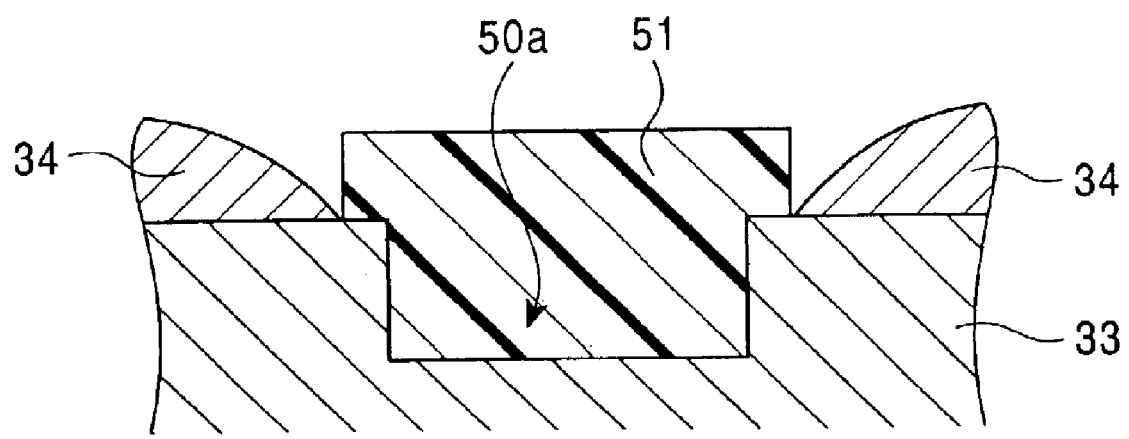
FIG. 28 is a cross-sectional view showing a step of fabricating electrode layers.

FIG. 28 is an enlarged partial cross-sectional view from the opposing face. FIG. 28 shows a step of fabricating the electrode layer 34.

When the mask layer 50 shown in FIG. 27 is composed of a resist material and thus cannot be used as an electrode, the electrode layer 34 must be formed on each third antiferromagnetic layer 33 after the removal of the mask layer 50.

As shown in FIG. 28, a resist layer 51 is formed in the void 50a in the third antiferromagnetic layer 33 over part of the upper faces of the third antiferromagnetic layers 33. Alternatively, the resist layer 51 may be formed only inside the void 50a. The electrode layers 34 are deposited on part of the third antiferromagnetic layers 33 not covered by the resist layer 51. Subsequently, the resist layer 51 is removed.

The above description regards the method for fabricating the CIP magnetic sensing elements shown in FIGS. 4 to 6. Methods for fabricating the CPP magnetic sensing elements shown in FIGS. 11 and 12 will now be described. Only the steps different from those for fabricating the magnetic sensing elements shown in FIGS. 4 to 6 are described below.

After the step shown in FIG. 25, the first insulating layer 70 is sequentially sputter-deposited on the third antiferromagnetic layer 33 in the step shown in FIG. 26.

Figure 29:
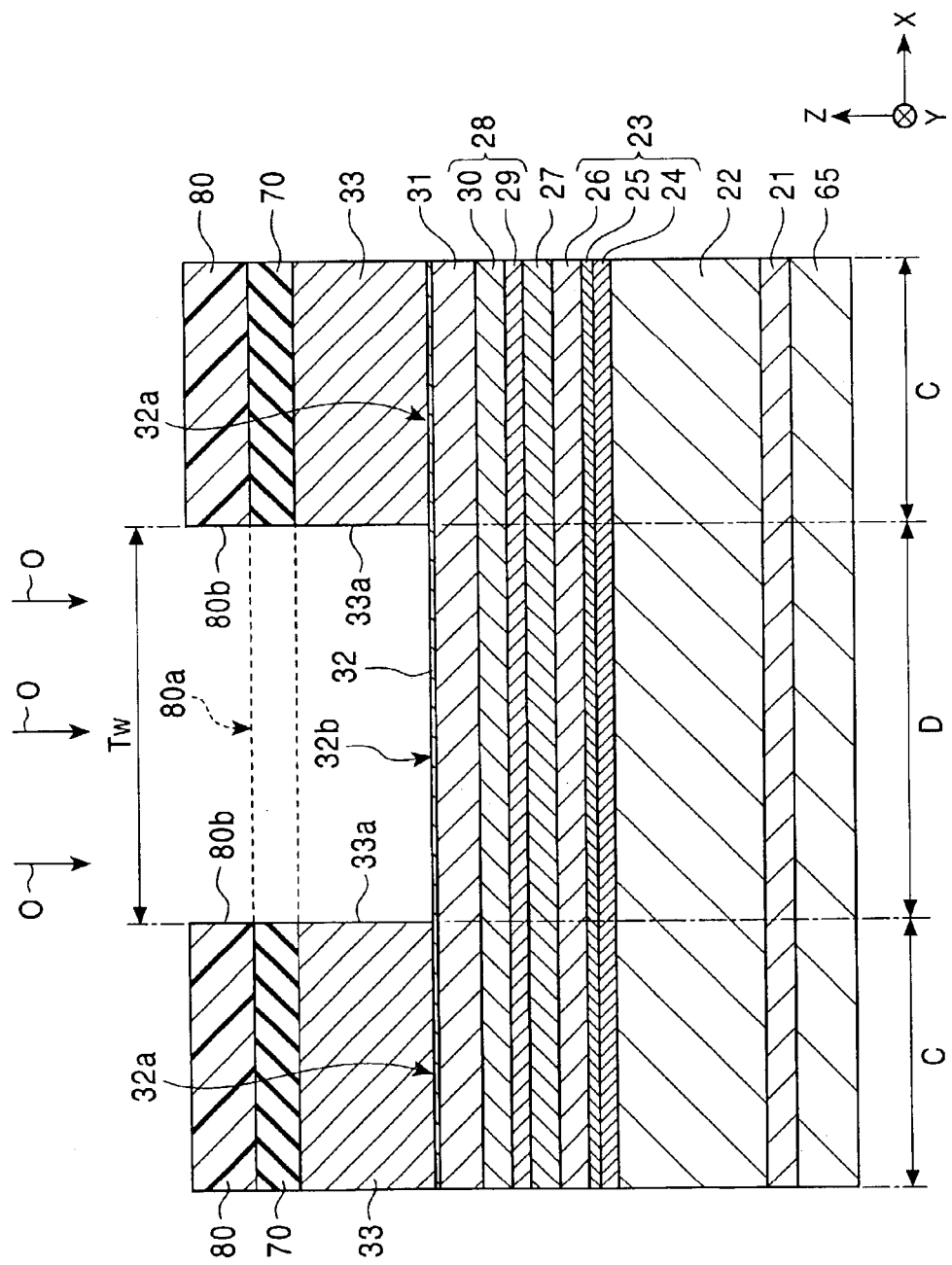
FIG. 29 is a cross-sectional view showing a step of fabricating the magnetic sensing element shown in FIG. 10.

As shown in FIG. 29, a resist layer 80 having a void 80a at the center in the track width direction (the X direction) is formed on the first insulating layer 70 by exposure and development.

Part of the first insulating layer 70 and the third antiferromagnetic layer 33 not covered with the base layer 80 is milled in the direction indicated by arrows O by ion milling or reactive ion etching (RIE) so as to remove the layers indicated by broken lines in FIG. 29. How far the milling is performed determines which of the embodiments shown in FIGS. 10 to 12 is made.

Alternatively, the first insulating layer 70 may be formed on each of the two side portions C of the third antiferromagnetic layer 33, and the exposed center portion D of the third antiferromagnetic layer 33 may be milled using the first insulating layers 70 as a mask.

Although the ends 80b of the resist layer 80 shown in FIG. 29 are perpendicular to the surface of the substrate 20, the ends 80B may be flat or curved slopes. The beam incident angle of the ion milling may be shifted from the axis normal to the substrate surface. In these cases, the ends 33a of the third antiferromagnetic layers 33 are formed as flat or curved slopes. Subsequently, the resist layer 80 is removed.

Figure 30:
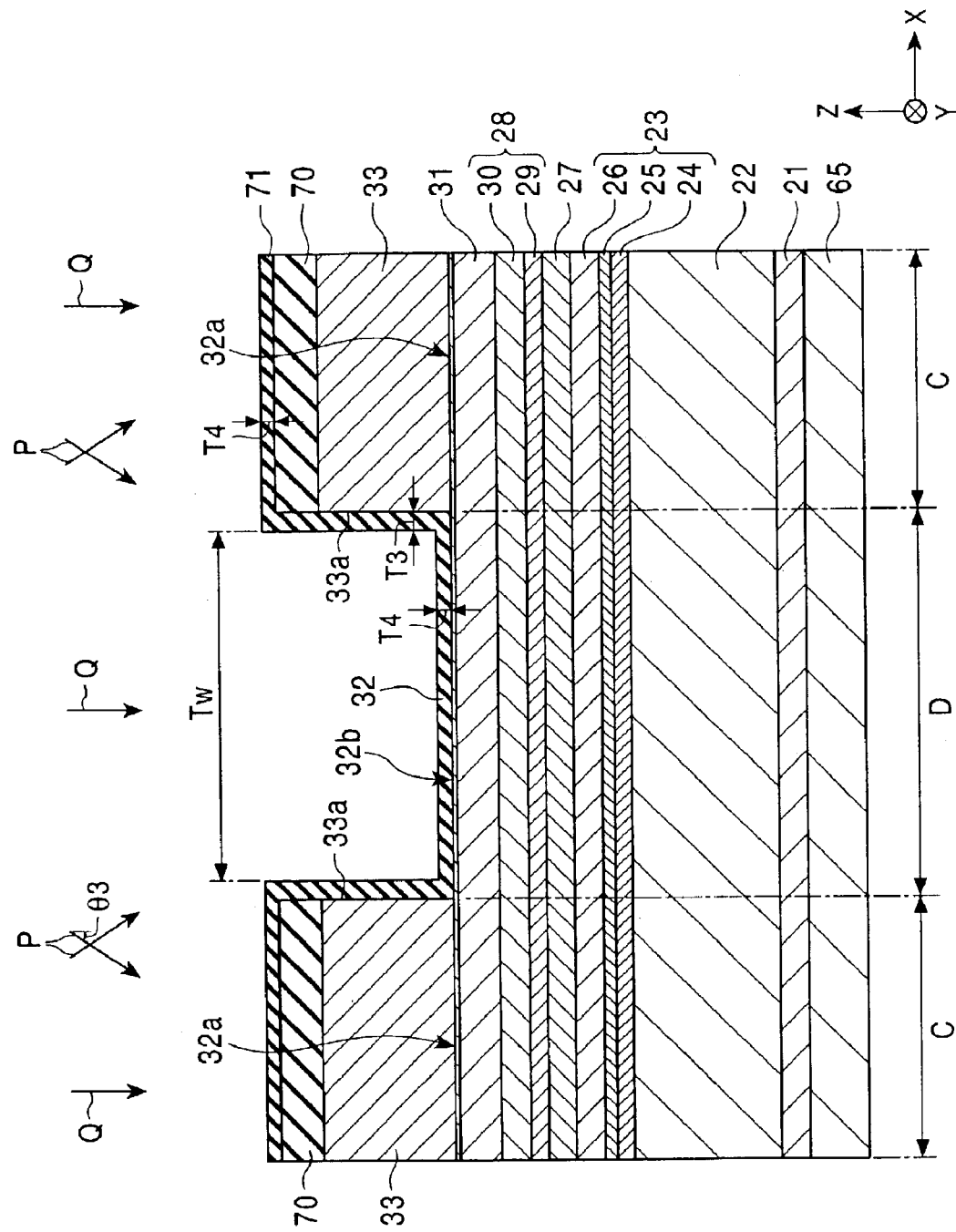
FIG. 30 is a cross-sectional view showing a step subsequent to the step shown in FIG. 29.

In the step shown in FIG. 30, the second insulating layer 71 is formed over the first insulating layers 70, the ends of the third antiferromagnetic layers 33, and the center portion D of the magnetic sensing element. The second insulating layer 71 is formed by sputter-depositing an insulating material such as $Al_2O_3$, $SiO_2$, AlN, Al—Si—O—N, Al—Si—O, $Ti_2O_3$, $Ti_3O_5$, or $Ta_2O_5$. Ion beam sputtering, long through sputtering, collimation sputtering, or the like may be employed.

The sputtering angle θ3 (an angle with respect to the axis in the Z direction) for forming the second insulating layer 71 is important. As shown in FIG. 30, the sputtering direction P has the sputtering angle of θ3 with respect to the direction perpendicular to the surface of each layer constituting the composite film. In the present invention, the sputtering angle θ3 is preferably as large as possible so that the second insulating layer 71 can be formed on the ends 33a of the third antiferromagnetic layer 33. For example, the sputtering angle θ3 is 50 to 70 degrees.

At a large sputtering angle θ3, the thickness T3 of the second insulating layer 71 on the ends 33a of the third antiferromagnetic layer 33 in the track width direction (the X direction) can become larger than the thickness T4 of the second insulating layer 71 on the upper face of the magnetic sensing-element and the first insulating layers 70. If the thickness of the second insulating layer 71 is not adjusted as above, the second insulating layer 71 on the ends 33a of the third antiferromagnetic layers 33 will be completely removed in the subsequent ion milling step. Even when the second insulating layer 71 remains on the ends 33a of the third antiferromagnetic layers 33, the thickness thereof is so small that the second insulating layer 71 no longer functions as an insulating layer for decreasing the shunt loss.

Next, as shown in FIG. 30, ion milling is performed in direction Q perpendicular or substantially perpendicular to the surface of each layer of the composite film (in the Z direction). The milling angle is approximately 0 to 20 degrees with respect to the surface of each layer of the composite film. The ion milling is performed until the second insulating layer 71 formed on the center portion D is properly removed. As a result, the second insulating layer 71 formed on the upper faces 33b of the third antiferromagnetic layers 33 are also removed. On the other hand, the second insulating layer 71 on the ends 33a of the third antiferromagnetic layers 33 remains even after the ion milling. This is because the thickness T3 of the second insulating layer 71 on the ends 33a is larger than that on the center portion D of the magnetic sensing element, and ion milling in the milling direction Q does not mill the second insulating layer 71 on the ends 33a as much as the second insulating layer 71 at the center portion D of the magnetic sensing element. Thus, the second insulating layers 71 having a proper thickness can be formed on the ends 33a of the third antiferromagnetic layer 33.

Figure 31:
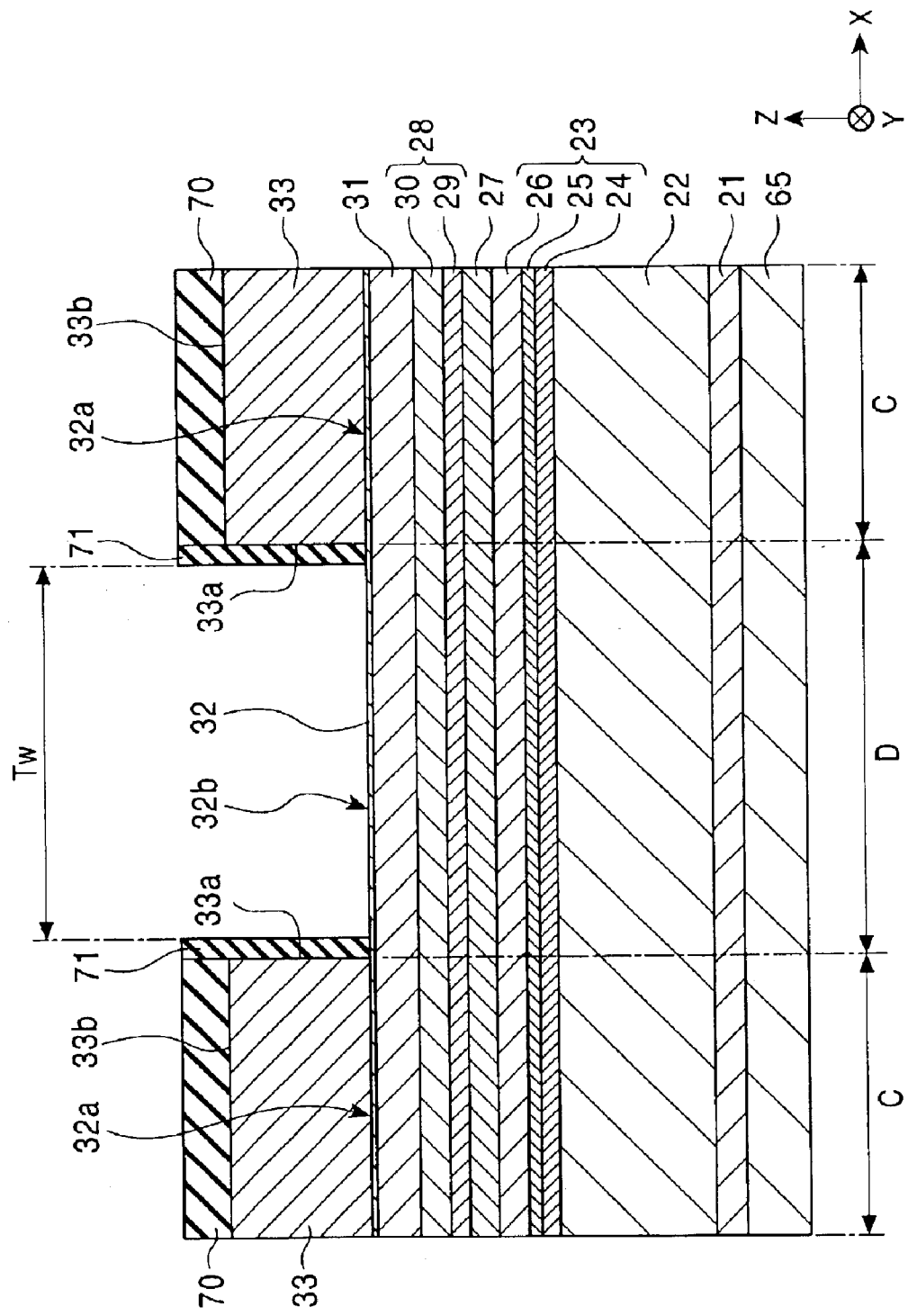
FIG. 31 is a cross-sectional view showing a step subsequent to the step shown in FIG. 30.

Such a state is shown in FIG. 31. The thickness T3 of the second insulating layer 71 on the end 33a of the third antiferromagnetic layer 33 in the track width direction is approximately 5 to 10 nm.

As shown in FIG. 31, the upper face 33b of each third antiferromagnetic layer 33 is covered by the first insulating layer 70, and each end 33a of the third antiferromagnetic layer 33 is covered by the second insulating layer 71. If necessary, the nonmagnetic layer 69 shown in FIG. 10 may be provided over the first insulating layers 70, the second insulating layers 71, and the center portion D of the magnetic sensing element, and the upper shield layer 68, which functions as an upper electrode, may then be formed by plating.

According to this method, a CPP magnetic sensing element that can properly decrease the shunt loss from the current supplied from the shield layers can be obtained.

In the magnetic sensing elements shown in FIGS. 13 and 14, the protrusion 65a is formed in the lower shield layer 65, and the insulating layers 78 are formed between the seed layer 21 and the two side portions 65b of the lower shield layer 65. First, the lower shield layer 65 is formed by plating, sputtering, or the like, and is planarized by polishing. A resist layer is then formed on the center portion of the lower shield layer 65 in the track width direction, and the two side portions 65b of the lower shield layer 65 is milled partway by ion milling. Thus, the protrusion 65a is formed at the center of the lower shield layer 65 in the track width direction.

Next, the insulating layers 78 are formed by sputtering on the two side portions 65b of the lower shield layer 65 not covered by the resist layer. This sputter deposition is stopped when the upper faces of the insulating layers 78 become flush with the upper face 65a1 of the protrusion 65a. After the resist layer is removed, the upper face 65a1 of the protrusion 65a and the upper faces of the insulating layers 78 may be polished by chemical mechanical polishing so as to provide highly planarized surface. In such a case, the first polishing process is not necessary.

The second antiferromagnetic layer 31 above may be composed of a Cr-containing PtMn alloy, a Cr-containing X—Mn alloy, wherein X is at least one element selected from the group consisting of Pd, Ir, Rh, Ru, Os, Ni, and Fe, or a Cr-containing Pt—Mn—X' alloy, wherein X' is at least one element selected from the group consisting of Pd, Ir, Rh, Ru, Au, Ag, Os, Ni, Ar, Ne, Xe, and Kr.

When the second antiferromagnetic layer 31 is composed of a PtMnCr alloy, X—Mn—Cr alloy, or a Pt—Mn—X'—Cr alloy, the thickness of the second antiferromagnetic layer 31 is adjusted in the range of 5 to 30 Å so as to prevent the second antiferromagnetic layer 31 from transforming into an ordered structure prior to the formation of the third antiferromagnetic layer 33.

Although the nonmagnetic layer 32 above is made of Cr, the nonmagnetic layer 32 may be made of at least one of Ti, Zr, Hf, V, Nb, Al, Si, Mo, W, Y, and rare earth elements.

In fabricating a magnetic head using the CIP magnetic sensing element described above, an underlayer composed of an insulating material such as alumina is provided between the substrate 20 and the seed layer 21, a lower shield layer composed of a magnetic alloy is deposited on the underlayer, and a lower gap layer composed of an insulating material is deposited on the lower shield layer. The magnetic sensing element is then formed on the lower gap layer. An upper gap layer composed of an insulating material is then formed on the magnetic sensing element, and an upper shield layer composed of a magnetic alloy is formed on the upper gap layer. Optionally, an inductive write head may be formed on the upper shield layer.

The magnetic sensing element of the present invention can be incorporated into a magnetic sensor as well as a magnetic head installed in a hard disk device.

EXAMPLES

Experiments were conducted to demonstrate that the magnitude of the exchange coupling magnetic field between the second antiferromagnetic layer 31 and the free magnetic layer 28 increases by field-annealing the composite film having the chromium nonmagnetic layer 32 disposed between the second antiferromagnetic layer 31 and the third antiferromagnetic layer 33.

Figure 32:
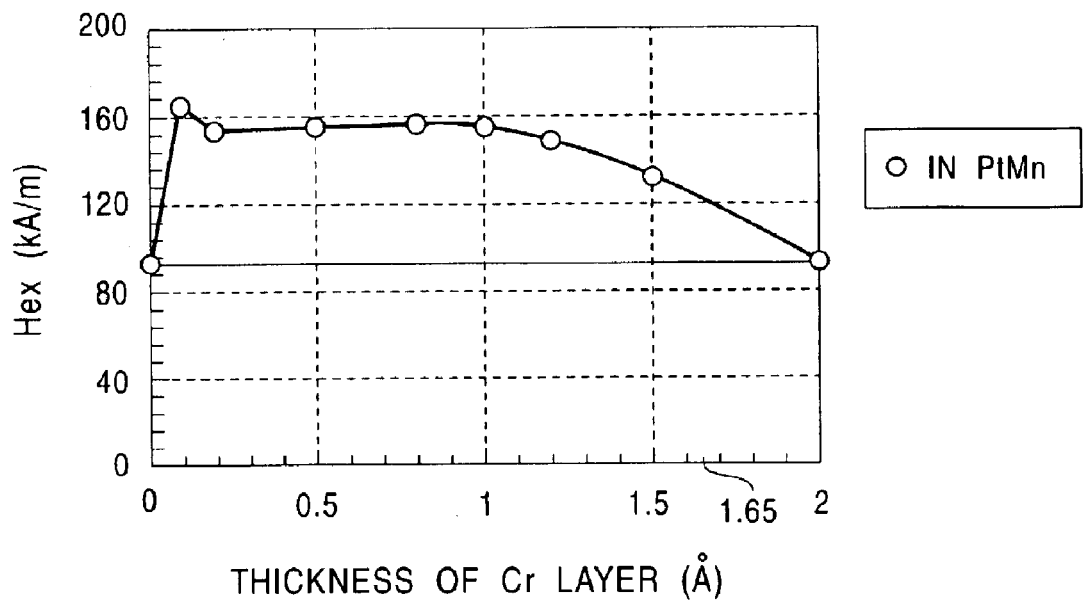
FIG. 32 is a graph showing the exchange coupling magnetic field of an annealed exchange-coupled film including a Cr layer of various thickness in an antiferromagnetic layer.

FIG. 32 is a graph showing the relationship between the exchange coupling magnetic field and the thickness of the chromium layer inserted at a position 5 Å away from the interface between the ferromagnetic layer and the antiferromagnetic layer.

This experiment was conducted to show the effect of changes in thickness of the nonmagnetic layer 32 between the second antiferromagnetic layer 31 having a thickness of 5 Å and the third antiferromagnetic layer 33 on the exchange coupling magnetic field (Hex) between the free magnetic layer 28 and the second antiferromagnetic layer 31.

The thickness of the Cr layer was in terms of the average thickness. The average thickness can be determined by, for example, X-ray fluorescence analysis.

The average thickness of the Cr layer is sometimes less than 1 Å. As is widely known, no uniform thin film has a thickness of less than 1 Å since 1 Å corresponds to the diameter of one atom or less. However, in a nonuniform thin film containing unevenly distributed Cr atoms, there exist regions with chromium atoms and regions without any chromium atoms. Accordingly, the average thickness of the chromium layer is sometimes less than 1 Å.

In the experiment, the layer structure of the composite film was as follows: silicon substrate/alumina (1,000 Å)/ $(Ni_{0.8}Fe_{0.2})_{60}Cr_{40}$ (55 Å)/$Pt_{50}Mn_{50}$ (150 Å)/$Pt_{50}Mn_{50}$ (5−X/2 Å)/Cr (x Å)/$Pt_{50}Mn_{50}$ (5−X/2 Å)/$Co_{90}Fe_{10}$ (16 Å)/Ta (30 Å).

The composite film was annealed at 290° C. for 4 hours while applying a magnetic field of 800 kA/m.

The exchange coupling magnetic field Hex without the Cr layer in the antiferromagnetic layer was 93 kA/m.

The Cr layer was positioned in the antiferromagnetic layer 5 Å away from the interface between the antiferromagnetic layer and the pinned magnetic layer. The exchange coupling magnetic field Hex between the antiferromagnetic layer ($Pt_{50}Mn_{50}$) and the ferromagnetic layer ($Co_{90}Fe_{10}$) was 152 to 160 kA/m when the thickness of the Cr layer was in the range of 0.2 to 1.0 Å.

Next, the Cr layer having a thickness of 0.2 Å was disposed at various positions in the antiferromagnetic layer. The resulting exchange coupled film was annealed, and the exchange coupling energy Jk after annealing was examined.

This experiment was conducted to examine the effect on the exchange coupling energy Jk between the free magnetic layer 28 and the second antiferromagnetic layer 31 when the nonmagnetic layer 32 having a thickness of 0.2 Å was disposed between the second antiferromagnetic layer 31 and the third antiferromagnetic layer 33 and when the thickness of the second antiferromagnetic layer 31 was varied.

The layer structure of the composite film used in the experiment is shown below. The Cr layer is omitted.

The composite film: silicon substrate/alumina (1,000 Å)/ $(Ni_{0.8}Fe_{0.2})_{60}Cr_{40}$ (55 Å)/$Pt_{50}Mn_{50}$ (160 Å)/$Co_{90}Fe_{10}$ (16 Å)/Ta (30 Å).

The composite film was annealed at 290° C. for 4 hours while applying a magnetic field of 800 kA/m.

Figure 33:
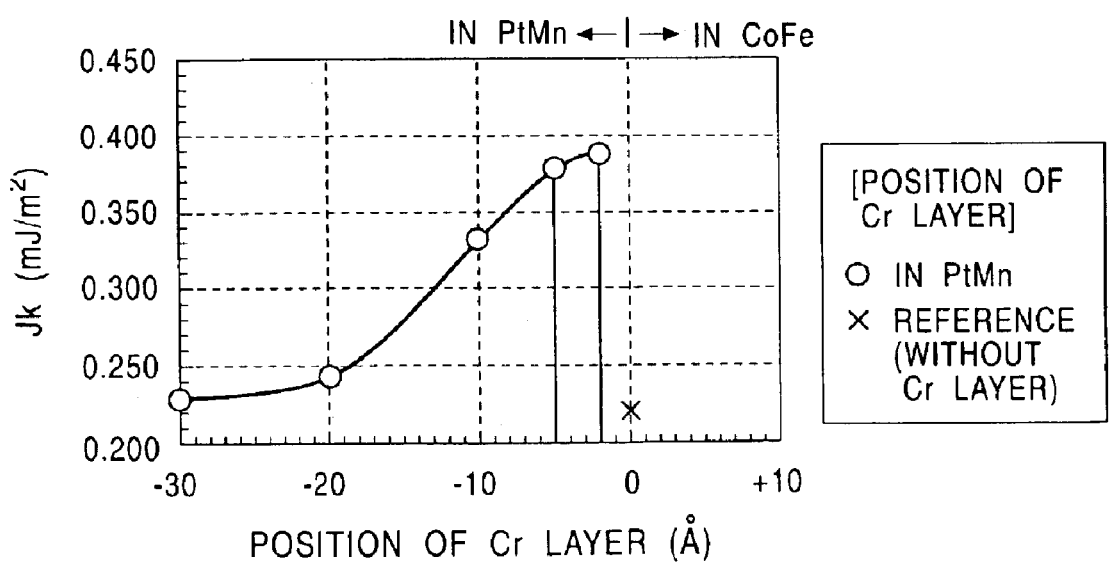
FIG. 33 is a graph showing the exchange coupling energy Jk of an annealed exchange-coupled film having a Cr layer 0.2 Å in thickness inserted at various positions in an antiferromagnetic layer.

The results are shown in FIG. 33. The abscissa axis indicates the position where the Cr layer is disposed. In the graph shown in FIG. 33, the position at the interface between the antiferromagnetic layer ($Pt_{50}Mn_{50}$) and the ferromagnetic layer ($Co_{90}Fe_{10}$) is assumed as a zero distance. The negative distance is indicated when the Cr layer is in the antiferromagnetic layer. For example, the position of the Cr layer is −5 Å when the Cr layer is provided in the antiferromagnetic layer at a position 5 Å away from the interface.

In this experiment, the distance from the interface to the Cr layer corresponded to the thickness of the second antiferromagnetic layer 31 in the magnetic sensing element of the present invention.

The exchange coupling energy Jk between the antiferromagnetic layer and the pinned magnetic layer without Cr layer in the antiferromagnetic layer was 0.222 mJ/m² after annealing.

When the Cr layer in the antiferromagnetic layer was 5 Å away from the interface, i.e., when the second antiferromagnetic layer 31 had a thickness of 5 Å, the exchange coupling energy Jk was 0.370 mJ/m². When the Cr layer in the antiferromagnetic layer was 10 Å away from the interface, the exchange coupling energy Jk was 0.330 mJ/m². When the Cr layer in the antiferromagnetic layer was 20 Å away from the interface, the exchange coupling energy Jk was 0.245 mJ/m². Even when the Cr layer in the antiferromagnetic layer was more than 20 Å away from the interface, the exchange coupling energy Jk did not decrease significantly.

Figure 34:
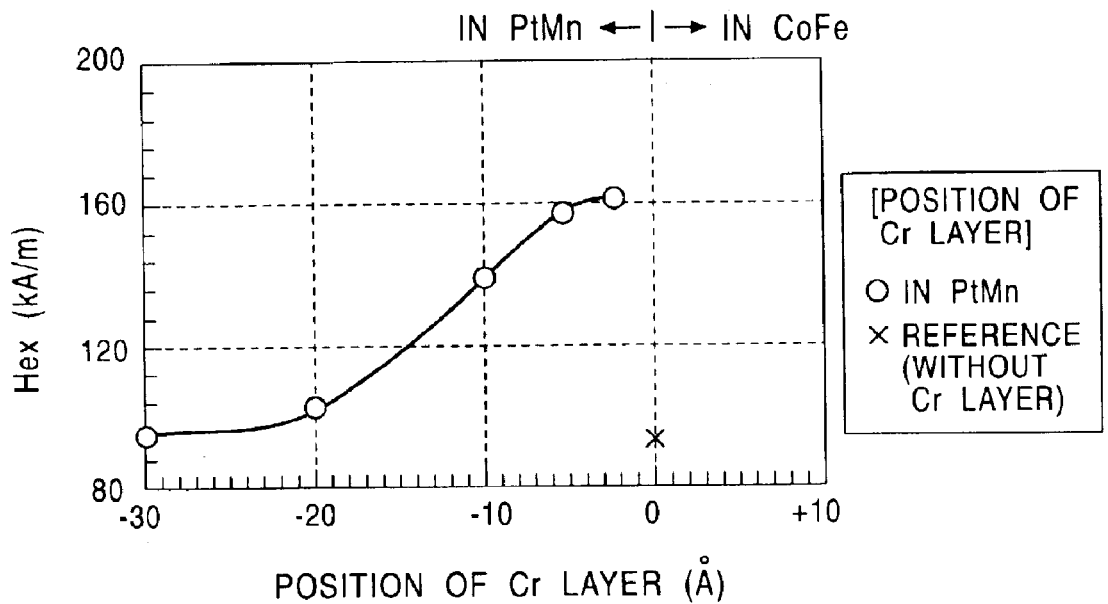
FIG. 34 is a graph plotted by converting the abscissa axis of the graph in FIG. 33 in terms of the exchange coupling magnetic field (Hex) between the ferromagnetic layer and the antiferromagnetic layer.

FIG. 34 is a graph plotted by converting the abscissa axis of the graph in FIG. 33 in terms of the exchange coupling magnetic field (Hex) between the ferromagnetic layer and the antiferromagnetic layer.

The curve in FIG. 34 indicating changes in exchange coupling magnetic field (Hex) versus the position of the Cr layer was substantially identical to the curve in FIG. 33 indicating the exchange coupling energy Jk.

The results described above fully demonstrate that an exchange coupled film including a Cr layer in an antiferromagnetic layer generates a larger exchange coupling energy Jk than an exchange coupled film without any Cr layer.

In other words, when the Cr nonmagnetic layer 32 is provided between the second antiferromagnetic layer 31 and the third antiferromagnetic layer 33, the exchange coupling magnetic field and the exchange coupling energy Jk with the free magnetic layer 28 increase.

Figure 35:
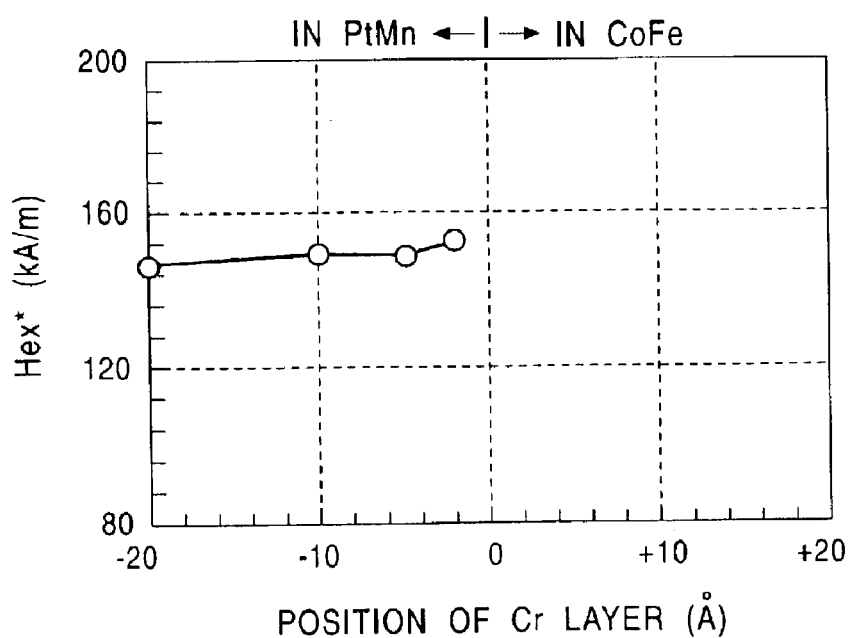
FIG. 35 is a graph showing the unidirectional exchange magnetic field (Hex*) of an annealed exchange-coupled film having a Cr layer 0.2 Å in thickness inserted at various positions in an antiferromagnetic layer.
Figure 36:
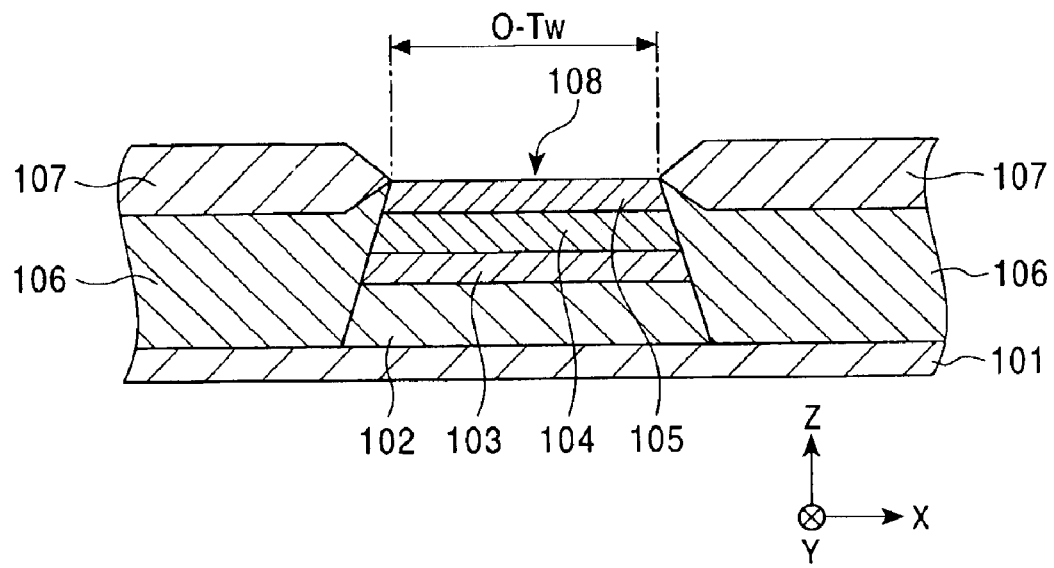
FIG. 36 is a partial cross-sectional view of a conventional magnetic sensing element viewed from the face of the magnetic sensing element that opposes a recording medium.

FIG. 35 is a graph indicating the unidirectional exchange bias magnetic field (Hex*) of an exchange coupled film after annealing when a Cr layer 0.2 Å in thickness was disposed at various positions in an antiferromagnetic layer. The exchange coupled film used in the experiment was prepared by laminating the antiferromagnetic layer with a ferromagnetic layer constituted from first and second magnetic sublayers and a nonmagnetic interlayer disposed between the first and second magnetic sublayers.

This experiment was conducted to examine the effect of the thickness of the second antiferromagnetic layer 31 on the unidirectional exchange bias magnetic field (Hex*) between the synthetic ferrimagnetic free magnetic layer 28 and the second antiferromagnetic layer 31 when the nonmagnetic layer 32 0.2 Å in thickness was provided between the second antiferromagnetic layer 31 and the third antiferromagnetic layer 33.

The layer structure of the composite film used in the experiment is shown below. The Cr layer is omitted.

The composite film: silicon substrate/alumina (1,000 Å)/ $(Ni_{0.8}Fe_{0.2})_{60}Cr_{40}$ (52 Å)/$Pt_{50}Mn_{50}$ (120 Å)/$Co_{90}Fe_{10}$ (16 Å)/Ru/$Co_{90}Fe_{10}$ (22 Å)/Ta (30 Å).

The composite film was annealed at 290° C. for 4 hours while applying a magnetic field of 800 kA/m.

The abscissa axis in FIG. 35 indicates the position where the Cr layer is provided. In the graph shown in FIG. 35, the position at the interface between the antiferromagnetic layer and the ferromagnetic layer is assumed as a zero distance. The negative distance is indicated when the Cr layer is in the antiferromagnetic layer. For example, the position of the Cr layer is −5 Å when the Cr layer is provided in the antiferromagnetic layer at a position 5 Å away from the interface.

The experiment demonstrated that the exchange-coupled film including the Cr layer in the antiferromagnetic layer exhibited a unidirectional exchange bias magnetic field (Hex*) in the range of 148 to 152 kA/m regardless of the position of the Cr layer.

In view of the above, stable unidirectional exchange coupling magnetic fields (Hex*) can be generated using the synthetic ferrimagnetic free magnetic layer even when the thickness of the second antiferromagnetic layer 31 is changed.

What is claimed is:

1. A magnetic sensing element comprising:
    a composite film having a center portion and two side portions, the composite film comprising:
        a first antiferromagnetic layer;
        a pinned magnetic layer on the first antiferromagnetic layer;
        a nonmagnetic material layer on the pinned magnetic layer; and
        a free magnetic layer on the nonmagnetic material layer;
    a second antiferromagnetic layer on the free magnetic layer;
    a chromium nonmagnetic layer disposed on the second antiferromagnetic layer at the center portion; and
    third antiferromagnetic layers disposed on the second antiferromagnetic layer at the two side portions.

2. The magnetic sensing element according to claim 1, wherein the chromium nonmagnetic layer extends between the second antiferromagnetic layer and each of the third antiferromagnetic layers.

3. The magnetic sensing element according to claim 2, wherein the thickness of the chromium nonmagnetic layer is larger in the center portion than in the two side portions.

4. The magnetic sensing element according to claim 2, wherein the average thickness of the chromium nonmagnetic layer in the two side portions is 3 Å or less.

5. The magnetic sensing element according to claim 4, wherein the average thickness of the chromium nonmagnetic layer in the two side portions is in the range of 0.2 to 1.0 Å.

6. The magnetic sensing element according to claim 1, wherein the third antiferromagnetic layers are in contact with the second antiferromagnetic layer.

7. The magnetic sensing element according to claim 1, wherein the thickness of the chromium nonmagnetic layer is in the range of 2 to 10 Å.

8. The magnetic sensing element according to claim 1, wherein the second antiferromagnetic layer is nonantiferromagnetic in the center portion and antiferromagnetic in the two side portions.

9. The magnetic sensing element according to claim 1, wherein the thickness of the second antiferromagnetic layer is in the range of 5 to 50 Å.

10. The magnetic sensing element according to claim 1, wherein the free magnetic layer comprises three magnetic sublayers.

11. The magnetic sensing element according to claim 10, wherein the three magnetic sublayers comprise CoFe, NiFe, and CoFe, respectively.

12. The magnetic sensing element according to claim 1, further comprising electrode layers on the third antiferromagnetic layers so that an electric current flows in a direction parallel to the surface of each layer of the composite film.

13. The magnetic sensing element according to claim 1, further comprising:
    an upper electrode layer disposed over the center portion of the composite and the third antiferromagnetic layers; and
    a lower electrode layers disposed at the bottom of the composite film,
    wherein an electric current flows in a direction perpendicular to the surface of each layer of the composite film.

14. The magnetic sensing element according to claim 13, wherein the nonmagnetic material layer comprises an insulating material.

15. The magnetic sensing element according to claim 1, wherein the nonmagnetic material layer comprises a nonmagnetic conductive material.

16. A magnetic sensing element comprising:
    a composite film having a center portion and two side portions, the composite film comprising:
        a first antiferromagnetic layer;
        a pinned magnetic layer on the first antiferromagnetic layer;
        a nonmagnetic material layer on the pinned magnetic layer; and
        a free magnetic layer on the nonmagnetic material layer;
    second antiferromagnetic layers disposed on the free magnetic layer at the two side portions;
    chromium nonmagnetic layers disposed on the second antiferromagnetic layers; and
    third antiferromagnetic layers disposed on the chromium nonmagnetic layers.

17. The magnetic sensing element according to claim 16, wherein the second antiferromagnetic layers extend to the center portion so as to be connected to each other.

18. The magnetic sensing element according to claim 17, wherein the second antiferromagnetic layers are nonantiferromagnetic in the center portion and antiferromagnetic in the two side portions.

19. The magnetic sensing element according to claim 17, wherein the thickness of the second antiferromagnetic layers is 50 Å or less in the center portion or wherein no second antiferromagnetic layer is formed on the free magnetic layer in the center portion.

20. The magnetic sensing element according to claim 16, wherein the second antiferromagnetic layers extend to the center portion to be connected to each other, and the chromium nonmagnetic layers extend to the center portion to be connected to each other.

21. The magnetic sensing element according to claim 20, wherein
    the third antiferromagnetic layers extend to the center portion so as to be connected to each other;
    the thickness of the third antiferromagnetic layers is smaller in the center portion than in the side portions; and
    the third antiferromagnetic layers are nonantiferromagnetic in the center portion.

22. The magnetic sensing element according to claim 21, wherein the thickness of the antiferromagnetic layer is 50 Å or less in the center portion or wherein no antiferromagnetic layer is formed on the free magnetic layer in the center portion.

23. The magnetic sensing element according to claim 16, wherein the thickness of the chromium nonmagnetic layers is in the range of 0.2 to 3 Å in the two side portions.

24. The magnetic sensing element according to claim 23, wherein the thickness of the chromium nonmagnetic layers is in the range of 0.2 to 1.0 Å in the two side portions.

25. The magnetic sensing element according to claim 16, further comprising a noble metal layer disposed between each nonmagnetic layer and each second antiferromagnetic layer.

26. The magnetic sensing element according to claim 25, wherein the noble metal layer comprises at least one element selected from the group consisting of Ru, Re, Pd, Os, Ir, Pt, Au, and Rh.

27. The magnetic sensing element according to claim 16, wherein the free magnetic layer comprises three magnetic sublayers.

28. The magnetic sensing element according to claim 27, wherein the three magnetic sublayers comprise CoFe, NiFe, and CoFe, respectively.

29. The magnetic sensing element according to claim 16, further comprising electrode layers on the third antiferromagnetic layers so that an electric current flows in a direction parallel to the surface of each layer of the composite film.

30. The magnetic sensing element according to claim 16, further comprising:

an upper electrode layer disposed over the center portion of the composite and the third antiferromagnetic layers; and a lower electrode layers disposed at the bottom of the composite film, wherein an electric current flows in a direction perpendicular to the surface of each layer of the composite film.

31. The magnetic sensing element according to claim 30, wherein the nonmagnetic material layer comprises an insulating material.

32. The magnetic sensing element according to claim 16, wherein the nonmagnetic material layer comprises a nonmagnetic conductive material.

* * * * *

UNITED STATES PATENT AND TRADEMARK OFFICE
CERTIFICATE OF CORRECTION

PATENT NO.        : 6,885,528 B2
APPLICATION NO.   : 10/422585
DATED             : April 26, 2005
INVENTOR(S)       : Naoya Hasegawa et al.

It is certified that error appears in the above-identified patent and that said Letters Patent is hereby corrected as shown below:

In the Claims

Column 51, in claim 3, line 2, after "wherein" delete "the" and substitute --a-- in its place.

Column 51, in claim 4, line 2, after "wherein" delete "the" and substitute --a-- in its place.

Column 51, in claim 7, line 2, after "wherein" delete "the" and substitute --a-- in its place.

Column 51, in claim 9, line 2, after "wherein" delete "the" and substitute --a-- in its place.

Column 51, in claim 12, line 4, after "parallel to" delete "the" and substitute --a-- in its place.

Column 52, in claim 13, line 4, after "of the composite" insert --film--.

Column 52, in claim 13, line 6, after "disposed at" delete "the" and substitute --a-- in its place.

Column 52, in claim 13, line 9, before "surface of each layer" delete "the" and substitute --a-- in its place.

Column 52, in claim 19, line 2, after "wherein" delete "the" and substitute --one of a-- in its place.

Column 52, in claim 19, line 3, after "center portion" delete "or wherein" and substitute --and-- in its place.

Column 52, in claim 21, line 5, before "thickness of the third" delete "the" and substitute --a-- in its place.

Column 52, in claim 22, line 2, after "wherein" delete "the thickness of the antiferromagnetic layer" and substitute --one of a total thickness of the second and third antiferromagnetic layers-- in its place.

UNITED STATES PATENT AND TRADEMARK OFFICE
CERTIFICATE OF CORRECTION

PATENT NO. : 6,885,528 B2
APPLICATION NO. : 10/422585
DATED : April 26, 2005
INVENTOR(S) : Naoya Hasegawa et al.

It is certified that error appears in the above-identified patent and that said Letters Patent is hereby corrected as shown below:

In the Claims (cont'd)

Column 52, in claim 22, line 3, after "the center portion" delete "or wherein no antiferromagnetic" and substitute --and wherein no second or third antiferromagnetic-- in its place.

Column 52, in claim 23, line 2, after "wherein" delete "the" and substitute --a-- in its place.

Column 53, in claim 29, line 4, after "parallel to" delete "the" and substitute --a-- in its place.

Column 54, in claim 30, line 4, after "of the composite" insert --film--.

Column 54, in claim 30, line 6, after "disposed at" delete "the" and substitute --a-- in its place.

Column 54, in claim 30, line 9, before "surface of each layer" delete "the" and substitute --a-- in its place.

Signed and Sealed this

Second Day of October, 2007

JON W. DUDAS
*Director of the United States Patent and Trademark Office*